(12) United States Patent
Kato et al.

(10) Patent No.: US 11,409,199 B2
(45) Date of Patent: Aug. 9, 2022

(54) PATTERN DRAWING DEVICE

(71) Applicant: NIKON CORPORATION, Tokyo (JP)

(72) Inventors: Masaki Kato, Yokohama (JP); Shuichi Nakayama, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 237 days.

(21) Appl. No.: 16/856,474

(22) Filed: Apr. 23, 2020

(65) Prior Publication Data

US 2020/0341379 A1 Oct. 29, 2020

Related U.S. Application Data

(63) Continuation of application No. PCT/JP2018/039214, filed on Oct. 22, 2018.

(30) Foreign Application Priority Data

Oct. 25, 2017 (JP) .............................. JP2017-205844
Nov. 28, 2017 (JP) .............................. JP2017-227352

(51) Int. Cl.
*G03F 7/20* (2006.01)
*G02B 26/12* (2006.01)

(52) U.S. Cl.
CPC ......... *G03F 7/2008* (2013.01); *G02B 26/125* (2013.01); *G03F 7/2006* (2013.01)

(58) Field of Classification Search
CPC .. G03F 7/2008; G03F 7/2006; G03F 7/70383; G03F 7/704; G02B 26/125; G02B 13/0005; G02B 26/12; G02B 26/124; G02B 13/18
See application file for complete search history.

(56) References Cited

U.S. PATENT DOCUMENTS 5,859,721 A 1/1999 Oka
2007/0046918 A1* 3/2007 Takahashi ........... G03F 7/70275
359/850

FOREIGN PATENT DOCUMENTS

| JP | H05196872 A | * | 8/1993 |
| JP | H08-297255 A | | 11/1996 |
| JP | 2010152178 A | * | 7/2010 |
| WO | 2015/166910 A1 | | 11/2015 |
| WO | 2016/152758 A1 | | 9/2016 |
| WO | 2017/057415 A1 | | 4/2017 |
| WO | 2017/191777 A1 | | 11/2017 |

OTHER PUBLICATIONS

Jan. 8, 2019 International Search Report issued in International Patent Application No. PCT/JP2018/039214.

* cited by examiner

*Primary Examiner* — Nghia M Doan
(74) *Attorney, Agent, or Firm* — Oliff PLC

(57) ABSTRACT

A pattern drawing device is provided with: a first cylindrical lens on which a beam from a light source device is incident and which has an anisotropic refractive power for converging, in a sub-scanning direction orthogonal to a main scanning direction, the beam traveling toward a reflection surface of a polygon mirror; an fθ lens system for causing the beam having been deflected by the reflection surface of the polygon mirror to be incident thereon, and for condensing the beam as a spot light on a surface of an object to be irradiated; and a second cylindrical lens having an anisotropic refractive power for converging, in the sub-scanning direction, the beam traveling toward the surface after being emitted from the fθ lens system.

12 Claims, 28 Drawing Sheets

SPOT DIAGRAM

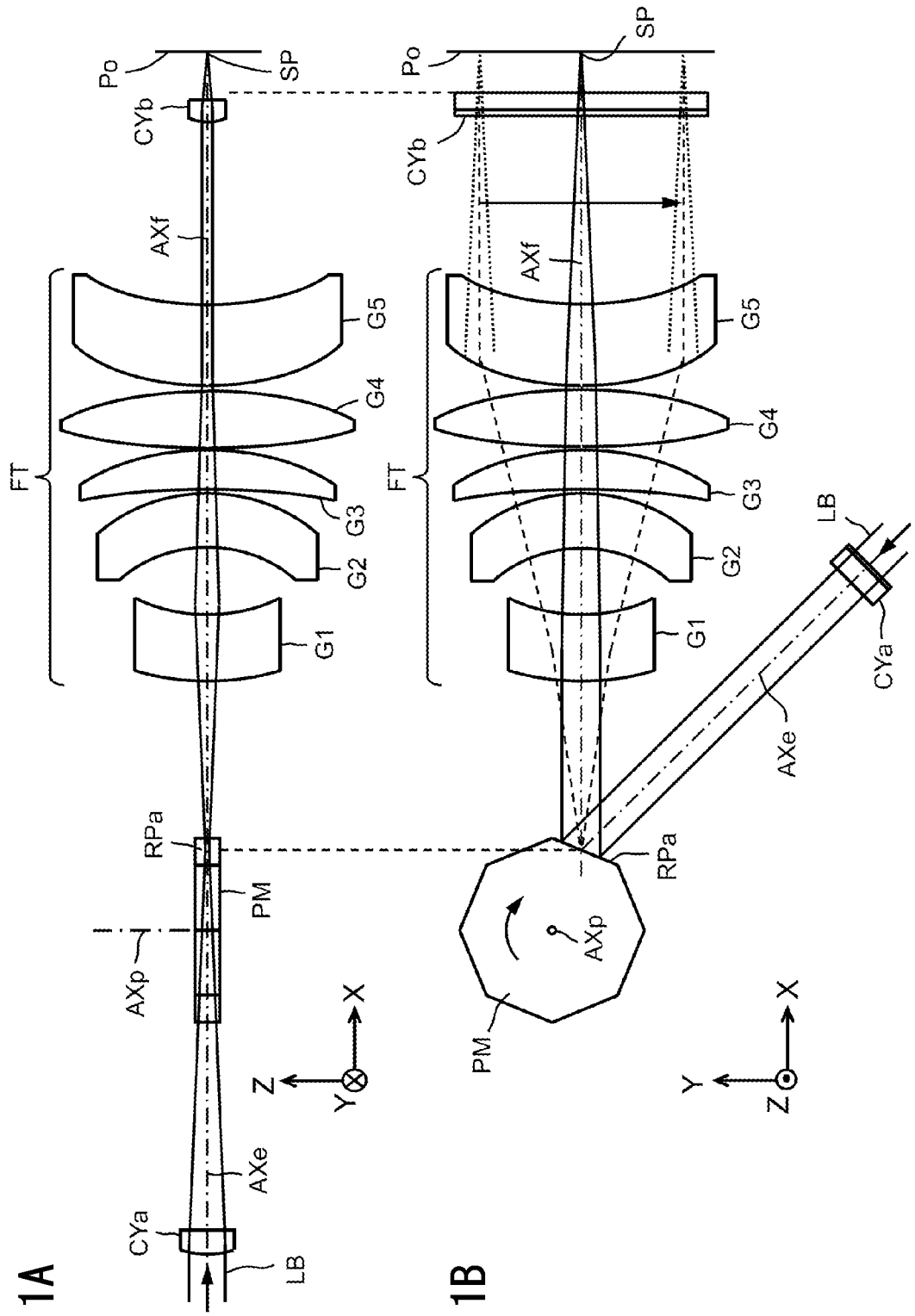

FIG. 13

| MEMBER | | SURFACE NUMBER | MAIN SCANNING DIRECTION CURVATURE RADIUS (mm) | SUB SCANNING DIRECTION CURVATURE RADIUS (mm) | INTER-LAYER INTERVAL (mm) | REFRACTIVE INDEX | ECCENTRICITY |
|---|---|---|---|---|---|---|---|
| BEAM EXPANDER BEO (×24) | L1 | 1 | -51.8286 | -51.8286 | -3.7369 | 1.476124 | |
| | | 2 | 8.4982 | 8.4982 | -5.627 | | |
| | L2 | 3 | -5.1189 | -5.1189 | -5.9948 | 1.476124 | |
| | | 4 | 33.0393 | 33.0393 | -3.2 | | |
| | Po | 5 | ∞ | ∞ | -74.1911 | | |
| | L3 | 6 | 48.2608 | 48.2608 | -5.9995 | 1.476124 | |
| | | 7 | -42.8927 | -42.8927 | -34.8814 | | |
| | L4 | 8 | 80.0301 | 80.0301 | -2.2694 | 1.476124 | |
| | | 9 | 33.055 | 33.055 | -9.6572 | | |
| | L5 | 10 | 529.3991 | 529.3991 | -2.1695 | 1.476124 | |
| | | 11 | 72.8636 | 72.8636 | -32.5 | | |
| APERTURE STOP (φ12mm) | AP | 12 | ∞ | ∞ | -10 | | |
| FIRST CYLINDRICAL LENS (fca=666.7mm) | CYa | 13 | ∞ | -394.1952 | -10 | 1.476124 | |
| | | 14 | ∞ | 1616.3298 | -661.15 | | |
| POLYGON MIRROR PM | RPa | 15 | ∞ | ∞ | 0 | | ROTATION OF 0.13 rad TO 0 rad *NOTE) |
| | | 16 | ∞ | ∞ | 0 | | ROTATION OF π/8 rad |
| fθ LENS SYSTEM FT (ft=100mm) | G1 | 17 | ∞ | ∞ | 35 | | |
| | | 18 | 83.6599 | 83.6599 | 19.3943 | 1.476121 | |
| | | 19 | 47.3579 | 47.3579 | 18.4932 | | |
| | G2 | 20 | -26.2679 | -26.2679 | 16.5949 | 1.476121 | |
| | | 21 | -39.7237 | -39.7237 | 0.25 | | |
| | G3 | 22 | -247.4559 | -247.4559 | 11.6591 | 1.476121 | |
| | | 23 | -67.3942 | -67.3942 | 0.25 | | |
| | G4 | 24 | 147.4104 | 147.4104 | 17.4104 | 1.476121 | |
| | | 25 | -99.4456 | -99.4456 | 0.25 | | |
| | G5 | 26 | 65.3068 | 65.3068 | 21.0873 | 1.476121 | |
| | | 27 | 49.0797 | 49.0797 | 82.254 | | |
| SECOND CYLINDRICAL LENS (fcb=15mm) | CYb | 28 | ∞ | 8.1261 | 6 | 1.476124 | |
| | | 29 | ∞ | -44.9229 | 11.3751 | | |

*NOTE) ROTATION OF 0.13 rad TO 0 rad AROUND A CENTER POSITION OFFSET BY -25.4065 mm IN THE OPTICAL AXIS DIRECTION AND -0.45 mm IN A DIRECTION PERPENDICULAR TO THE OPTICAL AXIS

SPOT DIAGRAM

|← 0.025 (mm) →|

COMPARATIVE EXAMPLE (CYb:fcb=75mm, CYa:fca=133.3mm)

FIG. 18   COMPARATIVE EXAMPLE (fcb = 75 mm) LENS DATA

| MEMBER | | SURFACE NUMBER | MAIN SCANNING DIRECTION CURVATURE RADIUS (mm) | SUB SCANNING DIRECTION CURVATURE RADIUS (mm) | INTER-LAYER INTERVAL (mm) | REFRACTIVE INDEX | ECCENTRICITY |
|---|---|---|---|---|---|---|---|
| BEAM EXPANDER BE0 (×24) | L1 | 1 | -51.8286 | -51.8286 | -3.7369 | 1.476124 | |
| | | 2 | 8.4982 | 8.4982 | -5.627 | | |
| | L2 | 3 | -5.1189 | -5.1189 | -5.9948 | 1.476124 | |
| | | 4 | 33.0393 | 33.0393 | -3.2 | | |
| | Po' | 5 | ∞ | ∞ | -74.1911 | | |
| | L3 | 6 | 48.2608 | 48.2608 | -5.9995 | 1.476124 | |
| | | 7 | -42.8927 | -42.8927 | -34.8814 | | |
| | L4 | 8 | 80.0301 | 80.0301 | -2.2694 | 1.476124 | |
| | | 9 | 33.055 | 33.055 | -9.6572 | | |
| | L5 | 10 | 529.3991 | 529.3991 | -2.1695 | 1.476124 | |
| | | 11 | 72.8636 | 72.8636 | -32.5 | | |
| APERTURE STOP (φ12mm) | AP | 12 | ∞ | ∞ | -10 | | |
| FIRST CYLINDRICAL LENS CYa (fca=133.3mm) | GA1 | 13 | ∞ | -151.7119 | -5 | 1.476124 | |
| | | 14 | ∞ | 946.9834 | -2 | | |
| | GA2 | 15 | ∞ | -81.929 | -5 | 1.476124 | |
| | | 16 | ∞ | -237.9434 | -126.623 | | |
| POLYGON MIRROR PM | RPa | 17 | ∞ | ∞ | 0 | | ROTATION OF π/8 rad *NOTE) |
| | | 18 | ∞ | ∞ | 0 | | |
| | | 19 | ∞ | ∞ | 35 | | ROTATION OF π/8 rad |
| fθ LENS SYSTEM FT (ft=100mm) | G1 | 20 | 83.6599 | 83.6599 | 19.3943 | 1.476121 | |
| | | 21 | 47.3579 | 47.3579 | 18.4932 | | |
| | G2 | 22 | -26.2679 | -26.2679 | 16.5949 | 1.476121 | |
| | | 23 | -39.7237 | -39.7237 | 0.25 | | |
| | G3 | 24 | -247.4559 | -247.4559 | 11.6591 | 1.476121 | |
| | | 25 | -67.3942 | -67.3942 | 0.25 | | |
| | G4 | 26 | 147.4104 | 147.4104 | 17.4104 | 1.476121 | |
| | | 27 | -99.4456 | -99.4456 | 0.25 | | |
| | G5 | 28 | 65.3068 | 65.3068 | 21.0873 | 1.476121 | |
| | | 29 | 49.0797 | 49.0797 | 21.066 | | |
| SECOND CYLINDRICAL LENS CYb (fcb=75mm) | GB1 | 30 | ∞ | 77.4399 | 5 | 1.476124 | |
| | | 31 | ∞ | -565.5057 | 2 | | |
| | GB2 | 32 | ∞ | 45.8622 | 5 | 1.476124 | |
| | | 33 | ∞ | 118.0769 | 67.8326 | | |

ROTATION OF 0.13 rad TO 0 rad AROUND A CENTER POSITION OFFSET BY -25.4065 mm IN THE OPTICAL AXIS DIRECTION AND -0.45 mm IN A DIRECTION PERPENDICULAR TO THE OPTICAL AXIS

SPOT DIAGRAM OF COMPARATIVE EXAMPLE

IMAGE HEIGHT
Hy=0mm

IMAGE HEIGHT
Hy=26mm

FIG. 23

| MEMBER | | SURFACE NUMBER | MAIN SCANNING DIRECTION CURVATURE RADIUS (mm) | SUB SCANNING DIRECTION CURVATURE RADIUS (mm) | INTER-LAYER INTERVAL (mm) | REFRACTIVE INDEX |
|---|---|---|---|---|---|---|
| BEAM EXPANDER BEO (×7) | L6 | 1 | 27.8262 | 27.8262 | 1.954 | 1.476124 |
| | | 2 | -27.2083 | -27.2083 | 1 | |
| | L7 | 3 | 20.1058 | 20.1058 | 4 | 1.476124 |
| | | 4 | -16.1763 | -16.1763 | 84.2637 | |
| | L8 | 5 | -25.5201 | -25.5201 | 4 | 1.476124 |
| | | 6 | -12.6176 | -12.6176 | 10 | |
| | L9 | 7 | -6.5929 | -6.5929 | 4 | 1.476124 |
| | | 8 | -3.7946 | -3.7946 | 25 | |
| APERTURE STOP (φ3.5mm) | AP | 9 | ∞ | ∞ | 114.3287 | |
| FIRST CYLINDRICAL LENS (fca=58mm) | CYa | 10 | 27.6 | -23.2736 | 4 | 1.476124 |
| | | 11 | ∞ | ∞ | 133.1161 | |
| SPHERICAL LENS SYSTEM FLG (fcg=201.2mm) | L10 | 12 | -23.2736 | -23.2736 | 6 | 1.476124 |
| | | 13 | -20.8196 | -20.8196 | 193.2397 | |
| | L11 | 14 | ∞ | ∞ | 6 | 1.476124 |
| | | 15 | -168.2166 | -168.2166 | 43.3197 | |
| POLYGON MIRROR PM | RPa | 16 | ∞ | ∞ | 35 | |
| fθ LENS SYSTEM FT (ft=100mm) | G1~G5 | 17 | *NOTE | | 0 | |
| | | 18 | | | 85.5732 | |
| SECOND CYLINDRICAL LENS (fcb=14.5mm) | CYb | 19 | ∞ | 6.9 | 4 | 1.476124 |
| | | 20 | ∞ | ∞ | 11.7192 | |

*NOTE: LENS CONFIGURATION (G1 TO G5) OF THE fθ LENS SYSTEM FT IS THE SAME AS IN THE FIRST EMBODIMENT (FIGS. 11 TO 13)

PATTERN DRAWING DEVICE

TECHNICAL FIELD

The present invention relates to a pattern drawing apparatus (pattern drawing device) that draws a prescribed pattern on a substrate, using a beam scanning apparatus that performs one-dimensional scanning with a beam in a main scanning direction.

BACKGROUND ART

It is known that it is possible to perform scanning at a constant velocity with a beam projected onto a sensitive material, by using a scanning optical system (fθ lens system or the like) and a polygon mirror (rotating polygon mirror). Each reflective surface of a general polygon mirror is formed parallel to a plane orthogonal to a rotating surface (plane including the rotational direction) of the polygon mirror, but the actual reflective surface is accompanied by an error such as being slightly inclined with respect to a surface orthogonal to the rotating surface of the polygon mirror, that is, a so-called tilting (inclination) error. Due to reasons such as that the error may vary slightly for each reflective surface even when the error is within the processing tolerance and that there is axial shaking dependent on the bearing performance of the rotating shaft of the polygon mirror, the image position (beam projection position) of the spot light condensed on the sensitive material by the fθ lens system is shifted for each reflective surface of the polygon mirror.

In order to prevent a shift in this image position, Japanese Laid-Open Patent Publication No. 08-297255 describes arranging cylindrical lenses that have refractive power only in a direction orthogonal to the deflection direction of the polygon mirror (main scanning direction and rotation direction of the polygon mirror), at two locations, one of which is in front of the polygon mirror and the other of which is behind the fθ lens system. In other words, two cylindrical lenses are arranged such that the generatrix is parallel to the main scanning direction of the beam. Due to this, for the direction (sub scanning direction) that is orthogonal to the scanning direction of the beam (main scanning direction), it is possible to set an optically conjugate relationship between the reflective surface of the polygon mirror and the surface to be irradiated of the sensitive material, and it is also possible to keep the projection position of the beam on the sensitive material constant in the sub scanning direction even when variations occur in the tilting errors that can occur in each reflective surface of the polygon mirror.

When the spot light of the beam projected onto the surface to be irradiated is made smaller to draw a finer pattern at a beam scanning position where the tilting error of the polygon mirror has been corrected by the first cylindrical lens located in front of the polygon mirror and the second cylindrical lens located behind the fθ system, such as shown in Japanese Laid-Open Patent Publication No. 08-297255, it is necessary to reduce various optical errors (aberrations) corresponding thereto, such as beam coma aberration, focus error, and spherical aberration, to be within a range corresponding to the fineness (minimum pixel size) of the pattern to be drawn.

SUMMARY OF INVENTION

A first aspect of the present invention is a pattern drawing apparatus that draws a pattern on an object to be irradiated by performing one-dimensional scanning with spot light in a main scanning direction using a deflective member, while condensing and projecting a beam from a light source apparatus as the spot light onto the object to be irradiated, the pattern drawing apparatus including a first optical system configured to receive the beam from the light source apparatus and having anisotropic refractive power causing the beam heading toward a reflective surface of the deflective member to converge in a sub scanning direction that is orthogonal to the main scanning direction; a scanning optical system configured to receive the beam deflected by the reflective surface of the deflective member and condense the beam as the spot on the object to be irradiated; and a second optical system that has anisotropic refractive power causing the beam emitted from the scanning optical system and heading toward the object to be irradiated to converge in the sub scanning direction, wherein a focal distance of the second optical system is set in a manner that a curvature amount caused by a sagittal coma aberration of the beam, occurring before the beam passes through a position of a peripheral image height in a beam scanning range within a field of view of the scanning optical system and enters the second optical system, becomes less than or equal to an Airy disk radius.

BRIEF DESCRIPTION OF DRAWINGS

FIG. 1 shows a schematic configuration of a beam scanning apparatus according to a first embodiment, wherein FIG. 1A shows a configuration in which the plane of the drawing is the sub scanning direction and FIG. 1B shows a configuration in which the plane of the drawing is the main scanning direction;

FIG. 2 shows a schematic configuration for describing the optical effect of the beam scanning apparatus shown in FIG. 1, wherein

FIG. 3 is a view in which only the main light ray PLc and the sagittal coma light rays PLu and PLd within the beam LB shown in FIG. 2 are extracted and shown in an exaggerated manner, wherein

FIG. 13 is a data table (lens data) showing an example of numerical value conditions and an arrangement relationship of each optical component (lenses and reflective surfaces) of the beam scanning apparatus shown in FIGS. 11 and 12;

FIG. 18 is a lens data table showing an example of numerical value conditions and an arrangement relationship of each optical component (lenses and reflective surfaces) in the beam scanning apparatus according to the comparative example of FIG. 17;

FIG. 23 is a data table (lens data) showing an example of numerical value conditions and an arrangement relationship of each optical component (lenses and reflective surfaces) of the beam scanning apparatus according to the second embodiment shown in FIG. 22;

DESCRIPTION OF EMBODIMENTS

Figure 2A:
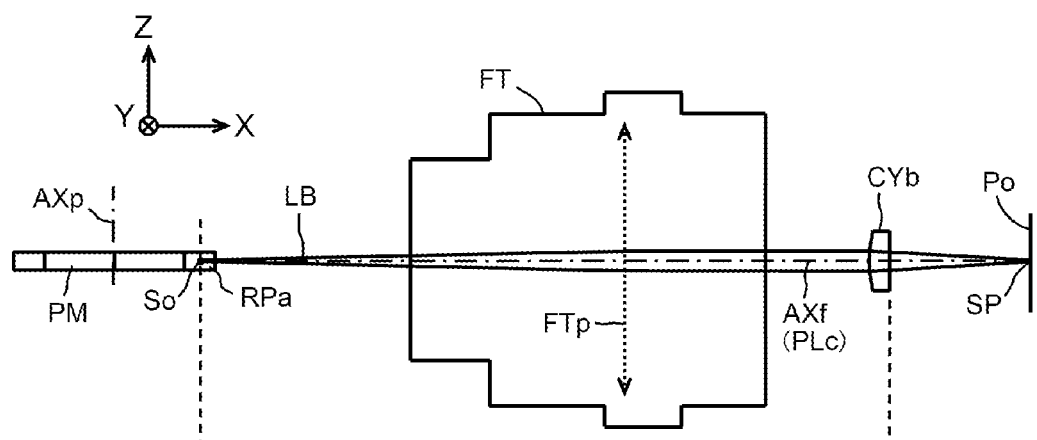
FIG. 2A shows the beam scanning apparatus corresponding to FIG. 1A as seen in the XZ-plane and FIG. 2B shows the beam scanning apparatus corresponding to FIG. 1B as seen in the XY-plane.

The following describes in detail preferred embodiments of a pattern drawing apparatus according to an aspect of the present invention, while referencing the accompanying drawings. The aspects of the present invention are not limited to these embodiments, and various modifications can be adopted therein. That is, the components described below include those that can be easily assumed by those skilled in the art to be substantially the same, and the components described below can be suitably combined. In addition, various omissions, substitutions, or changes of the components can be performed without departing from the spirit of the present invention.

First Embodiment

FIG. 1 schematically shows an overall configuration of a beam scanning apparatus according to a first embodiment, wherein a direction parallel to the Y-axis in an XYZ orthogonal coordinate system is the main scanning direction and a direction parallel to the Z-axis is the sub scanning direction. FIG. 1A shows the arrangement of a regular octagonal rotating polygon mirror (deflective member) PM having a rotational center axis AXp arranged parallel to the Z-axis, a first cylindrical lens (cylindrical planar lens having anisotropic refractive power) Cya that projects the beam LB onto one reflective surface RPa among the eight reflective surfaces RPa of the polygon mirror PM, an fθ lens system FT serving as a scanning optical system that receives a beam LB (deflection beam) reflected by a reflective surface RPa, and a second cylindrical lens (cylindrical planar lens having anisotropic refractive power) CYb that receives the deflection beam LB emitted from the fθ lens system FT and condenses spot light SP of the beam LB on a surface to be scanned (drawing target or surface of an object to be irradiated) Po, expanded within a plane (plane in which the sub scanning direction is in the plane of the drawing) parallel to the XZ-plane. FIG. 1B shows the arrangement of the first cylindrical lens (first optical system) CYa, the rotating polygon mirror PM, the fθ lens system FT, and the second cylindrical lens (second optical system) CYb, as seen within a plane (plane in which the main scanning direction is in the plane of the drawing) parallel to the XY-plane. In the present embodiment, with θ (rad or deg) indicating the incidence angle of the main light ray (center light ray) of the beam LB relative to the optical axis AXf of the fθ lens system FT, Hy indicating the distance (image height) in the Y-axis direction from the optical axis AXf of the spot light SP on the surface to be scanned Po, and ft indicating the focal distance, the fθ lens system FT is designed to have a barrel-shaped distortion such that the aberration substantially has a relationship of Hy=ft·θ, that is, a characteristic other than the relationship of Hy=ft·tan θ in a general lens system.

As shown in FIG. 1B, the beam LB from light source device that is shaped by passing through various lenses and optical members becomes coaxial to the optical axis AXe and incident to the first cylindrical lens CYa in which the direction of the refractive power (positive) is set in the Z-axis direction (sub scanning direction). The beam LB is shaped into a parallel light flux in which the effective diameter (diameter determined by an intensity of $1/e^2$ of the peak intensity or a full width at half-maximum) is approximately several millimeters, in which the intensity distribution in the cross-sectional plane is a Gaussian distribution or similar to a Gaussian distribution. The effective diameter of the beam LB indecent to the first cylindrical lens CYa corresponds to the numerical aperture (NA or full-angle beam spread) of the beam LB condensed as the spot light SP on the surface to be scanned Po by the refractive power of the rear-stage fθ lens system FT. In other words, if the effective diameter of the beam LB incident to the first cylindrical lens CYa is increased, it is possible to increase the numerical aperture of the beam LB on the surface to be scanned Po and to decrease the effective diameter of the spot light SP. However, the effective diameter of the beam LB incident to the first cylindrical lens CYa is set to be less than the length of each of the eight reflective surfaces of the rotating polygon mirror PM in the rotational direction (corresponding to the main scanning direction). In the present embodiment, the optical axis AXe of the first cylindrical lens CYa is set to a direction inclined by 45° in the clockwise direction relative to the X-axis, and parallel to the XY plane.

The beam LB that has passed through the first cylindrical lens CYa, while remaining as a parallel light flux in the XY-plane, becomes a convergent light flux in the Z-axis direction as shown in FIG. 1A, and is projected onto one reflective surface RPa among the eight reflective surfaces of the rotating polygon mirror PM that rotates clockwise. By setting the position of the reflective surface RPa of the rotating polygon mirror PM to be at or near the position of the rear-side focal distance of the first cylindrical lens CYa, the beam LB becomes condensed on the reflective surface RPa with a distribution of fine slits parallel to the XY-plane. Since the first cylindrical lens CYa acts as a parallel flat plate that does not have a refractive force in the XY-plane, the longitudinal-direction dimension of the slit distribution of the beam LB on the reflective surface RPa is the same as the effective diameter of the beam LB before becoming incident to the first cylindrical lens CYa. The beam LB that has been reflected by the reflective surface RPa of the rotating polygon mirror PM becomes a divergent light flux in the Z-axis direction (sub scanning direction) and a parallel light flux in the XY-plane (corresponding to the main scanning direction), and becomes incident to the fθ lens system FT having the optical axis AXf parallel to the X-axis, in a state where this beam LB has been deflected clockwise in the XY-plane in accordance with the rotation of the rotating polygon mirror PM (angle change of the reflective surface RPa).

The fθ lens system FT includes five quartz lenses G1 to G5 arranged along the optical axis AXf from the rotating polygon mirror PM side, and is configured such that the image plane side (surface to be scanned Po side) is a telecentric system. The position of the front-side focal distance of the fθ lens system FT is set to be at or near the position of the reflective surface RPa of the rotating polygon mirror PM, and in terms of geometric optics, the position of the reflective surface RPa of the rotating polygon mirror PM corresponds to the pupil plane (aperture stop position) of the fθ lens system FT and the surface to be scanned Po corresponds to the image plane of the fθ lens system FT.

Furthermore, in the present embodiment, in the XY-plane (corresponding to the main scanning direction), the optical axis AXe of the first cylindrical lens CYa and the optical axis AXf of the fθ lens system FT are set to intersect at an angle of 45° at or near the position of the reflective surface RPa of the rotating polygon mirror PM. Accordingly, in the XY-plane, as shown in FIG. 1B, when the reflective surface RPa of the rotating polygon mirror PM is inclined by 22.5° (45°/2) clockwise relative to the YZ-plane that is parallel to the Z-axis, the main light ray (center light ray) of the beam LB reflected by the reflective surface RPa becomes coaxial to the optical axis AXf of the fθ lens system FT, and is condensed as the spot light SP at a position passed through by the optical axis AXf on the surface to be scanned Po set at the position of the rear-side focal point position of the fθ lens system FT.

The beam LB emitted from the fθ lens system FT is condensed as the circular spot light SP on the surface to be scanned Po, through the second cylindrical lens CYb that has refractive power only in the Z-axis direction (sub scanning direction) and is longer than the scanning length of the spot light SP in the Y-axis direction (main scanning direction). As shown in FIG. 1B, since the second cylindrical lens CYb acts as a parallel flat plate that does not have refractive power in the Y-axis direction (main scanning direction), the beam LB emitted from the fθ lens system FT is converged such that a beam waist is formed at the surface to be scanned Po in accordance with the prescribed numerical aperture (NA or full-angle beam spread) caused exclusively by the refractive power of the fθ lens system FT, in the Y-axis direction (main scanning direction). On the other hand, as shown in FIG. 1A, the beam LB that has been reflected by the reflective surface RPa becomes a divergent light flux in the Z-axis direction (sub scanning direction) and is then incident to the fθ lens system FT, and therefore, when emitted from the fθ lens system FT, becomes a substantially parallel light flux in the Z-axis direction (sub scanning direction) due to the refractive power of the fθ lens system FT and is then incident to the second cylindrical lens CYb. Accordingly, by arranging the surface to be scanned Po to be set at or near the position of the rear-side focal distance in the Z-axis direction (sub scanning direction) of the second cylindrical lens CYb, the beam LB is converged such that a beam waist is formed at the surface to be scanned Po in accordance with the prescribed numerical aperture (NA or full-angle beam spread) caused by the combined refractive power of the fθ lens system FT and the second cylindrical lens CYb, in the Z-axis direction (sub scanning direction). In the present embodiment, the numerical aperture (NA or full-angle beam spread) of the beam LB projected onto the surface to be scanned Po is set to be the same in the Y-axis direction (main scanning direction) and the Z-axis direction (sub scanning direction). Furthermore, as made clear from FIG. 1A, the surface to be scanned Po and the reflective surface RPa of the rotating polygon mirror PM have an optically conjugate relationship in the Z-axis direction (sub scanning direction), due to the composite system that includes the fθ lens system FT and the second cylindrical lens CYb.

Therefore, the main light ray (center light ray) of the beam LB projected onto the surface to be scanned Po is used to scan one-dimensionally in the −Y direction in accordance with the rotation of the rotating polygon mirror PM (angle change of the reflective surface RPa) while the fθ lens system FT and the optical axis AXf are kept in a parallel state (telecentric state), in the main scanning direction (Y-axis direction) and the sub scanning direction (Z-axis direction). At this time, even if a tilting error occurs in which the reflective surface RPa of the rotating polygon mirror PM is inclined relative to the plane parallel to the Z-axis, since the reflective surface RPa of the rotating polygon mirror PM and the surface to be scanned Po have a conjugate relationship in the plane parallel to the XZ-plane, it is possible prevent the spot light SP from being positionally shifted in the sub scanning direction on the surface to be scanned Po due to the effect of this error. As described in detail further below, in order to reduce various types of aberrations, the focal distance of the first cylindrical lens CYa is set to be longer than (e.g. at least two times as long as) the focal distance of the fθ lens system FT and the focal distance of the second cylindrical lens CYb is set to be shorter than (e.g. no more than ½ of) the focal distance of the fθ lens system FT. Furthermore, when the cross-sectional intensity of the beam LB has a Gaussian distribution, the effective diameter (i.e., the beam waist diameter) φ of the spot light SP on the surface to be scanned Po is determined according to the full-angle spread θbm (rad or deg), which is the numerical aperture of the beam set according to the diameter of the beam LB incident to the first cylindrical lens CYa and the refractive power (focal distance or magnification rate) of the fθ lens system FT, and the wavelength λo (nm) of the beam LB, as shown in the expression below.

$$\varphi = 2\lambda o/[\pi(\tan(\theta bm/2))]$$

The following describes the optical effects in the beam scanning apparatus such as shown in FIG. 1, using FIGS. 2 to 5 in which the configuration of FIG. 1 is schematically shown. FIG. 2A shows the beam scanning apparatus corresponding to FIG. 1A as seen in the XZ-plane, and FIG. 2B shows the beam scanning apparatus corresponding to FIG. 1B as seen in the XY-plane. In FIGS. 2A and 2B, the main plane of the fθ lens system FT is FTp, the intersection point of the optical axis AXe of the first cylindrical lens CYa and the optical axis AXf of the fθ lens system FT is So, and the main light ray (center light ray) of the beam LB reflected by the reflective surface RPa of the rotating polygon mirror PM is PLc (AXf). As shown in FIG. 2B, in the XY-plane, the beam LB reflected by the reflective surface RPa of the rotating polygon mirror PM is used to scan linearly in the −Y direction on the surface to be scanned Po due to the rotation of the rotating polygon mirror PM, but this beam LB is deflected in a range of an incidence angle of ±θ relative to the optical axis AXf and becomes the spot light SP projected at a position that is an image height of ±Hy from the position of the optical axis AXf on the surface to be scanned Po in accordance with this angle θ.

With the focal distance being ft, the fθ lens system FT is designed such that the image height Hy and the incidence angle θ (deg) of the beam LB (main light ray PLc) relative to the optical axis AXf have a relationship (f-θ characteristic) whereby Hy=ft·Δθ. Accordingly, the change amount Δθ of the angle θ and the change amount ΔHy of the image height Hy have a proportional relationship, and when the angle of the reflective surface RPa changes at a constant velocity, scanning with the spot light SP is performed at a constant velocity in the −Y direction. In the present embodiment, as an example, the focal distance ft of the fθ lens system FT is set to approximately 100 mm and the maximum image height Hymax (peripheral image height position) of the image height Hy is approximately 26 mm (the maximum scanning length of the spot light SP is 52 mm). Furthermore, the rotation angle of the rotating polygon mirror PM while one reflective surface RPa of the rotating polygon mirror PM passes through the intersection point So is 45°, but a range (2·θmax) of the maximum incidence angle ±θmax of the beam LB corresponding to the maximum image height ±Hymax of this angle is within an effective deflection angle range of less than 15°, which is ⅓ of this angle. In other words, while the reflective surface RPa of the rotating polygon mirror PM changes in an effective deflection angle range that is less than 15° in the XY-plane, scanning with the spot light SP is performed from the position of the maximum image height+Hymax to the position of the maximum image height −Hymax. FIG. 2B shows a state at the instant when the main light ray PLc of the beam LB reflected by the reflective surface RPa reaches the position of the maximum image height+Hymax, that is, a state where the beam LB passes through a position (peripheral image height position) farthest outward in the effective field of view of the fθ lens system FT.

Figure 2B:
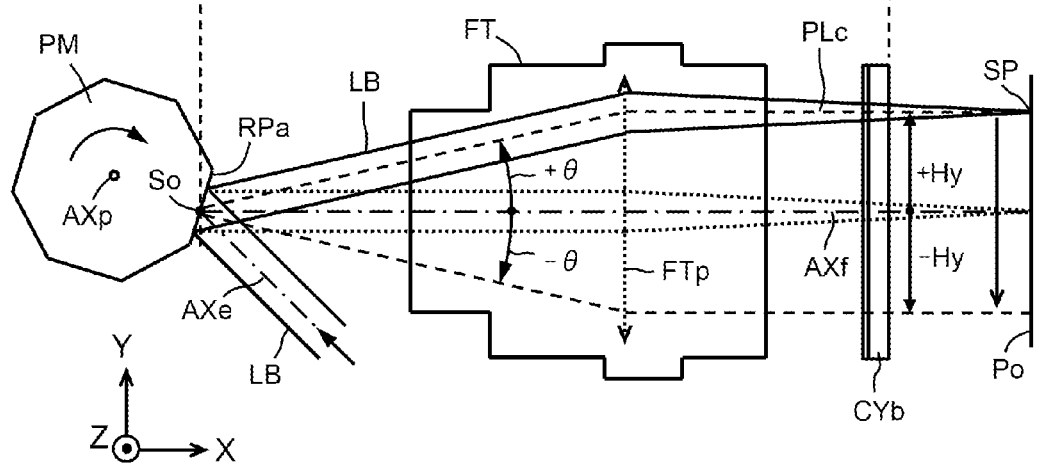
Figure 3A:
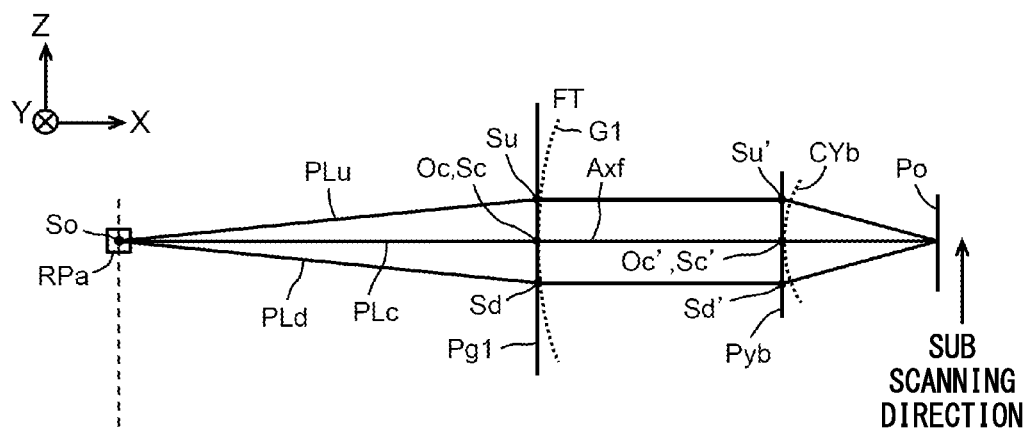
FIG. 3A is a view seen in the XZ-plane (plane parallel to the sub scanning direction) and FIG. 3B is a view seen in the XY-plane (plane parallel to the main scanning direction)
Figure 3B:
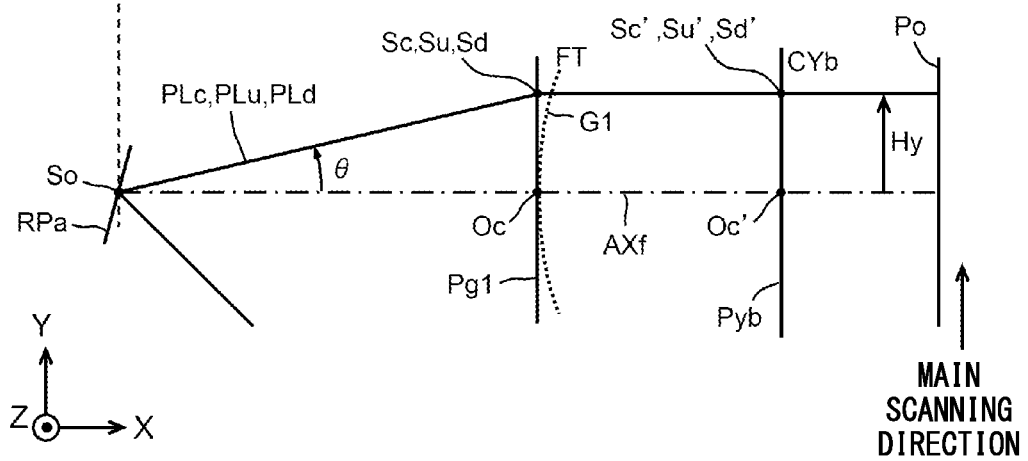

As shown in FIGS. 1 and 2, in the tilt correction optical system in which the cylindrical lenses CYa and CYb are added to the fθ lens system FT, the distortion (distortion aberration for realizing the f-θ characteristic) of the fθ lens system FT is converted into a sagittal coma aberration in the main scanning direction, and this is one cause of a decrease in the spot light SP imaging performance. The following describes the occurrence of such a sagittal coma aberration, while referencing FIGS. 3A and 3B that correspond to FIGS. 2A and 2B. FIG. 3 is an exaggerated view of only the main light ray PLc and the sagittal coma light rays PLu and PLd of the beam LB shown in FIG. 2, in which FIG. 3A shows the beam scanning apparatus corresponding to FIG. 2A as seen in XZ-plane (plane parallel to the sub scanning direction) and FIG. 3B shows the beam scanning apparatus corresponding to FIG. 2B as seen in XY-plane (plane parallel to the main scanning direction). As shown in FIGS. 3A and 3B, the sagittal coma light rays PLu and PLd are light rays that pass through the farthest periphery of the beam LB in the sub scanning direction (light rays defining the numerical aperture NA of the beam LB), relative to the main light ray PLc that is the center light ray of the beam LB.

Here, the intersection point of the main light ray PLc and the sagittal light rays PLu and PLd on one reflective surface RPa of the rotating polygon mirror PM is So, the intersection point (vertex) of the lens G1 (see FIG. 1) that is farthest on the incidence side in the fθ lens system FT and the optical axis AXf on the incidence surface is Oc, the incidence-side tangent plane that includes the vertex Oc of the incidence surface of the lens G1 is Pg1, the intersection point of the main light rat PLc of the beam LB and the incidence-side tangent plane Pg1 is Sc, and the intersection points of the respective sagittal coma light rays PLu and PLd of the beam LB and the incidence-side tangent plane Pg1 are Su and Sd. Furthermore, the intersection point (vertex) of the lens surface (convex surface) of the second cylindrical lens CYb farthest on the incidence side and the optical axis AXf is Oc', the incidence-side tangent plane including the vertex Oc' of the lens surface (convex surface) of the second cylindrical lens CYb farthest on the incidence side is Pyb, the intersection point of the main light ray PLc of the beam LB and the incidence-side tangent plane Pyb is Sc', and the intersection points of the respective sagittal coma light rays PLu and PLd of the beam LB and the incidence-side tangent plane Pyb are Su' and Sd'.

Figure 4:
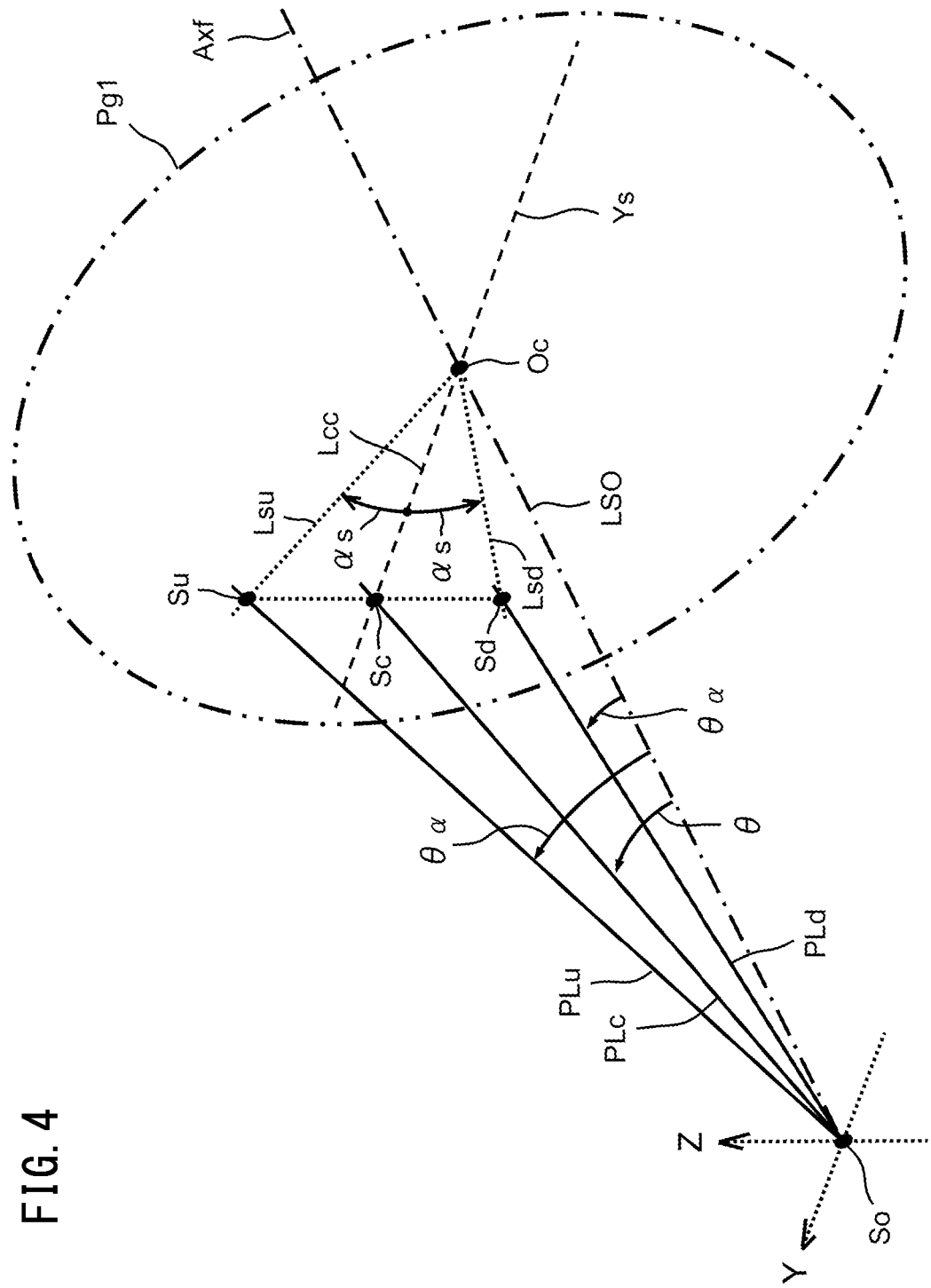
FIG. 4 is a perspective view of a geometric optical relationship determined according to the main light ray PLc and the sagittal coma light rays PLu and PLd of the beam LB in FIG. 3.

The following describes the geometric optical relationship determined by the sagittal coma light rays PLu and PLd and the main light ray PLc of the beam LB in the state shown in FIG. 3, using FIG. 4. FIG. 4 is a perspective diagram showing the arrangement relationship among the intersection point So on the reflective surface RPa of the rotating polygon mirror PM, the vertex Oc on the incidence-side tangent plane Pg1, and the intersection points Sc, Su, and Sd. The incidence angle of the main light ray PLc heading from the intersection point So toward the intersection point Sc on the in the incidence-side tangent plane Pg1 is an angle $\theta$ relative to the optical axis AXf. At this time, with a line that is parallel to the Y-axis and passes through the vertex Oc being Ys, the line segment connecting the vertex Oc and the connection point Su and the line segment connecting the vertex Oc and the intersection point Sd each form an angle as relative to the line Ys. Accordingly, the incidence angles (angles relative to the optical axis AXf) of the sagittal comma light rays PLu and PLd heading respectively to the intersection points Su and Sd from the intersection point So are each an angle $\theta\alpha$. Due to this, when the length of the line segment connecting the intersection point So on the reflective surface RPa and the vertex Oc on the incidence-side tangent plane Pg1 is LSO, the length of the line segment connecting the vertex Oc and the intersection point Sc is Lcc, the length of the line segment connecting the vertex Oc and the intersection point Su is Lsu, and the length of the line segment connecting the vertex Oc and the intersection point Sd is Lsd, a relationship such as shown below in Expression (1) is realized for the lengths Lcc, Lsu, and Lsd, from the relationships of Lcc=LSO·tan $\theta$ and Lsu=Lsd=LSO·tan $\theta\alpha$.

$$\frac{Lcc}{Lsu} = \frac{Lcc}{Lsd} = \frac{\tan\theta}{\tan\theta\alpha} \qquad (1)$$

Figure 5A:
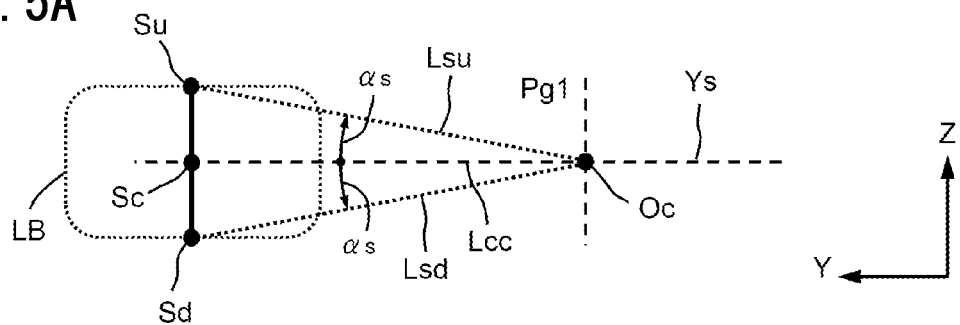
FIG. 5 is a diagram for describing a distribution of the beam LB (spot light SP) in an incidence-side tangent plane Pg1 of the fθ lens system FT of FIG. 3, in an incidence-side tangent plane Pyb of a cylindrical lens CYb, and on a surface to be scanned Po.
Figure 5B:
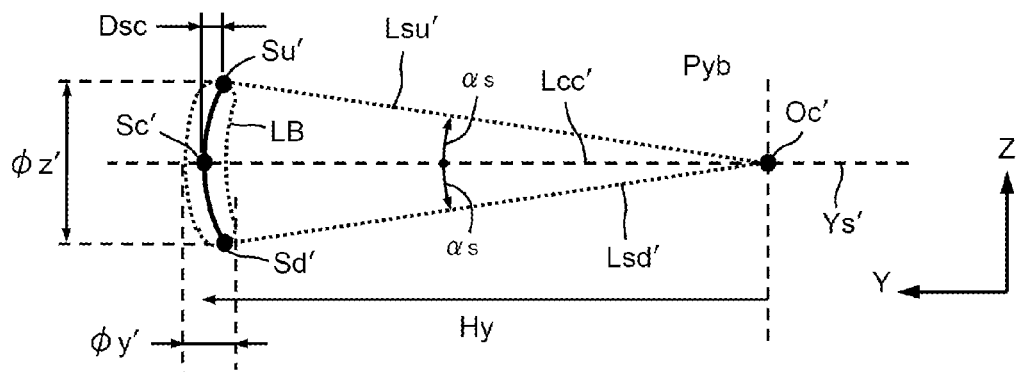

Furthermore, FIGS. 5A and 5B are used to describe a distribution of the beam LB in the incidence-side tangent plane Pg1 of the fθ lens system FT shown in FIGS. 3A, 3B, and 4, a distribution of the beam LB in the incidence-side tangent plane Pyb of the cylindrical lens CYb shown in FIGS. 3A and 3B, and a distribution of the beam LB (spot light SP) on the surface to be scanned Po. FIG. 5A again shows the distribution of the beam LB and the relationship of the arrangement of each of the vertex Oc and the intersection points Sc, Su, and Sd in the incidence-side tangent plane Pg1 shown in FIG. 4. FIG. 5B shows an exaggerated view of the beam LB and the relationship if the arrangement of each of the vertex Oc' and the intersection points Sc', Su', and Sd' that correspond respectively to the vertex Oc and the intersection points Sc, Su, and Sd in the incidence-side tangent plane Pyb of the cylindrical lens CYb shown in FIG. 3. In FIG. 5B, Ys' is a line segment parallel to the Y-axis and passing through the vertex Oc' and the intersection point Sc', and the intersection point Sc' is positioned at a distance of the image height Hy from the vertex Oc'. As made clear from the incident state shown in FIGS. 2A and 2B, in the incidence-side tangent plane Pg1, the beam LB has a distribution with a prescribed width in each of the Y direction (main scanning direction) and the Z direction (sub scanning direction). However, as shown in FIG. 5B, in the incidence-side tangent plane Pyb of the cylindrical lens CYb, the beam LB has a distribution that is long in the sub scanning direction and curved to form an arc that is recessed toward the vertex Oc' side, due to the aberration characteristics of the fθ lens system FT. The distribution of the beam LB in the incidence-side tangent plane Pyb has a width of a dimension φy' in the Y direction and a width of a dimension φz' in the Z direction (equal to the interval between the intersection points Su' and Sd' in the Z direction).

Figure 5C:
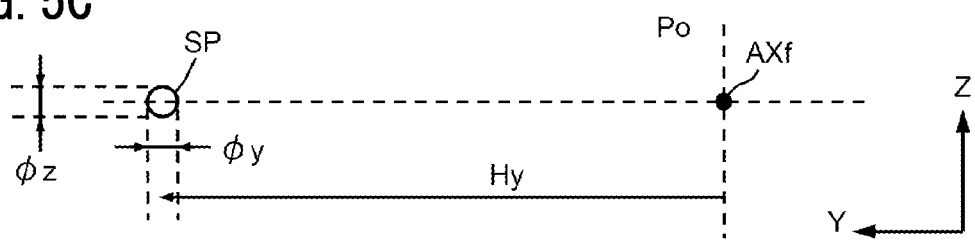

The Y-direction dimension φy' of the beam LB in the incidence-side tangent plane Pyb is a width of the beam LB in the Y direction while the beam LB is being converged by the fθ lens system FT to form a beam waist at the surface to be scanned Po. Furthermore, the Z-direction dimension φz' of the beam LB in the incidence-side tangent plane Pyb is a width of the beam LB while the beam LB forms a light flux approximately parallel to the Z direction and is emitted from the fθ lens system FT. As shown in FIG. 5C, due to the cylindrical lens CYb, the beam LB that has passed through the incidence-side tangent plane Pyb is condensed on the surface to be scanned Po as the spot light SP having the Y-direction (main scanning direction) dimension φy and the Z-direction (sub scanning direction) dimension φz, at a position of the image height Hy. The cylindrical lens CYb has positive refractive power in the Z direction (sub scanning direction) but does not have refractive power in the Y direction (main scanning direction), and therefore the beam LB having the dimension φz' in the incidence-side tangent plane Pyb becomes the spot light SP having the dimension φz due solely to the Z-direction convergence effect of the cylindrical lens CYb. The beam LB having the dimension φy' in the incidence-side tangent plane Pyb is not affected by the convergence effect of the second cylindrical lens CYb, and becomes the spot light SP having the dimension φy due solely to the convergence effect of the fθ lens system FT.

Due to the definition (distortion aberration characteristics) of the fθ lens system FT, the image height Hy is equal to the product of the focal distance ft of the fθ lens system FT and the incidence angle $\theta$ (rad or deg), and therefore the length Lcc' of the line segment connecting the vertex Oc' and the intersection point Sc', the length Lsu' of the line segment connecting the vertex Oc' and the intersection point Su', and the length Lsd' of the line segment connecting the vertex Oc' and the intersection point Sd' shown in FIG. 5B have a relationship such as shown in Expression (2) below, based on the angles $\theta$ and $\theta\alpha$ shown in FIG. 4, the expression Lcc'=ft·$\theta$, and the expression Lsu'=Lsd'=ft·$\theta\alpha$.

$$\frac{Lcc'}{Lsu'} = \frac{Lcc'}{Lsd'} = \frac{\theta}{\theta\alpha} \qquad (2)$$

Since there is a slight difference between the angle $\theta$ and the angle $\theta\alpha$, tan $\theta$/tan $\theta\alpha \neq \theta/\theta\alpha$, and based on Expressions (1) and (2), Lcc/Lsu≠Lcc'/Lsu' and Lcc/Lsd≠Lcc'/Lsd'. Furthermore, the angle as in the incidence-side tangent plane Pg1 shown in FIGS. 4 and 5A remains the same before and after the passage through the fθ lens system FT, and therefore, in the incidence-side tangent plane Pyb in FIG. 5B, the angle of the line segment with the length Lsu' connecting the vertex Oc' and the intersection point Su' relative to the line Ys' and the angle of the line segment with the length Lsd' connecting the vertex Oc' and the intersection point Sd' relative to the line Ys' are both the angle as. As shown above, the intersection points Sc, Su, and Sd exist on a straight line that is parallel to the Z-axis in the incidence-side tangent plane Pg1 such as shown in FIG. 5A, but the line segment connecting the intersection points Sc', Su', and Sd' forms an arc shape in the incidence-side tangent plane Pyb as shown in FIG. 5B. With such a curved characteristic, when the shift width in the main scanning direction (Y direction) between the intersection point Sc' and the intersection point Su' (or Sd') is a curvature amount Dsc, this curvature amount Dsc corresponds to the magnitude of the sagittal aberration, and the Y-direction dimension φy' of the beam LB in the incidence-side tangent plane Pyb spreads to be greater than this dimension in a case where the sagittal coma aberration (curve amount Dsc) was zero. The spread portion becomes included in the Y-direction (main scanning direction) dimension Ty of the spot light SP ultimately condensed on the surface to be scanned Po, and this becomes one cause of the decrease in the spot light SP imaging performance.

Figure 6:
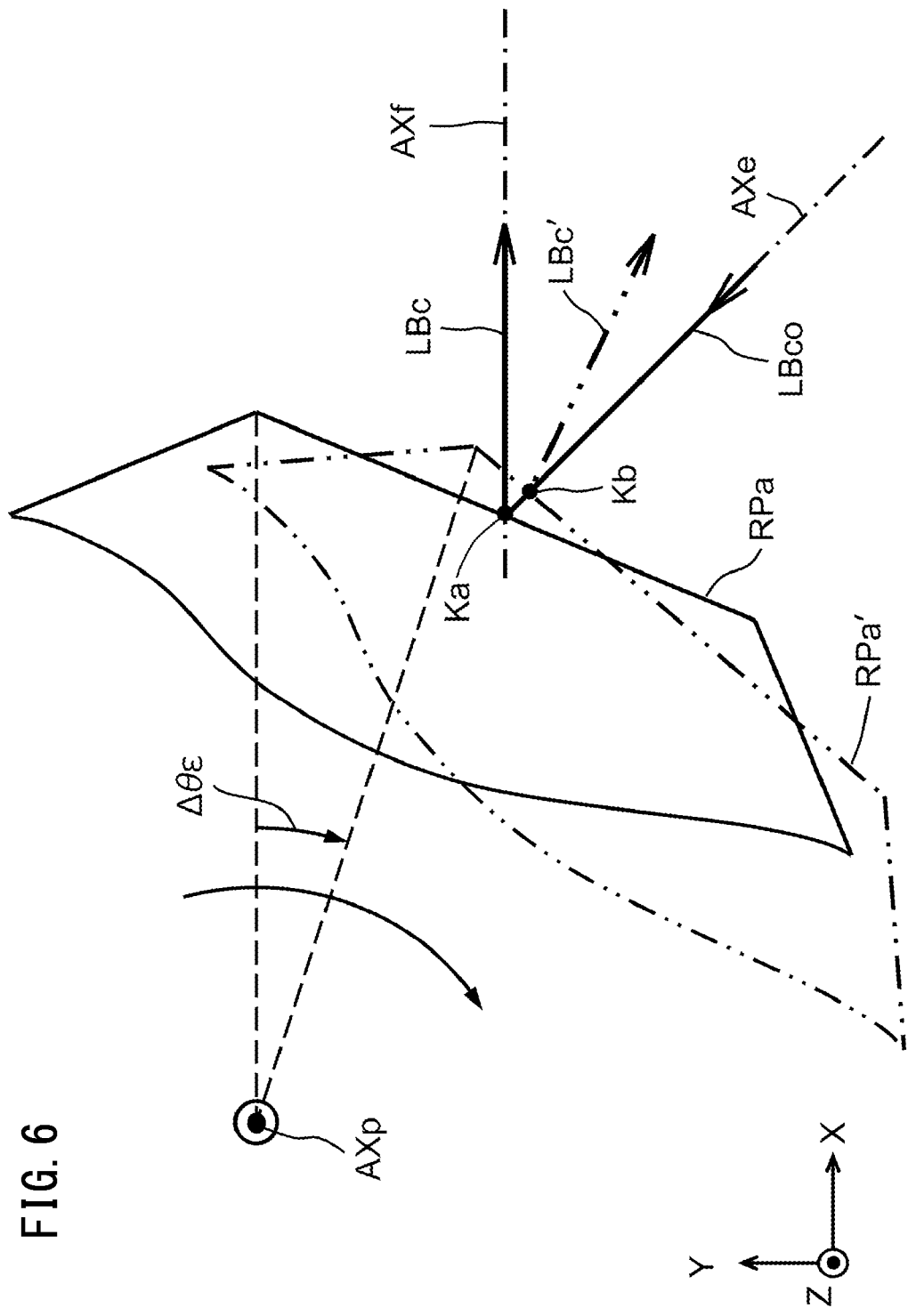
FIG. 6 schematically shows a state of reflection of the beam LB at a reflective surface RPa when the regular octagonal polygon mirror PM shown in FIG. 1 or 2 has been rotated clockwise by a prescribed angle.

Furthermore, another cause of a decrease in the imaging performance is a defocus (out of focus) phenomenon, which is caused by the position of the reflective surface RP of the rotating polygon mirror PM being displaced in the direction of the optical axis AXf of the fθ lens system FT. FIG. 6 schematically shows a state of the reflection of the beam LB by one reflective surface RPa, when the regular octagonal rotating polygon mirror PM shown in FIGS. 1A and 1B or FIGS. 2A and 2B has rotated clockwise by an angle 48e around a rotational center axis AXp. In FIG. 6, an initial rotational angle position of the rotating polygon mirror PM is set to be a position at which the reflective surface RPa is inclined by 22.5° relative to the YZ-plane. At this time, the main light ray (center light ray) LBco (or the optical axis AXe of the first cylindrical lens CYa) of the beam LB incident to the reflective surface RPa is set to be at an angle of 45° relative to the optical axis AXf of the fθ lens system FT in the XY-plane, and therefore main light beam LBco is reflected at the point Ka on the reflective surface RPa and becomes the main light ray LBc that progresses coaxially with the optical axis AXf. When the rotating polygon mirror PM rotates by the angle Δθε from the initial rotational angle position, the reflective surface RPa becomes a reflective surface RPa' that has been inclined by the angle Δθε. At this time, the main light ray (center light ray) LBco of the beam LB is reflected at the point Kb on the reflective surface RPa' and becomes the main light ray LBc' deflected in a direction inclined by 2·Δθε relative to the optical axis AXf. The point Ka and the point Kb are at different positions in the direction of the optical axis AXf of the fθ lens system FT, and therefore the best focus position (beam waist position) of the spot light SP condensed by the fθ lens system FT (or the second cylindrical lens CYb) is displaced in the optical axis AXf direction according to the position of the main scanning range (image height position).

Figure 7:
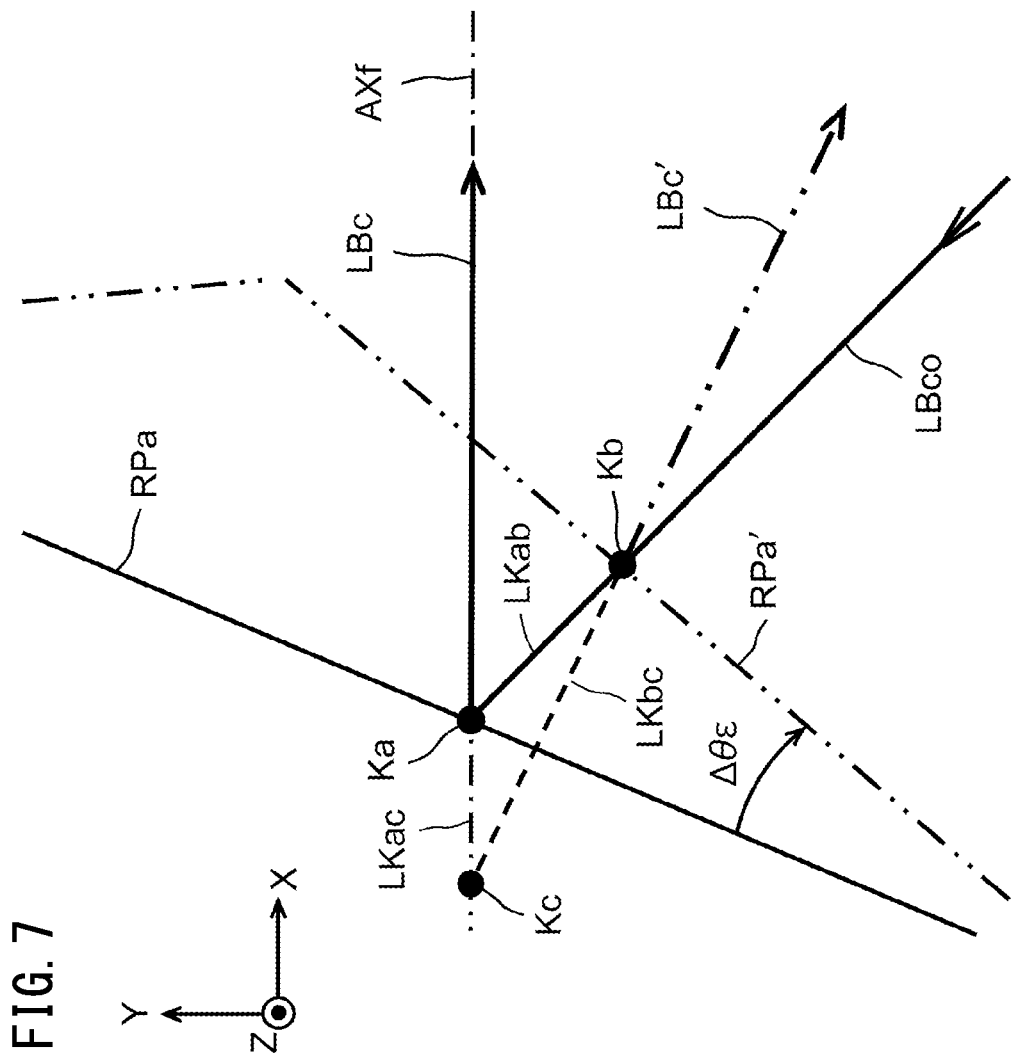
FIG. 7 is an enlarged view of a portion including the reflective surfaces RPa and RPa' and the points Ka and Kb in FIG. 6.

FIG. 7 is an enlarged view of a portion including the reflective surfaces RPa and RPa' and the points Ka and Kb in FIG. 6, wherein the intersection point of the line obtained by extending the main light ray LBc' from the point Kb on the reflective surface RPa' to the inside of the rotating polygon mirror PM and the line obtained by extending the main light ray LBc from the point Ka on the reflective surface RPa to the inside of the rotating polygon mirror PM is the point Kc. Furthermore, the length between the point Kb and the point Ka is LKab, the length between the point Kb and the point Kc is LKbc, and the length between the point Ka and the point Kc is LKac. In the plane (plane parallel to the XZ-plane) that is orthogonal to the main scanning direction (Y-axis), between the angular position of the reflective surface RPa and the angular position of the reflective surface RPa', there is a light path difference with respect to the fθ lens system FT on the object plane side space (rotating polygon mirror PM) side of a distance ΔLK (=LKab+LKbc−LKac), which is obtained by subtracting the length LKac from the point Ka to the point Kc from the sum of the length LKab from the point Kb to the point Ka and the length LKbc from the point Kb to the point Kc. As described above in FIG. 2A or FIG. 3A, in the plane (sub scanning direction) parallel to the XZ plane, the image plane (imaging plane of the spot light SP or surface to be scanned Po) and the reflective surface RP of the rotating polygon mirror PM (strictly speaking, the position of the point Ka in FIG. 6 or FIG. 7) are set to have a conjugate relationship, and therefore, due to this distance ΔLK, the focus position of the spot light SP in the optical axis direction in the image space differs according to the rotational angle position of the rotating polygon mirror PM. Accordingly, while scanning is being performed with the beam LB deflected by the one reflective surface RPa of the rotating polygon mirror PM, the spot light SP projected onto the surface to be scanned Po forms an image with a focus error that changes according to the image height position (Hy) of the fθ lens system FT, thereby reducing the imaging performance. When the distance ΔLK is a positive value, the light path length at the periphery along the main light ray LBc' progressing outside the axis of the fθ lens system FT is less than the light path length at the center along the main light ray LBc progressing on the axis of the fθ lens system FT, and when the distance ΔLK is a negative value, the light path length at the periphery along the main light ray LBc' progressing outside the axis of the fθ lens system FT is greater than the light path length at the center along the main light ray LBc progressing on the axis of the fθ lens system FT.

Figure 8:
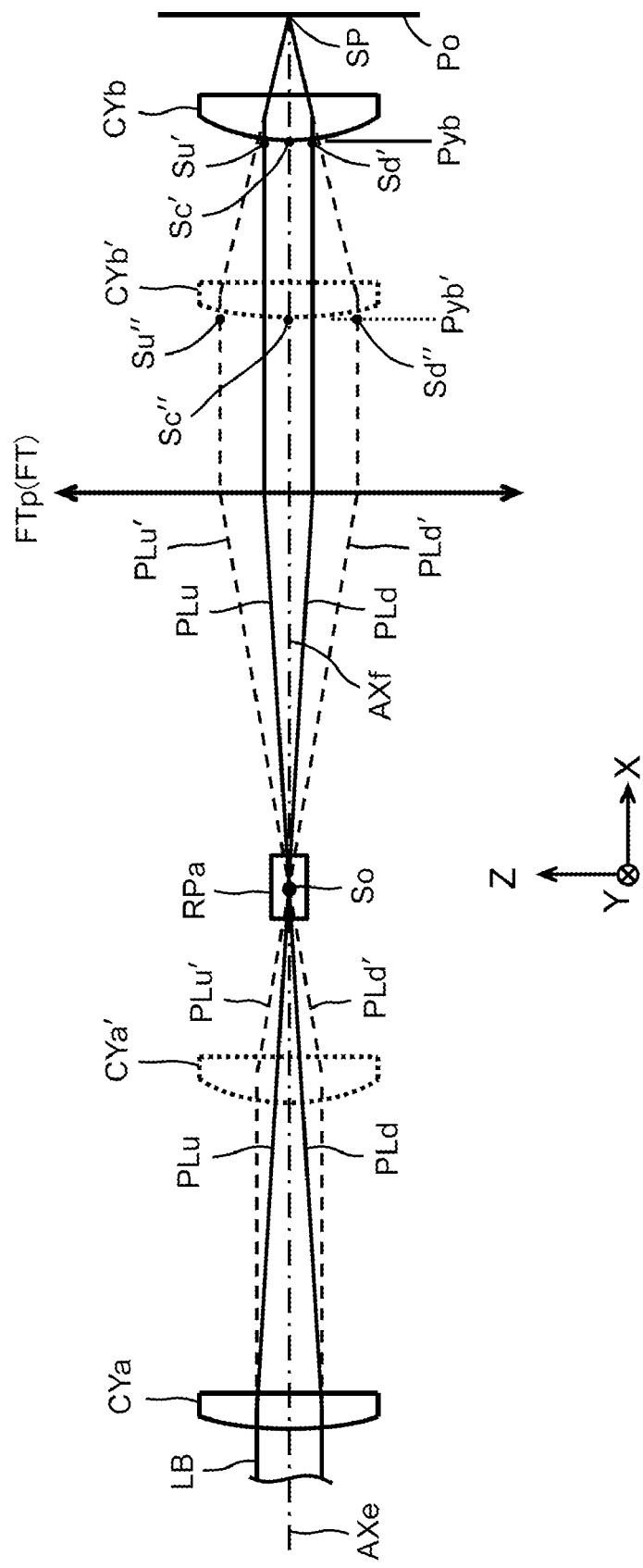
FIG. 8 schematically shows a light path in a plane (sub scanning direction) parallel to the XZ-plane from the first cylindrical lens CYa to the surface to be scanned Po, corresponding to FIG. 1A above.

Therefore, in the present embodiment, in the beam scanning apparatus shown in FIGS. 1A and 1B, the arrangement and various conditions of the first cylindrical lens CYa and the second cylindrical lens CYb functioning as the optical system that corrects the tilt of the rotating polygon mirror PM are set in a manner to reduce the sagittal coma aberration or focus error. Specifically, the ranges of the focal distances of the first cylindrical lens CYa and the second cylindrical lens CYb are set in a manner to reduce the sagittal coma aberration or focus error that causes a reduction in the imaging performance of the spot light SP projected onto the surface to be scanned Po, to be within a range that is tolerable in practical application. FIG. 8 schematically shows a light path from the first cylindrical lens CYa to the surface to be scanned Po in a plane (sub scanning direction) parallel to the XZ-plane, corresponding to FIG. 1A above, wherein the fθ lens system FT is simplified and shown in a main plain FTp. In FIG. 8, an example is shown in which two combinations of the cylindrical lenses CYa and CYb are set to have different focal distances, such that the numerical aperture (NA or open angle of the beam LB projected onto the surface to be scanned Po) on the image plane side is constant in the sub scanning direction (Z direction). The first combination is a combination of a cylindrical lens CYa with a relatively long focal distance and a cylindrical lens CYb with a relatively short focal distance, and the second combination is a combination of a cylindrical lens CYa' with a relatively short focal distance provided at the position indicated by the dashed line and a cylindrical lens CYb' with a relatively long focal distance. Furthermore, the beam LB is incident to the cylindrical lens CYa or the cylindrical lens CYa' as a parallel light flux having a certain thickness in the sub scanning direction (Z direction).

Furthermore, as described in FIGS. 3A and 3B, the sagittal coma light rays PLu and PLd of the beam LB in the combination of the cylindrical lenses CYa and CYb are shown by solid lines, and the sagittal coma light rays PLu' and PLd' of the beam LB in the combination of the cylindrical lenses CYa' and CYb' are shown by dashed lines. As made clear from the configuration shown in FIG. 8, in a case where the numerical aperture (NA) of the beam LB projected onto the surface to be scanned Po is the same in the combination of the cylindrical lenses CYa and CYb and in the combination of the cylindrical lenses CYa' and CYb', it is necessary to make the focal distance of the cylindrical lens CYa longer than the focal distance of the cylindrical lens CYa' and to make the focal distance of the cylindrical lens CYb shorter than the focal distance of the cylindrical lens CYb'. Furthermore, as described in FIGS. 3A and 3B, when the incidence-side tangent plane of the second cylindrical lens CYb is Pyb, the incidence-side tangent plane of the second cylindrical lens CYb' is Pyb', the respective intersection points of the main light ray PLc and the sagittal coma light rays PLu and PLd in the incidence-side tangent plane Pyb are Sc', Su', and Sd', and the respective intersection points of the main light ray and the sagittal coma light rays PLu' and PLd' in the incidence-side tangent plane Pyb' are Sc'', Su'', and Sd'', the interval between the intersection points Su' and Sd' is less than the interval between the intersection points Su'' and Sd'', in the sub scanning direction (Z direction). Here, in the distribution shape of the beam LB in the incidence-side tangent plane Pyb described in FIG. 5B above, the curvature radius of the curve of the arc passing through the intersection points Sc', Su', and Sd' in FIG. 5B is determined according solely to the image height Hy and the focal distance of the fθ lens system FT, without being related to the difference between the focal distances of the second cylindrical lenses CYb and CYb'. Therefore, the curvature radius of the curve of the arc passing through each of the intersection point Sc'' of the main light ray PLc of the beam LB in the incidence-side tangent plane Pyb' of the second cylindrical lens CYb' and the intersection points Su'' and Sd'' in the incidence-side tangent plane Pyb' is the same as the curvature radius in the incidence-side tangent plane Pyb.

Based on the above, the curvature radius of the curve of the arc connecting the intersection point positions of the main light ray and each sagittal coma light ray of the beam LB does not change between the incidence-side tangent plane Pyb and the incidence-side tangent plane Pyb' at the same image height position, and therefore, whichever interval is smaller, among the interval between the intersection points Su' and Sd' and the interval between the intersection points Su' and Sd' in the sub scanning direction (Z direction), is restricted from experiencing the increase in the dimension φy' caused by the occurrence of the sagittal coma aberration described in FIG. 5B. In other words, in FIG. 8, by adopting the combination of the cylindrical lenses CYa and CYb instead of the combination of the cylindrical lenses CYa' and CYb', lengthening the focal distance of the first cylindrical lens CYa as much as possible, and shortening the focal point length of the second cylindrical lens CYb as much as possible, it is possible to reduce the sagittal coma aberration. In the incidence-side tangent plane Pyb or the incidence-side tangent plane Pyb', as the image height Hy at which the spot light SP forms an image becomes smaller, the curvature radius of the curve of the arc passing through the intersection points Sc', Su', and Sd' or the curvature radius of the curve of the arc passing through the intersection points Sc'', Su'', and Sd'' becomes larger, and when the image height Hy is zero (a state in which the spot light SP is positioned on the optical axis AXf''), the intersection points Sc', Su', and Sd' or the intersection points Sc'', Su'', and Sd'' are positioned on a straight line parallel to the Z-axis.

As described above, in order to reduce the sagittal coma aberration, the focal distance of the second cylindrical lens CYb should be made as short as possible, but when this focal distance becomes extremely short, e.g. less than or equal to 1 mm, it becomes difficult to manufacture the second cylindrical lens CYb, and there is a problem (insufficient working distance) that spatial interference occurs between the surface to be scanned Po and the second cylindrical lens CYb. Furthermore, making the focal distance of the second cylindrical lens CYb as short as possible means lengthening the focal distance of the first cylindrical lens CYa by a corresponding amount, which results in the light path from the first cylindrical lens CYa to the rotating polygon mirror PM becoming excessively long, thereby causing an increase in the size of the beam scanning apparatus. In light of this, the following describes an example of a method for determining the focal distance of the second cylindrical lens CYb.

As shown in FIG. 5A above, the line segments respectively having the lengths Lsu and Lsd and connecting the vertex Oc and the intersection points Su and Sd in the incidence-side tangent plane Pg1 have angles of αs relative to the line segment having the length Lcc and connecting the vertex Oc and the intersection point Sc. Therefore, a relationship such as shown in Expression (3) below is established from the relationship in Expression (1) derived from FIG. 4 above.

$$\frac{Lcc}{Lsu} = \frac{Lcc}{Lsd} = \frac{\tan\theta}{\tan\theta\alpha} = \cos(\alpha s) \tag{3}$$

Furthermore, since the angle αs in the incidence-side tangent plane Pg1 shown in FIG. 5A is maintained in the incidence-side tangent plane Pyb as well, as shown in FIG. 5B, a relationship such as shown below in Expression (4) is established based on the relationship in Expression (2) above and the arrangement relationship shown in FIG. 5B.

$$\frac{Lcc' - Dsc}{Lsu'} = \frac{Lcc' - Dsc}{Lsd'} = \frac{\mathrm{ft}\cdot\theta - Dsc}{\mathrm{ft}\cdot\theta\alpha} = \cos(\alpha s) \tag{4}$$

By substituting the angle θα (=arctan[tan θ/cos(αs)]) obtained from Expression (3) into Expression (4), the curvature amount Dsc is obtained as shown in Expression (5)

$$Dsc = \mathrm{ft}\cdot\left[\theta - \cos(\alpha s)\cdot\arctan\left(\frac{\tan\theta}{\cos(\alpha s)}\right)\right] \tag{5}$$

When Expression (5) is rewritten using the relationship of image height Hy=ft·θ, the curvature amount Dsc is expressed as shown below in Expression (6).

$$Dsc = Hy\,\mathrm{ft}\cdot\cos(\alpha s)\cdot\arctan\left[\frac{\tan(Hy/\mathrm{ft})}{\cos(\alpha s)}\right] \tag{6}$$

On the other hand, as shown in FIG. 5B, assuming that the curvature amount Dsc relative to the image height Hy is sufficiently small (i.e., Hy >>Dsc), the Z-direction (sub scanning direction) dimension φz' of the intersection points Su' and Sd' in the incidence-side tangent plane Pyb can be approximated as shown in FIG. 7 below.

$$\frac{\varphi z'}{2} = (Hy - Dsc)\cdot\tan(\alpha s) \approx Hy\cdot\tan(\alpha s) \tag{7}$$

Note, however, that Hy >>Dsc.

Furthermore, the Z-direction dimensions φz' of the intersection points Su' and Sd' in the incidence-side tangent plane Pyb of the second cylindrical lens CYb correspond to the pupil diameter in the sub scanning direction of the beam LB passing through the second cylindrical lens CYb. Therefore, when the numerical aperture on the image plane side (surface to be scanned Po side) of the beam LB in the sub scanning direction is NAs and the focal distance of the second cylindrical lens CYb is fcb, the relationship shown in Expression (8) below is established.

$$\frac{\varphi z'}{2} = fcb \cdot NAs \qquad (8)$$

Collectively representing this Expression (8) and Expression (7) above leads to the relationship shown in Expression (9) below.

$$\tan(\alpha s) \approx \frac{fcb \cdot NAs}{Hy} \qquad (9)$$

Rewriting Expression (9) as a cosine (cos) function leads to Expression (10).

$$\cos(\alpha s) \approx \left[\left(\frac{fcb \cdot NAs}{Hy}\right)^2 + 1\right]^{-\frac{1}{2}} \qquad (10)$$

Here, when (fcb·NAs/Hy)²+1=FN and Expression (10) is substituted into Expression (6) above, the curvature amount Dsc is approximated such as shown in Expression (11) below.

$$Dsc = Hy - ft \cdot (FN)^{-\frac{1}{2}} \cdot \arctan\left[(FN)^{\frac{1}{2}} \cdot \tan(Hy/ft)\right] \qquad (11)$$

From the viewpoint of the imaging performance of the spot light SP on the surface to be scanned Po, it is thought that the imaging performance can be maintained at a level that does not cause problems as long as the curvature amount Dsc is less than the Airy disk radius in the main scanning direction (Y direction). When the intensity distribution of the beam LB has a Gaussian distribution or a distribution similar to a Gaussian distribution, with the wavelength of the beam LB being λo, the numerical aperture on the image plane side (surface to be scanned Po side) in the main scanning direction being NAm, and the radius of the Airy disk in the main scanning direction being ADm, the radius ADm is approximately expressed as shown in Expression (12) below.

$$ADm = 0.61 \cdot \frac{\lambda o}{NAm} \qquad (12)$$

As an example, when the wavelength λo is 355 nm and the numerical aperture NAm is 0.06, the Airy disk radius ADm is approximately 3.6 μm. In light of the above, the focal distance fcb of the second cylindrical lens CYb should be set to realize a condition of Dsc ADm, based on Expressions (11) and (12). A detailed example of the focal distance fcb of the second cylindrical lens CYb in the present embodiment is described further below, but first, the conditions for the focal distance fcb of the second cylindrical lens CYb making it possible to restrict the reduction in the imaging performance caused by the defocus phenomenon described in FIGS. 6 and 7 above are described.

As described in FIGS. 6 and 7, the difference in the light path length between the beam LB (main light ray LBc) passing through the optical axis AXf of the f9 lens system FT and the beam LB (main light beam LBc') passing through the outmost periphery of the field of view of the fθ lens system FT, in the object plane side space (the space on the reflective surface RPa or RPa' side of the rotating polygon mirror PM), corresponds to the distance ΔLK obtained by subtracting the length LKac from the point Ka to the point Kc from the sum of the length LKab from the point Kb to the point Ka and the length LKbc from the point Kb to the point Kc, as described in FIG. 7. When this distance ΔLK is a light path length difference (object plane side defocus amount) ΔDop, the light path length difference ΔDop can be easily acquired from the geometric optical relationship such as shown in FIG. 7, based on the outer diameter of the rotating polygon mirror PM, the number of surfaces of the rotating polygon mirror PM, the incidence angle of the beam LB (main light ray LBc') relative to the optical axis AXf of the fθ lens system FT, and the position of the incidence point (point Kb in FIG. 7) of the beam LB on the reflective surface RPa' of the rotating polygon mirror PM when at this incidence angle. The image plane side defocus amount ΔDip in the sub scanning direction (Z direction) occurring on the image surface (surface to be scanned Po) side due to this object plane side defocus amount ΔDop can be expressed by the focal distance ft of the fθ lens system FT and the focal distance fcb of the second cylindrical lens CYb, as shown in Expression (13) below.

$$\Delta Dip = \Delta Dop \cdot \frac{fcb^2}{ft^2} \qquad (13)$$

From the viewpoint of the imaging performance, it is thought that a level of imaging performance that does not cause problems can be realized if the image plane side defocus amount £Dip is less than the depth of focus DOFs in the sub scanning direction on the image plane side of the composite optical system realized by the fθ lens system FT and the second cylindrical lens CYb. The depth of focus DOFs in the sub scanning direction is expressed as shown below in Expression (14), based on the image plane side numerical aperture NAs in the sub scanning direction and the wavelength λo of the beam LB.

$$DOFs = \frac{\lambda o}{NAs^2} \qquad (14)$$

Therefore, according to Expressions (13) and (14), the focal distance fcb of the second cylindrical lens CYb should be set in a manner to satisfy the condition ΔDip≈DOFs.

Figure 9:
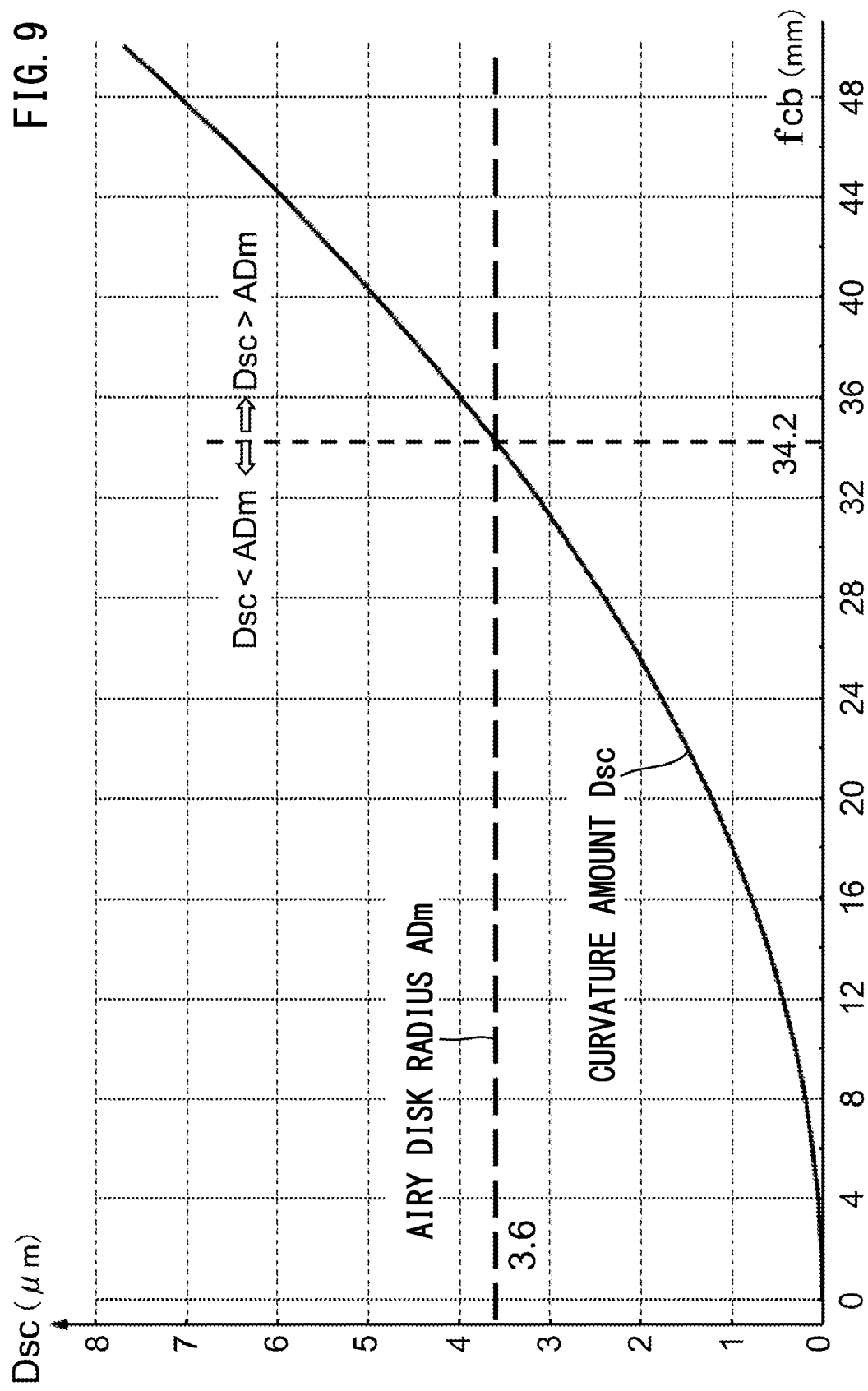
FIG. 9 is a graph showing a characteristic of the curvature amount Dsc and a characteristic of the Airy disk radius ADm in FIG. 5B calculated under conditions where the focal distance of the fθ lens system FT, the image plane side numerical aperture, and the wavelength of the beam LB are set according to an example, with the focal distance fcb of the second cylindrical lens CYb as a variable.

The following describes a detailed example of determining the focal distance fcb of the second cylindrical lens CYb, based on Expression (11) for obtaining the curvature amount Dsc corresponding to the magnitude of the sagittal coma aberration described above and Expression (12) representing the Airy disk radius ADm, while referencing the graph shown in FIG. 9. As an example, FIG. 9 is a graph showing a characteristic of the curvature amount Dsc calculated using Expression (11) and a characteristic of the Airy disk radius ADm calculated using Expression (12), with the focal distance fcb of the second cylindrical lens CYb as a variable, in a case where the focal distance ft of the fθ lens system FT is 100 mm, the image height Hy is 26 mm, the image plane side numerical aperture NAm in the main scanning direction and the image plane side numerical aperture NAs in the sub scanning direction are 0.06, and the actual central wavelength λo of the beam LB is 354.7 nm (less than or equal to a wavelength width of 60 μm), wherein the horizontal axis indicates the focal distance fcb (mm) and the vertical axis indicates values of each of the curvature amount Dsc (nm) and the Airy disk radius ADm (nm). In this case, the curvature amount Dsc calculated according to Expression (11) is a characteristic that becomes zero when the focal distance fcb is 0 mm and increases quadratically in accordance with an increase in the focal length fcb. On the other hand, since the values of each of the image plane side numerical aperture NAm and the wavelength λo are set, the Airy disk radius ADm calculated according to Expression (12) is a constant value of approximately 3.6 μm. In the case of the conditions described above, the focal distance fcb at the time when the curvature amount Dsc matches the Airy disk radius ADm is approximately 34.2 mm. Due to this, in the beam scanning apparatus that scans with the spot light SP in an image height range of 26 mm (maximum scanning range of 52 mm) along the surface to be scanned Po while converging the beam LB, for which the wavelength λo is approximately 355 nm in a state where the image plane side numerical apertures NAm and NAs are 0.06, to form the spot light SP using the fθ lens system FT in which the focal distance ft is 100 mm, if the focal distance fcb of the second cylindrical lens CYb provided as the tilt-correcting optical system is less than or equal to 34.2 mm, it is possible to reduce the sagittal coma aberration (curvature amount Dsc) in the imaging characteristic to a degree at which problems are not caused.

Figure 10:
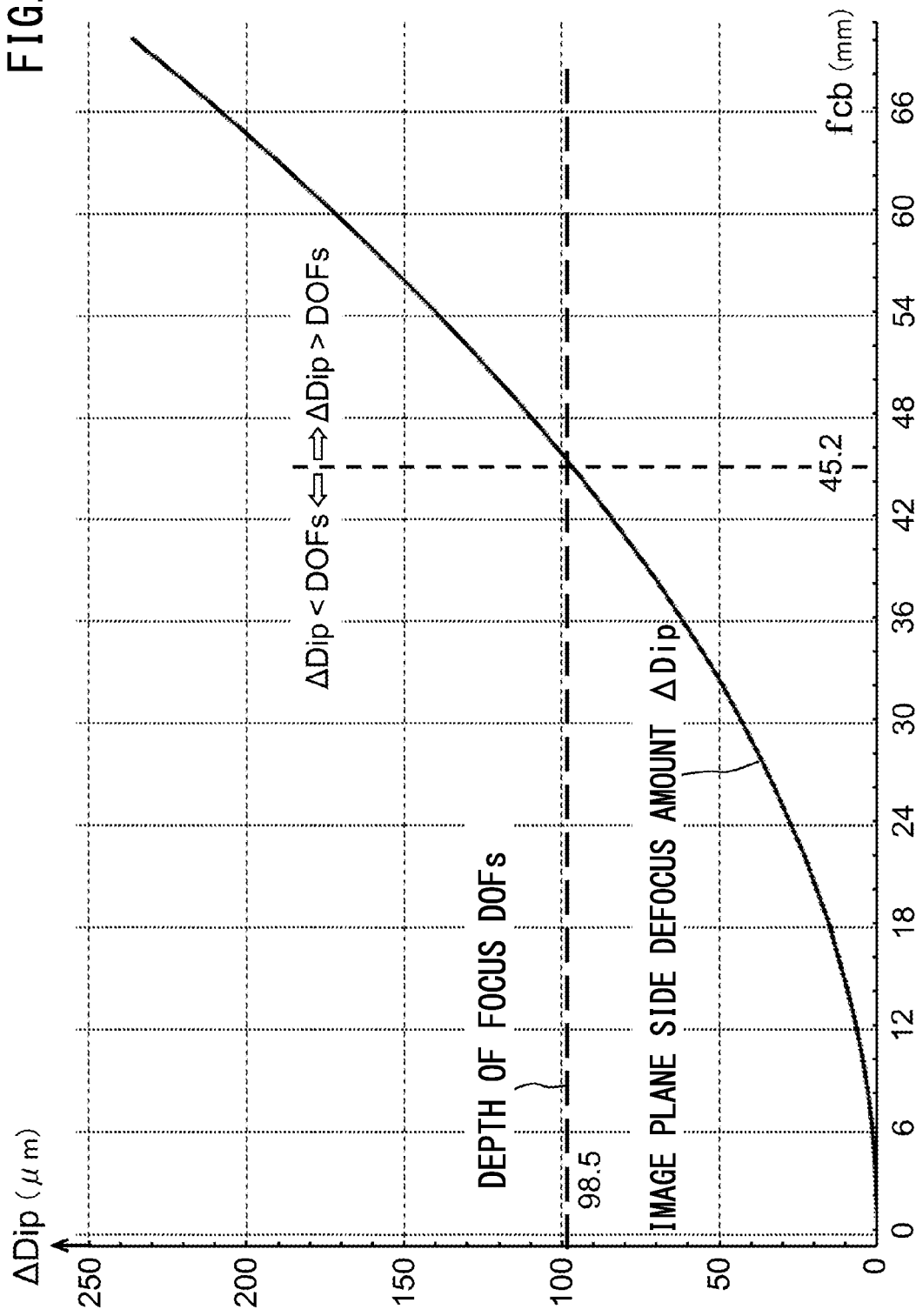
FIG. 10 is a graph showing a characteristic of the image plane side defocus amount Dip in the sub scanning direction and a characteristic of the depth of focus DOFs in the sub scanning direction calculated in a case where the object plane side defocus amount (light path length difference) ΔDop of the fθ lens system FT having the same conditions as set in FIG. 9 is a constant value, with the focal distance fcb of the second cylindrical lens CYb as a variable.

The following describes a detailed example of the image plane side defocus amount ΔDip caused by the defocus error on the reflective surface RPa side of the rotating polygon mirror PM described in FIGS. 6 and 7 above, using the graph of FIG. 10. FIG. 10 is a graph showing a characteristic of the image plane side defocus amount ΔDip in the sub scanning direction calculated using Expression (13) and a characteristic of the depth of focus DOFs in the sub scanning direction calculated using Expression (14), with the focal distance fcb of the second cylindrical lens CYb as a variable, in a case where the focal distance ft of the fθ lens system FT is 100 mm in the same manner as in the above conditions and the object plane side defocus amount (light path length difference) ΔDop is 0.482 mm, wherein the horizontal axis indicates the focal distance fcb (mm) and the vertical axis indicates the value of the image plane side defocus amount ΔDip (μm). In this case, the image plane side defocus amount ΔDip calculated according to Expression (13) is a characteristic that becomes zero when the focal distance fcb is 0 mm and increases quadratically in accordance with an increase in the focal length fcb. On the other hand, since the values of each of the image plane side numerical aperture NAs and the wavelength λo are set, the depth of focus DOFs calculated according to Expression (14) is a constant value of approximately 98.5 μm. In the case of the above conditions, the focal distance fcb at the time when the image plane side defocus amount ΔDip matches the depth of focus DOFs is approximately 45.2 mm. Due to this, in the beam scanning apparatus that scans with the spot light SP in an image height range of 26 mm (maximum scanning range of 52 mm) along the surface to be scanned Po while converging the beam LB, for which the wavelength λo is approximately 355 nm in a state where the image plane side numerical apertures NAm and NAs are 0.06, to form the spot light SP using the fθ lens system FT in which the focal distance ft is 100 mm, in a case where the object plane side defocus amount (light path length difference) £Dop is 0.482 mm, if the focal distance fcb of the second cylindrical lens CYb provided as the tilt-correcting optical system is less than or equal to 45.2 mm, it is possible to reduce the defocus error (ΔDip) in the imaging characteristic to a level at which problems are not caused.

Figure 11:
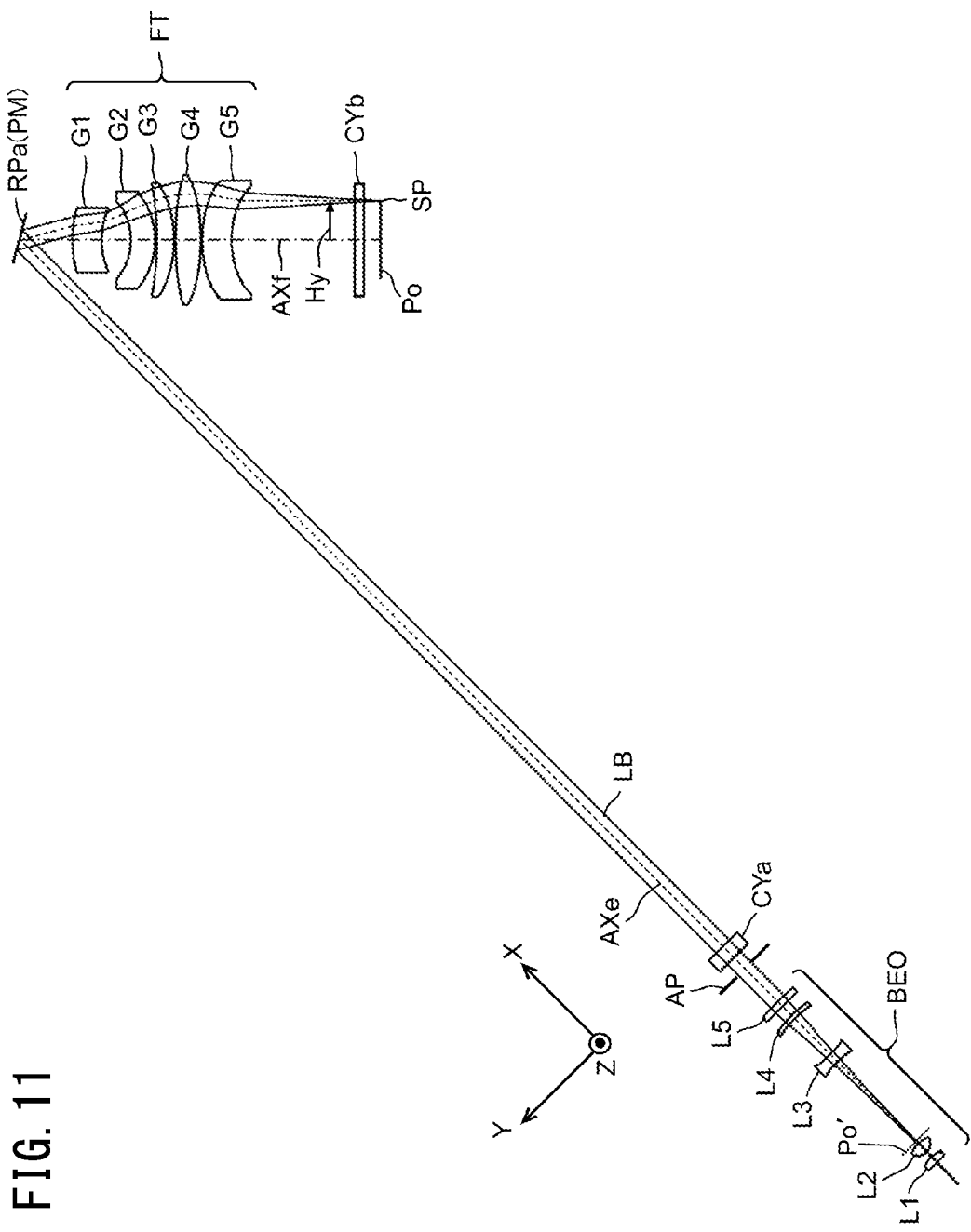
FIG. 11 shows a detailed optical configuration of the beam scanning apparatus according to the first embodiment expanded in the XY-pane (plane of the main scanning direction)
Figure 12B:
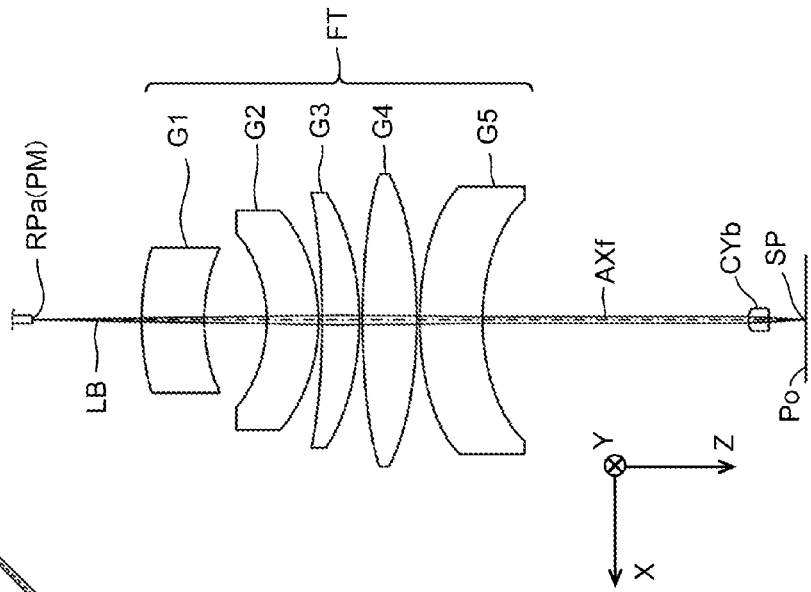
FIG. 12 shows an optical configuration of the beam scanning apparatus shown in FIG. 11 as seen in the XZ-plane (plane of the sub scanning direction)
Figure 12A:
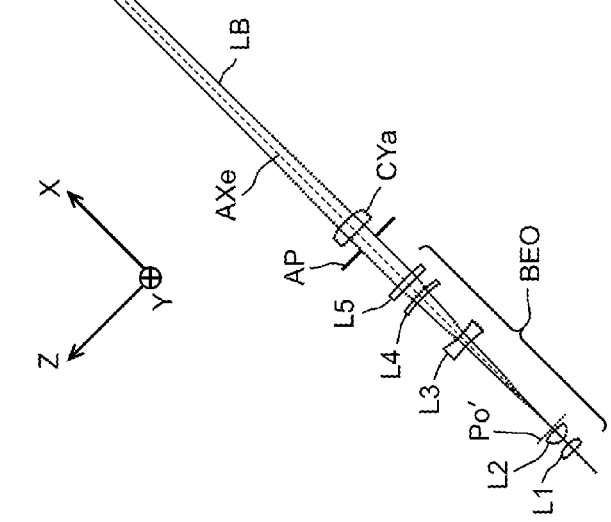

FIGS. 11, 12A, and 12B show an overall configuration of the beam scanning apparatus according to the present embodiment in a case where the focal distance fcb of the second cylindrical lens CYb is 15 mm, for example, in consideration of both the characteristic of the curvature amount Dsc (sagittal coma aberration) shown in FIG. 9 above and the characteristic of the defocus error ΔDip shown in FIG. 10, and the center wavelength λo of the beam LB is 354.7 nm (wavelength width less than or equal to 60 μm), the focal distance ft of the fθ lens system FT is 100 mm, the image plane side numerical apertures NAm and NAs are 0.06, the maximum value of the image height Hy is 26 mm, and the object plane side defocus amount (light path length difference) ΔDop is 0.482 mm. FIG. 11 shows a detailed optical configuration of the beam scanning apparatus according to the present embodiment in an expanded state as seen in the XY-plane (plane in the main scanning direction), and FIG. 12 shows an optical configuration of the beam scanning apparatus of FIG. 11 as seen in the XZ-plane (plane in the sub scanning direction). Here, FIG. 12A shows an optical configuration up to the reflective surface RPa of the rotating polygon mirror PM of the beam scanning apparatus according to the present embodiment, and FIG. 12B shows an optical configuration from the reflective surface RPa of the rotating polygon mirror PM of the beam scanning apparatus to the surface to be scanned (surface of the drawing target) Po according to the present embodiment. Furthermore, FIG. 13 is a data table showing examples of numerical value conditions and the arrangement relationships among each optical component (lenses and reflective surfaces) in the optical configuration shown in FIGS. 11, 12A, and 12B, and the lens material is quartz, which has a high transmittance for the wavelength of the beam LB. In the data table of FIG. 13, the sign of the reference numerals for the curvature radius and the intervals between lens surfaces are shown being inverted between the front and rear of the reflective surface RPa of the rotating polygon mirror PM.

In FIGS. 11, 12A, and 12B, the beam LB that has been intensity-modulated (ON/OFF) in response to drawing data emitted from a light source apparatus (not shown in the drawings) is incident to a beam expander system BEO with an enlargement magnification rate of 24 times. The beam LB incident to the beam expander system BEO is monochromatic light with a wavelength of 354.7 nm, and is a parallel light flux with an unpolarized Gaussian distribution or a distribution similar to an unpolarized Gaussian distribution in which the intensity at a position 0.25 mm from the optical axis AXe is $1/e^2$ of the peak intensity (effective beam diameter of 0.5 mm). The beam expander system BEO is formed by five spherical lenses L1 to L5 arranged along the optical axis AXe, and expands the beam LB incident thereto to become a parallel light flux with an effective diameter of 12 mm (1/e² intensity). After the beam LB has been condensed in a manner to form the beam waist on the focal point surface Po' immediately behind the convex lens L2, due to the first two convex lenses L1 and L2 of the beam expander system BEO, this beam LB diverges and becomes incident to the concave lens L3, and also passes through the meniscus-shaped lens L4 and the convex lens L5 to become an expanded parallel light flux and reaches the aperture stop AP. The circular aperture diameter of the aperture stop AP is preferably equal to the pupil diameter of the fθ lens system FT, and therefore, when the image plane side numerical apertures NAm and NAs are 0.06 and the focal point ft of the fθ lens system FT is 100 mm, the aperture diameter (diameter) φap of the aperture stop AP is set to 12 mm. The diameter of the intensity distribution of the beam LB emitted from the beam expander system BEO is set such that the diameter at which the intensity of the skirt portion is 1/e² becomes 12 mm, and the light distribution of the skirt portion where the intensity is less than or equal to 1/e² is blocked by the aperture stop AP. At this time, the loss rate of the light blocked by the aperture stop AP is approximately 13.5%.

In the present embodiment, since the image plane side numerical aperture NAm in the main scanning direction and the image plane side numerical aperture NAs in the sub scanning direction of the beam LB projected onto the surface to be scanned Po are equal, the first cylindrical lens CYa (focal distance fca), the second cylindrical lens CYb (focal distance fcb), and the fθ lens system FT (focal distance ft) formed as the optical system that corrects the tilt of the reflective surface RPa of the rotating polygon mirror PM are set to have the relationship shown below in Expression (15).

$$fca \cdot fcb = ft^2 \qquad (15)$$

Furthermore, when the image plane side numerical aperture of the LB is NA (=NAm=NAs), the circular aperture (diameter) φap of the aperture stop AP is set in a manner to realize the relationship shown in Expression (16) below.

$$\varphi ap = 2 \cdot NA \cdot ft = 2 \cdot NA \cdot \frac{fca \cdot fcb}{ft} \qquad (16)$$

The single (single-plate) first cylindrical lens CYa, which has refractive power only in the sub scanning direction and has a focal distance fca of 666.7 mm based on the relationship of Expression (15), is provided at a position 10 mm to the rear of the aperture stop AP, and the reflective surface RPa of the rotating polygon mirror PM is provided at a position of the rear-side focal point of the first cylindrical lens CYa. The incidence surface and the emission surface of the first cylindrical lens CYa are each formed to have an infinite curvature radius in the main scanning direction and a finite curvature radius in the sub scanning direction. Due to this, the beam LB that has transparently passed through the circular aperture of the aperture stop AP as a parallel light flux is condensed on the reflective surface RPa of the polygon mirror PM in the plane (XZ-plane in FIGS. 11 and 12B) of the sub scanning direction by the first cylindrical lens CYa and becomes incident to the reflective surface RPa of the rotating polygon mirror PM as a parallel light flux in the plane (XY-plane in FIGS. 11 and 12B) of the main scanning direction. The beam LB that has been reflected by the reflective surface RPa of the rotating polygon mirror PM is incident to the telecentric fθ lens system FT made from the five spherical lenses G1 to G5, at an angle corresponding to the angle of the currently rotating reflective surface RPa of the rotating polygon mirror PM. The reflective surface RPa of the rotating polygon mirror PM is set at a position of the front-side focal point of the fθ lens system FT.

In the present embodiment, the optical axis AXe of the optical system in front of the rotating polygon mirror PM, which is formed by the beam expander system BEO, the aperture stop AP, and the first cylindrical lens CYa, and the optical axis AXf of the optical system to the rear of the rotating polygon mirror PM, which is formed by the fθ lens system FT and the second cylindrical lens CYb, are set to intersect with an angle of π/4 rad(45°) in the plane (XY-plane) of the main scanning direction, as shown in FIG. 11. Furthermore, the shape of the rotating polygon mirror PM in the present embodiment is a regular octagon in which the diameter of an inscribed circle thereof is 50.813 mm and is set such that, when the rotating polygon mirror PM is rotated by 0.13 rad (=0.13×180°/π≈7.448° such that the reflective surface RPa is also inclined by 0.13 rad, from a state (referred to as a coaxial state) in which the main light ray (center light ray) of the beam LB reflected by the reflective surface RPa of the rotating polygon mirror PM has become coaxial with the optical axis AXf of the fθ lens system FT, the beam LB is deflected such that the main light ray (center light ray) of the beam LB passes through a position of the maximum image height Hymax of the fθ lens system FT. Accordingly, the incidence angle of the beam LB to the fθ lens system FT (inclination angle of the main light ray of the beam LB relative to the optical axis AXf) when the spot light SP is projected at the position of the maximum image height Hymax of the fθlens system FT is 0.26 rad (≈14.696°). In other words, the angle range of the reflective surface RPa of the rotating polygon mirror PM (rotational angle range of the rotating polygon mirror PM) for scanning with the spot light SP from the position of the maximum image height+ Hymax to the position of the maximum image height –Hymax of the fθ lens system FT is a range from +0.13 rad to –0.13 rad, when the angle position at which the coaxial state is realized is 0 rad. Since the intersection angle between the optical axis AXe and the optical axis AXf in the plane of the main scanning direction is 45°, the angular position (0 rad) of the reflective surface RPa of the rotating polygon mirror PM at which the coaxial state is realized occurs when the normal line of the reflective surface RPa is at an angle of 22.5° (=π/8 rad) relative to each of the optical axis AXe and the optical axis AXf.

Since the reflective surface RPa of the polygon mirror PM is arranged at the front-side focal point position of the fθ lens system FT, the beam LB reflected by the reflective surface RPa, immediately after having transparently passed through the fθ lens system FT, becomes converged light (NAm=0.06) that is telecentric to the image surface (surface to be scanned Po) in the plane of the main scanning direction, and is converted into a parallel light flux in the plane of the sub scanning direction. While the rotating polygon mirror PM (reflective surface RPa) rotates within an angle range from +0.13 rad to –0.13 rad, in which the angular position (0 rad) at which the coaxial state is realized is sandwiched, the irradiation region of the reflective surface RPa that is irradiated by the beam LB moves in the main scanning direction along the reflective surface RPa. Since the center of the irradiation range of the irradiation region in the main scanning direction accompanying this movement approximately matches the center of the dimensional range of the reflective surface RPa in the main scanning direction, in the present embodiment, the rotating polygon mirror PM is arranged as annotated in the data table of FIG. 13, such that the main light ray (center light ray) of the beam LB radiated onto the reflective surface RPa of the rotating polygon mirror PM is at the angular position (0 rad) at which the coaxial state is realized is shifted by approximately 0.45 mm in a direction along the reflective surface RPa relative to the center of the dimensional range of the reflective surface RPa in the main scanning direction. Furthermore, the offset of −25.4065 mm in the optical axis direction annotated in the data table of FIG. 13 corresponds to a radius that is half of the diameter of 50.813 mm of the inscribed circle of the rotating polygon mirror PM, and this means that the reflective surface RPa and the rotational center axis AXp of the rotating polygon mirror PM are offset by −25.4065 mm in the normal line direction of the reflective surface RPa.

The fθ lens system FT is formed by the five lenses G1 to G5 arranged sandwiching a prescribed spatial interval, as shown in FIGS. 1 and 11 to 13, and when viewed from the rotating polygon mirror PM side (object plane side), the lens G1 is formed by a meniscus-shaped negative lens that is convex on the object plane side, the lens G2 is a meniscus-shaped negative lens that is concave on the object plane side, the lens G3 is a meniscus-shaped positive lens that is concave on the object plane side, the lens G4 is a positive lens that is convex on both sides, and the lens G5 is a meniscus-shaped positive lens that is convex on the object plane side. Furthermore, in the plane (XY-plane in FIG. 11) including the main scanning direction such as shown in FIG. 11, the beam LB (parallel state) that is incident after being reflected by the reflective surface RPa of the rotating polygon mirror PM is caused to be in a slightly divergent state by the lenses G1 and G2, and after entering a state in which the beam width has the greatest spread near the incidence surface of the lens G4, enters a convergent state due to the positive refractive power of the lenses G4 and G5, and is condensed as the spot light SP (beam waist) at the position of the surface to be scanned Po. The incidence surface and emission surface of each of the lenses G1 to G5 are both spherical, but in order to further improve the aberration characteristics, the incidence surface or emission surface of a specified lens may be non-spherical.

The beam LB that has transparently passed through the fθ lens system FT becomes incident to the single (single-plate) second cylindrical lens CYb, which has refractive power only in the sub scanning direction and a focal distance fcb of 15 mm, and is converted into convergent light (Nas=0.06) that is telecentric to the image surface (surface to be scanned Po) in the plane of the sub scanning direction. The incidence surface and the emission surface of the second cylindrical lens CYb are each configured to have an infinite curvature radius in the main scanning direction and a finite curvature radius in the sub scanning direction. Accordingly, the second cylindrical lens CYb functions as a simple parallel flat plate (refractive power of zero) for the main scanning direction, and beam LB is converted into the telecentric convergent light (NAm=0.06) solely by the focusing effect (refractive power) of the fθ lens system FT in the main scanning direction. The position of the second cylindrical lens CYb is set to a position at which the focus position in the main scanning direction of the beam LB after the beam LB has transparently passed through the second cylindrical lens CYb matches the focus position if this beam LB in the sub scanning direction, and this focus position is in the image plane (surface to be scanned Po).

Figure 14A:
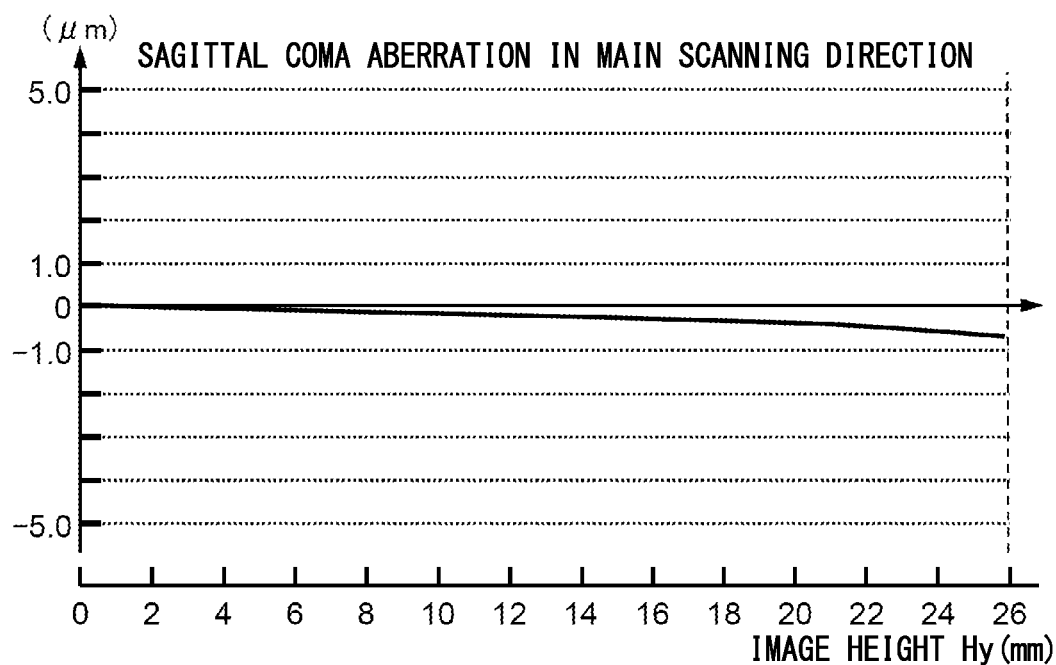
FIG. 14 is a graph showing simulation results of the sagittal coma aberration characteristic in the beam scanning apparatus according to the first embodiment.
Figure 14B:
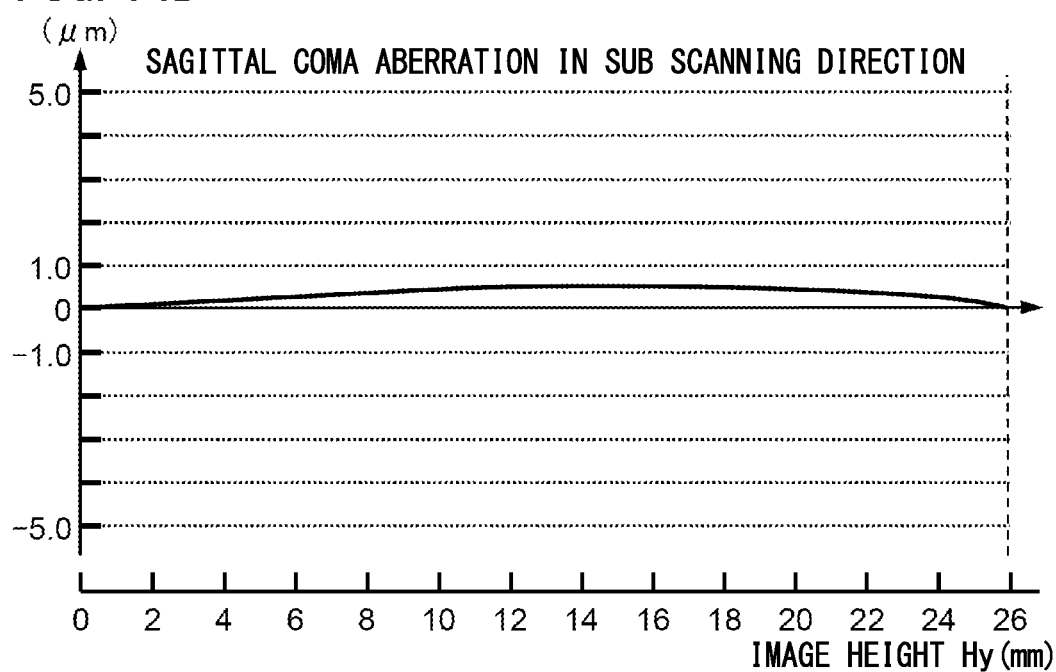

As described above, in the beam scanning apparatus (FIGS. 11 to 13) according to the present embodiment in which the focal distance fca of the first cylindrical lens CYa is 666.7 mm, the focal distance fcb of the second cylindrical lens CYb is 15 mm, the focal distance ft of the fθ lens system FT is 100 mm, the numerical apertures NAm and NAs of the beam LB (spot light SP) with a central wavelength λo of 354.7 nm on the surface to be scanned Po are 0.06, and the maximum image height Hymax is 26 mm, the sagittal coma aberration across the range of the image height Hy is reduced to a level at which problems are not caused in practical application. FIG. 14 is a graph showing simulation results of the sagittal coma aberration characteristic in the beam scanning apparatus according to the present embodiment, wherein FIG. 14A shows the sagittal coma aberration in the main scanning direction and FIG. 14B shows the sagittal coma aberration in the sub scanning direction. In both FIG. 14A and FIG. 14B, the horizontal axis indicates the image height Hy and the vertical axis indicates the sagittal coma aberration amount (calculated value). According to the simulation, the sagittal coma aberration is suppressed to be approximately less than or equal to 0.7 μm in each of the main scanning direction and the sub scanning direction, across the entire range (0 mm to ±26 mm) of the image height Hy. In particular, a trend of the sagittal coma aberration increasing to be a value greater than or equal to the theoretical (designed) diameter of the spot light SP as the image height Hy approaches the maximum image height Hymax (26 mm) is not observed.

Figure 15A:
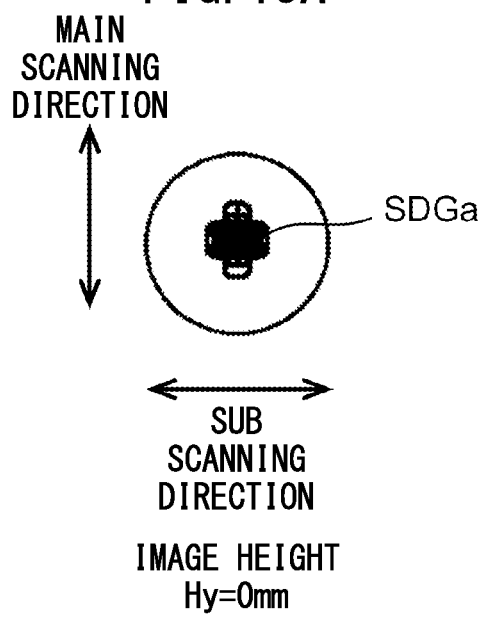
FIG. 15 is a spot diagram obtained through a simulation of spots of a beam condensed on the surface to be scanned by the beam scanning apparatus according to the first embodiment.
Figure 15B:
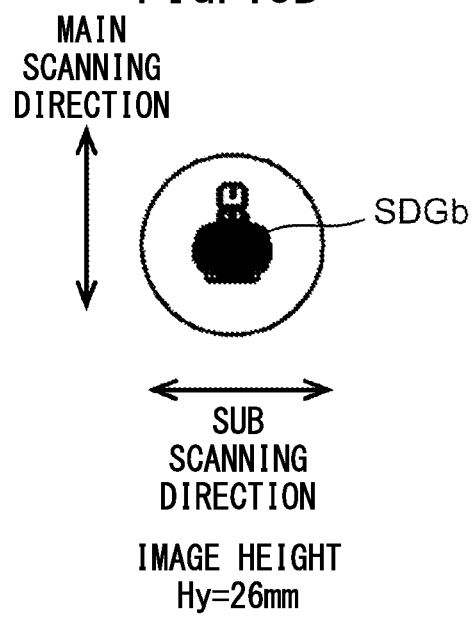

FIG. 15 shows a spot diagram obtained through a simulation that tracks a large number of light rays within the beam LB condensed on the surface to be scanned Po by the beam scanning apparatus (FIGS. 11 to 13) according to the present embodiment. FIG. 15A shows a spot diagram SDGa at an image height Hy of 0 mm (the position of the optical axis AXf of the fθ lens system FT) and FIG. 15B shows a spot diagram SDGb at an image height Hy of 26 mm (the position of the maximum image height Hymax), with the circle surrounding each of the diagrams SDGa and SDGb indicating a region with a size equivalent to the Airy disk (radius ADm 3.6 μm, diameter of 7.2 μm). In FIGS. 15A and 15B, the up-down direction in the plane of the drawing is the main scanning direction, and the left-right direction in the plane of the drawing is the sub scanning direction. In this way, according to the beam scanning apparatus (FIGS. 11 to 13) of the present embodiment, the spread width of each spot diagram SDGa and SDGb is always the same as the radius ADm 3.6 μm) of the Airy disk according to the design, and it is understood that there is no significant difference in the spot light SP imaging performance between the center position where the image height Hy is 0 mm and the most peripheral position where the image height Hy is 26 mm. Accordingly, the resolution (fineness) of the pattern that can be drawn on the photosensitive substrate arranged at the surface to be scanned Po is the same at the center position and the most peripheral position, and it is possible to ensure a uniform resolution across the entire region in the main scanning direction.

Figure 16A:
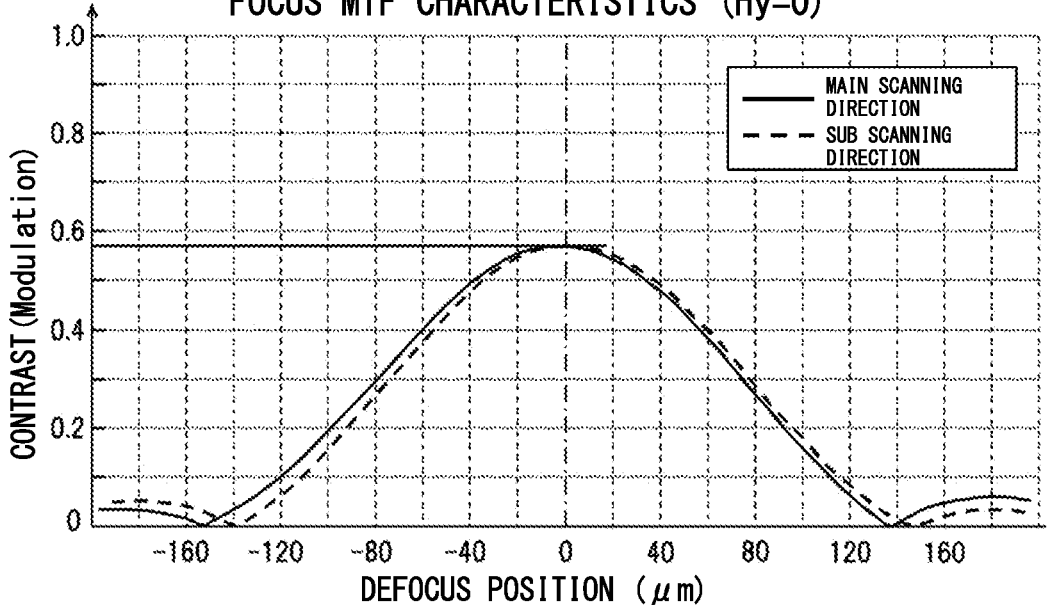
FIG. 16 is a graph showing focus MTF (transmission function and contrast) characteristics of the beam condensed on the surface to be scanned by the beam scanning apparatus according to the first embodiment.
Figure 16B:
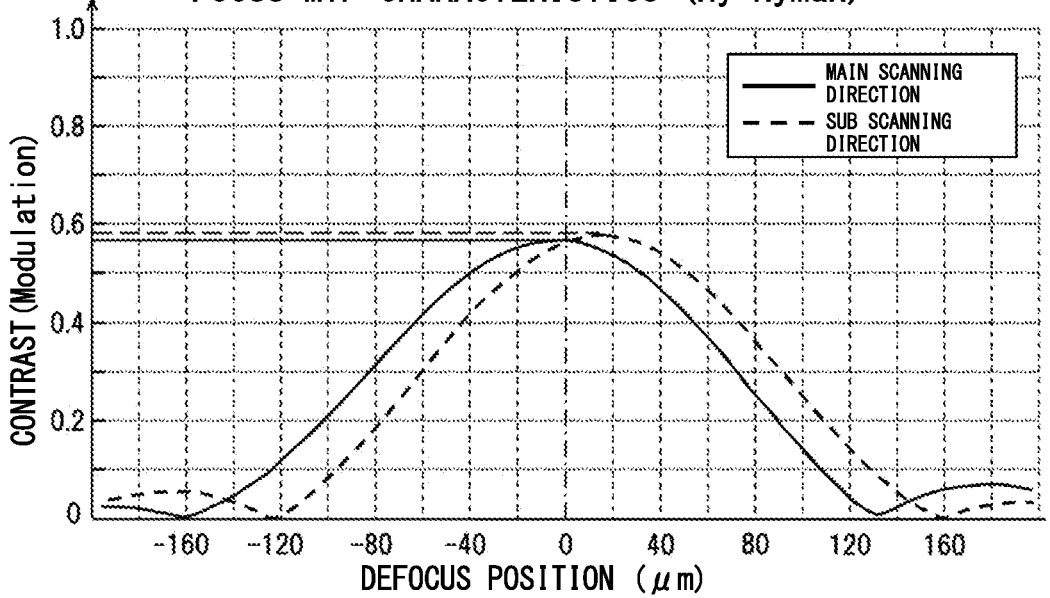

Furthermore, FIG. 16 shows focus MTF (transmission function and contrast) characteristics of the beam LB condensed on the surface to be scanned Po by the beam scanning apparatus (FIGS. 11 to 13) according to the present embodiment. FIG. 16A shows the focus MTF characteristics (125 cycles/mm) of the beam LB at an image height Hy of 0 mm (position of the optical axis AXf of the fθ lens system FT) and FIG. 16B shows the focus MTF characteristics (125 cycles/mm) of the beam LB at an image height Hy of 26 mm (position of the maximum image height Hymax), with the vertical axis in each drawing indicating the contrast value (0 to 1.0) and the horizontal axis in each drawing indicating the defocus position (μm). Furthermore, the solid-line focus MTF curves in FIGS. 16A and 16B indicate characteristics in the main scanning direction, and the dashed-line MTF curves indicate characteristics in the sub scanning direction. As shown in FIGS. 16A and 16B, according to the beam scanning apparatus (FIGS. 11 to 13) of the present embodiment, the shape of the focus MTF curve (solid line) in the main scanning direction and the shape of the focus MTF curve (dashed line) in the sub scanning direction exhibit almost no differences between the center position at which the image height Hy is 0 mm and the most peripheral position at which the image height Hy is Hymax (26 mm), and the peak values in the contrast are also approximately the same. As shown in FIG. 16B, at the most peripheral position where the image height Hy is Hymax (26 mm), there is a slight difference between the defocus position at which the focus MTF curve (solid line) in the main scanning direction reaches the peak value and the defocus position at which the focus MTF curve (dashed line) in the sub scanning direction reaches the peak value, but this difference is within a range that does not cause problems in practical application. As described above, according to the beam scanning apparatus (FIGS. 11 To 13) of the present embodiment, from the focus MTF characteristics as well, it is understood that the aberration at the most peripheral position where the image height Hy is Hymax (26 mm) is sufficiently reduced.

The reason that the shapes of the focus MTF curves (solid line and dashed line) near the center position shown in FIG. 16A are the same as the shapes of the focus MTF curves (solid line and dashed line) near the peripheral position shown in FIG. 16B is that the sagittal coma aberration is suppressed to be sufficiently small, as described in FIGS. 9, 14A, and 14B. Furthermore, the reason that the defocus position at which the focus MTF curve (solid line) in the main scanning direction reaches the peak and the defocus position at which the focus MTF curve (dashed line) in the sub scanning direction reaches the peak are approximately the same is that the image plane side defocus amount ΔDip is suppressed to be sufficiently small relative to the depth of focus DOFs by reducing the focal distance fcb of the second cylindrical lens CYb, as described in FIG. 10.

[Configuration and Optical Performance of a Comparative Example]

According to the present embodiment described above, in the tilt-correcting optical system (cylindrical lenses CYa and CYb) of the beam scanning apparatus using the rotating polygon mirror PM and the fθ lens system FT (scanning optical system), it is possible to set a favorable range for the focal distance fcb of the second cylindrical lens CYb in order to reduce, to a level that does not cause problems in actual application, the sagittal coma aberration (corresponding to the curvature amount Dsc described in FIG. 9) in the main scanning direction of the spot light SP projected into the surface to be scanned Po (image plane) and the focus error (corresponding to the image plane side defocus amount ΔDip described in FIG. 10) at each image height Hy on the surface to be scanned Po (image plane), while maintaining a practical working distance. For the sake of comparison, the following describes a comparative example of a case in which the focal distance fcb of the second cylindrical lens CYb is set to 75 mm, which is greater than the value of 15 mm set in the first embodiment, while referencing FIGS. 17A to 17C and 18.

In the same manner as in the first embodiment, in a case where the image plane side numerical aperture NAm in the main scanning direction and the image plane side numerical aperture NAs in the sub scanning direction of the beam LB projected onto the surface to be scanned Po are set to be equal, the focal distance fca of the first cylindrical lens CYa, the focal distance fcb of the second cylindrical lens CYb, and the focal distance ft of the fθ lens system FT are set to have the relationship shown in Expression (15) above, and therefore, when the focal distance ft of the fθ lens system FT of the comparative example is set to 100 mm, which is the same as in the first embodiment, the focal distance fca of the first cylindrical lens CYa becomes 133.3 mm, in correspondence with the focal distance fcb of the second cylindrical lens CYb being 75 mm.

Figures 17A, 17B, 17C:
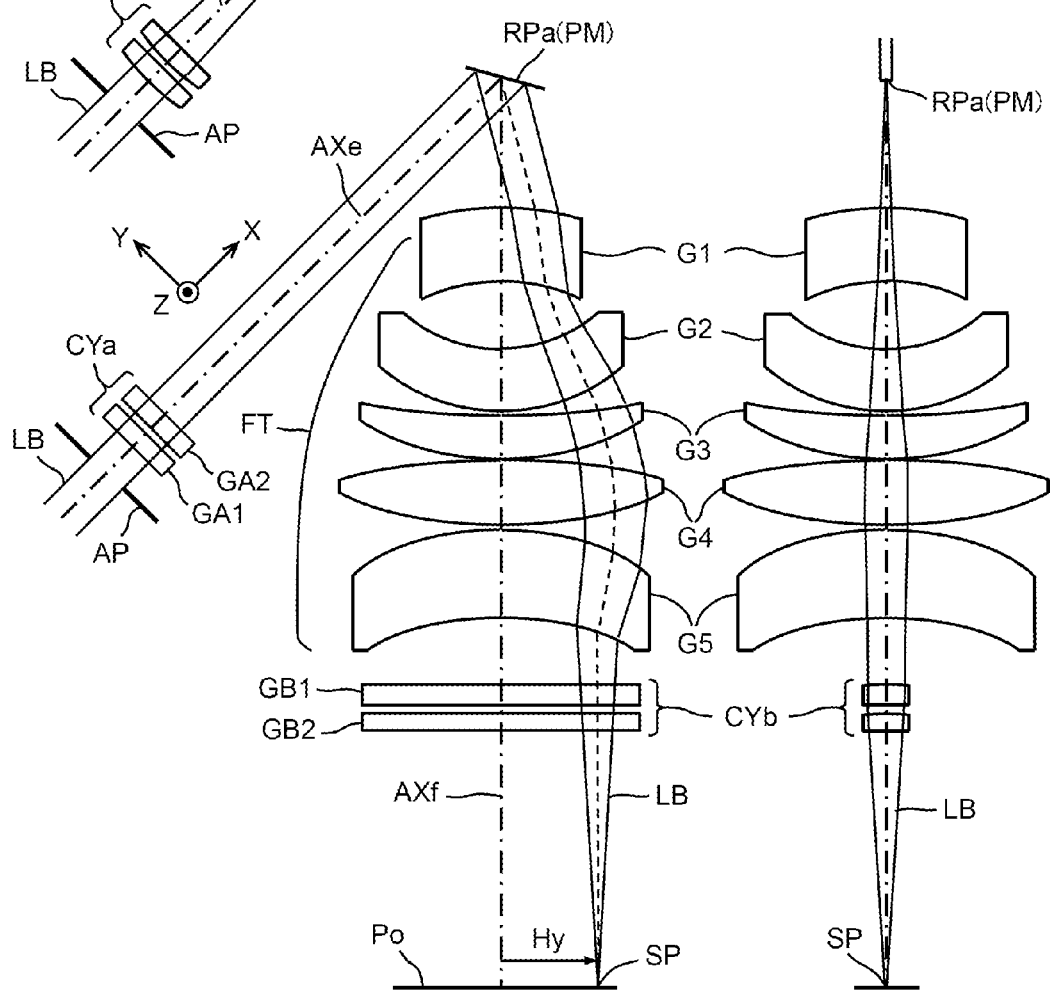
FIG. 17 shows the optical configuration of the entire beam scanning apparatus according to a comparative example set to compare the performance of the beam scanning apparatus according to the first embodiment.

FIGS. 17A to 17C show the overall optical configuration of the beam scanning apparatus according to the comparative example and FIG. 18 is a lens data table showing an example of numerical value conditions and the arrangement relationship of each of the optical components (lenses and reflective surfaces) in the optical configuration of the comparative example, wherein the sign of the reference numerals for the curvature radius and the intervals between lens surfaces are shown being inverted between the front and rear of the reflective surface RPa of the rotating polygon mirror PM, in the same manner as in FIG. 13 above. In FIG. 17, the beam expander system BEO having the same configuration as in FIGS. 11, 12A, and 12B is provided in front of the aperture stop AP, but here, the beam expander system BEO is omitted from the drawings and the optical arrangement following the aperture stop AP is shown. Furthermore, FIG. 17A shows the optical configuration of the beam scanning apparatus of the comparative example from the aperture stop AP to the reflective surface RPa of the rotating polygon mirror PM, as seen in an expanded state in the XZ-plane (in the plane of the sin scanning direction), and FIG. 17B shows the optical configuration of the beam scanning apparatus of the comparative example from the aperture stop AP to the surface to be scanned Po, as seen in an expanded state in the XY-plane (in the plane of the main scanning direction), and FIG. 17C shows a detailed optical configuration of the beam scanning apparatus of the comparative example from the reflective surface RPa of the rotating polygon mirror PM to the surface to be scanned Po, as seen in the plane in the sub scanning direction. In this comparative example, as made clear from the data table of FIG. 18, the lens configuration (L1 to L5) of the beam expander system BEO, the aperture stop AP (aperture diameter of 12 mm), the rotating polygon mirror PM, and the lens configuration (G1 to G5) of the fθ lens system FT are basically the same as in the first embodiment (FIG. 13), with only some of the intervals between surfaces differing.

Furthermore, the first cylindrical lens CYa in the beam scanning apparatus of the comparative example is formed by two cylindrical lenses GA1 and GA2 made of quartz and combined such that the combined focal distance fca is 133.3 mm, and the second cylindrical lens CYb is formed by two cylindrical lenses GB1 and GB2 made of quartz and combined such that the combined focal distance fcb is 75 mm. The cylindrical lenses GA1, GA2, GB1, and GB2 are each formed as a parallel flat plate, and are each configured such that an incidence surface and emission surface for the beam LB each have a finite curvature radius (convex surface or concave surface) in the sub scanning direction. By causing the respective focal distances fca and fcb of the cylindrical lenses CYa and CYb to differ from those in the first embodiment in this way, as shown in FIG. 18, the interval between the surfaces of the first cylindrical lens CYa and the reflective surface RPa of the rotating polygon mirror PM is changed from 661.15 mm to 126.623 mm, the interval between the surfaces of the fθ lens system FT and the second cylindrical lens CYb is changed from 82.254 mm to 21.066 mm, and the interval between the surfaces of the second cylindrical lens CYb and the surface to be scanned Po is changed from 11.3751 mm to 67.8326 mm.

In the case of the comparative example, since the focal distance fcb of the second cylindrical lens CYb is 75 mm (greater than or equal to 34.2 mm), the second cylindrical lens CYb is arranged close to the fθ lens system FT, and therefore it is possible to increase the movement distance (working distance) to 67 mm while integrally supporting the second cylindrical lens CYb (GB1 and GB2) at the tip portion of the lens barrel of the fθ lens system FT. However, when the focal distance fcb of the second cylindrical lens CYb is 75 mm, the relationship between the curvature amount Dsc shown by Expression (11) and the Airy disk radius ADm shown in Expression (12) is within a range where Dsc >ADm such as shown in FIG. 9 above, and therefore the sagittal coma aberration becomes worse. Furthermore, as described in FIG. 10 above, even though the focal distance fcb of the second cylindrical lens CYb needed to reduce the image plane side defocus error ΔDip to a level at which there are no problems in the imaging characteristic is less than or equal to 45.2 mm, the focal distance fcb in the comparative example is 75 mm, and therefore the image plane side defocus error ΔDip is worsened to become greater than or equal to the depth of focus DOFs.

Figure 19A:
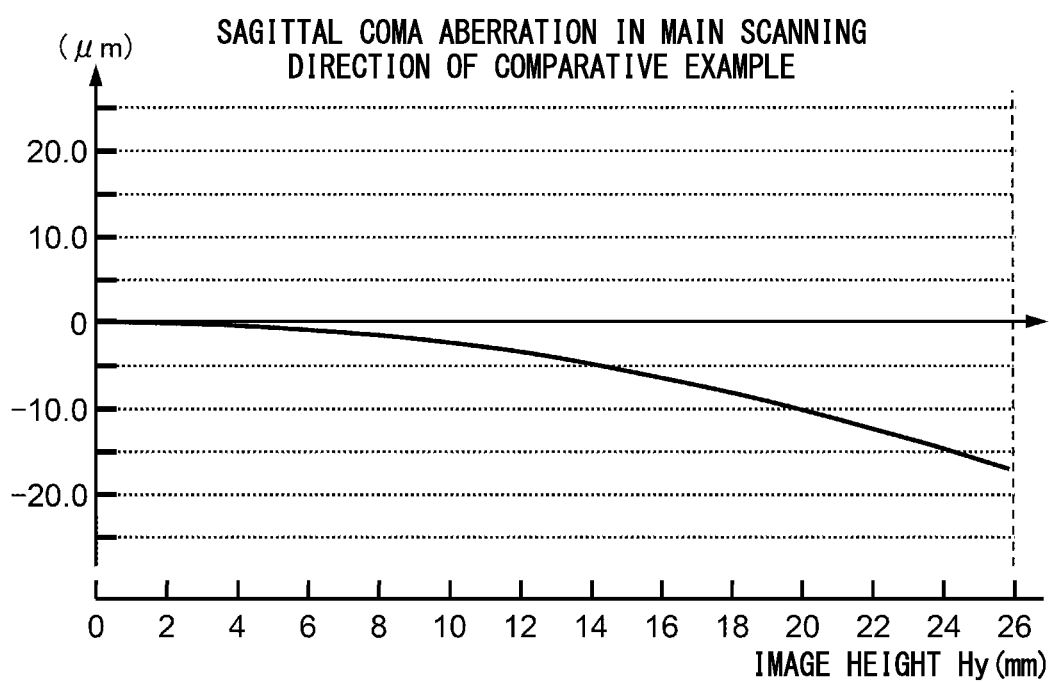
FIG. 19 is a graph of the sagittal coma aberration characteristic of the beam scanning apparatus according to the comparative example (FIGS. 17 and 18) simulated in the same manner as in FIG. 14.
Figure 19B:
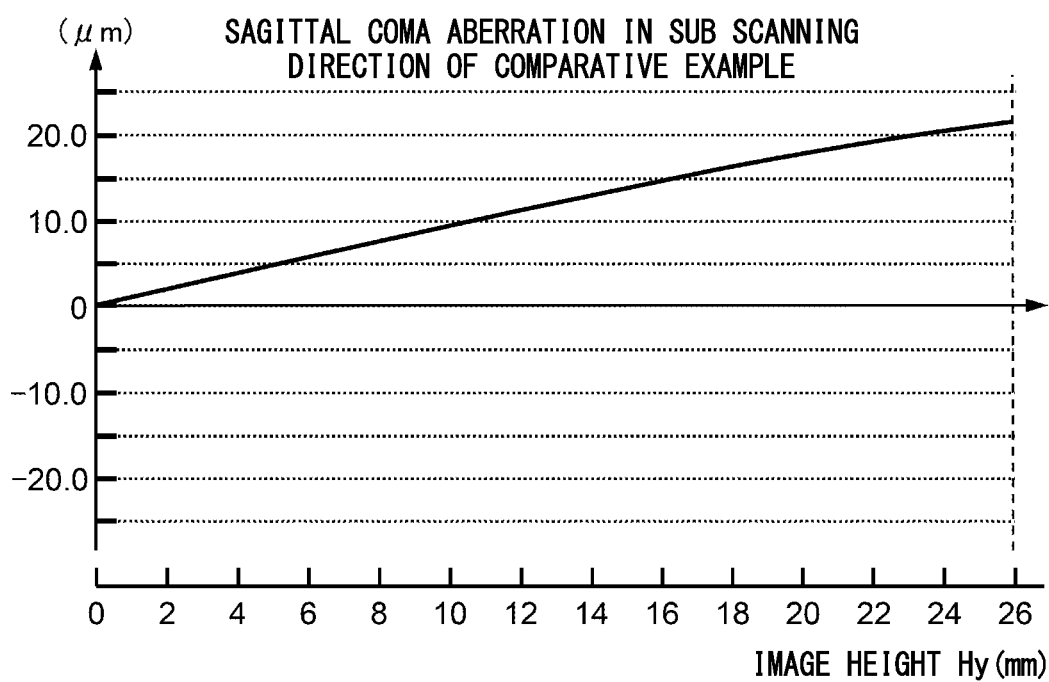

As described above, in the beam scanning apparatus (FIGS. 17A to 17C and 18) according to the comparative example in which the focal distance fca of the first cylindrical lens CYa is 133.3 mm, the focal distance fcb of the second cylindrical lens CYb is 75 mm, the focal distance ft of the fθ lens system FT is 100 mm, the image plane side numerical apertures NAm and NAs of the beam LB (spot light SP) with a central wavelength λo of 354.7 nm (wavelength width less than or equal to 60 μm) are 0.06, and the maximum image height Hymax is 26 mm, it is made clear from the simulation results that a sagittal coma aberration characteristic such as shown in FIGS. 19A and 19B occurs. FIGS. 19A and 19B are graphs of the sagittal coma aberration simulated in the same manner as in FIG. 14 above, wherein the horizontal axes indicate the image height Hy and the vertical axes indicate the sagittal coma aberration amount (calculated value). FIG. 19A shows the sagittal coma aberration characteristic in the main scanning direction in the comparative example, and FIG. 19B shows the sagittal coma aberration characteristic in the sub scanning direction in the comparative example. In both the main scanning direction and the sub scanning direction, the sagittal coma aberration increases monotonically according to the image height Hy, and the sagittal coma aberration amount at the position of the maximum image height Hymax (26 mm) has a significantly large value of approximately 20 μm in each of the main scanning direction and the sub scanning direction. This is caused by the curvature amount Dsc described in FIG. 5 above being larger than the Airy disk radius ADm in the main scanning direction and the image plane side defocus error ΔDip being larger than the depth of focus DOFs in the sub scanning direction. The sagittal coma aberration characteristic in the beam scanning apparatus according to the first embodiment shown in FIG. 14 is corrected to be less than or equal to 1/20 of the sagittal coma aberration characteristic in the comparative example of FIG. 19 above, thereby realizing an extremely good aberration characteristic.

Figure 20A:
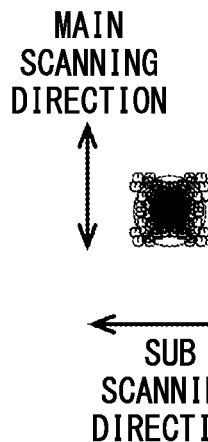
FIG. 20 is a spot diagram of the beam scanning apparatus according to the comparative example (FIGS. 17 and 18) simulated in the same manner as in FIG. 15.
Figure 20B:
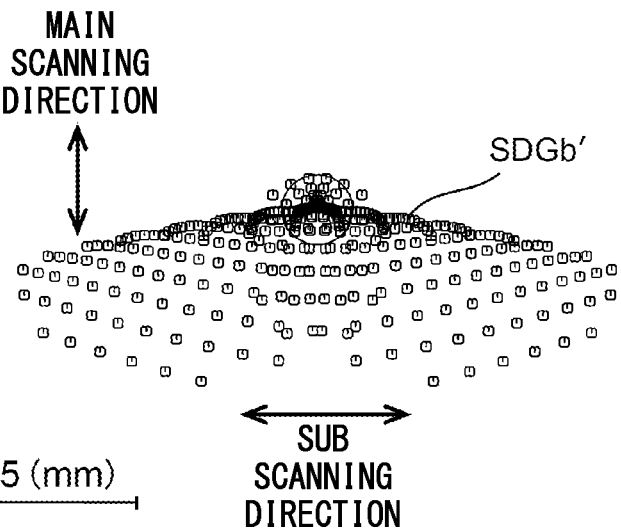

FIG. 20 shows a spot diagram obtained through a simulation that tracks a large number of light rays in the beam LB condensed on the surface to be scanned Po by the beam scanning apparatus (FIGS. 17A to 17C and 18) according to the comparative example. FIG. 20A shows a spot diagram SDGa' at an image height Hy of 0 mm (position of the optical axis AXf of the fθ lens system FT) and FIG. 20B shows a spot diagram SDGb' at an image height Hy of 26 mm (position of the maximum image height Hymax), wherein the circle drawn in each of the diagrams SDGa' and SDGb' indicates a region with a size (radius ADm≈3.6 μm, diameter of 7.2 μm) equivalent to the Airy disk. In FIGS. 20A and 20B, the up-down direction in the plane of the drawing is the main scanning direction, and the left-right direction in the plane of the drawing is the sub scanning direction. In this way, in the beam scanning apparatus according to the comparative example (FIGS. 17A to 17C and 18), the spread width of the spot diagram SDGa' at the position where the image height Hy is 0 mm falls within the diameter of the Airy disk (radius ADm≈3.6 μm), and the spread width of the spot diagram SDGb' at the most peripheral position where the image height Hy is 26 mm falls significantly outside the Airy disk (diameter≈7.2 μm), specifically with a distribution that spreads to at least 10 times the diameter of the Airy disk in the sub scanning direction. Accordingly, in the beam scanning apparatus according to the comparative example, the spot light SP imaging performance differs greatly between the center position where the image height Hy is 0 mm and the most peripheral position where the image height Hy is 26 mm, and the resolution (fineness) of the pattern that can be drawn on the photosensitive substrate arranged at the surface to be scanned Po differs greatly between the center position and the most peripheral position.

Figure 21A:
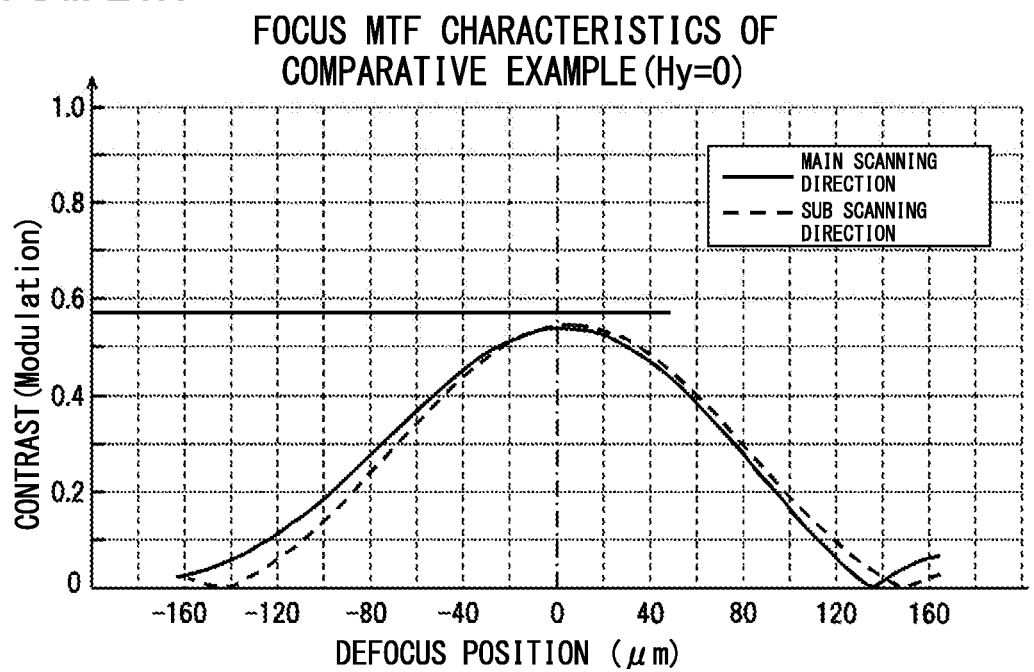
FIG. 21 is a graph showing focus MTF (transmission function and contrast) characteristics of the beam scanning apparatus according to the comparative example (FIGS. 17 and 18) simulated in the same manner as in FIG. 16.
Figure 21B:
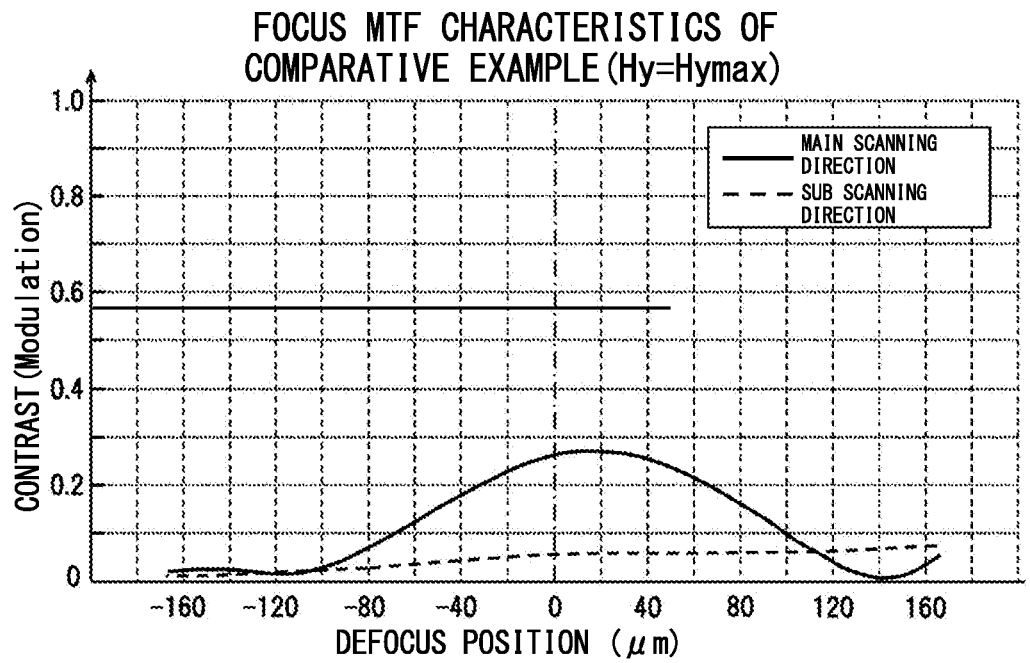

Furthermore, FIG. 21 shows a graph obtained by simulating, in the same manner as in FIGS. 16A and 16B above, the focus MTF (transmission function and contrast) characteristics of the beam LB condensed on the surface to be scanned Po by the beam scanning apparatus (FIGS. 17A to 17C and 18) according to the comparative example. FIG. 21A shows the focus MTF characteristic (125 cycles/mm) of the beam LB at an image height Hy of 0 mm (position of the optical axis AXf of the fθ lens system FT) and FIG. 21B shows the focus MTF characteristic (125 cycles/mm) of the beam LB at an image height Hy of 26 mm (position of the maximum image height Hymax), with the vertical axis in each drawing indicating the contrast value (0 to 1.0) and the horizontal axis in each drawing indicating the defocus position (μm). Furthermore, the solid-line focus MTF curves in FIGS. 21A and 21B indicate characteristics in the main scanning direction, and the dashed-line MTF curves indicate characteristics in the sub scanning direction.

As shown in FIG. 21A, in the beam scanning apparatus according to the comparative example, the shape of the focus MTF curve (solid line) in the main scanning direction at the center position where the image height Hy is 0 mm and the shape of the focus MTF curve (dashed line) in the sub scanning direction are always approximately the same, and the peak values and peak positions thereof are also approximately the same. However, as shown in FIG. 21B, at the most peripheral position where the image height Hy is Hymax (26 mm), there is a significant difference between the shape of the focus MTF curve (solid line) in the main scanning direction and the shape of the focus MTF curve (dashed line) in the sub scanning direction, and although the focus position where the peak is formed while the contrast value is low appears on the focus MTF curve (solid line) in the main scanning direction, a clear peak within a range of ±160 μm from the defocus position does not appear on the focus MTF curve (dashed line) in the sub scanning direction. From the above as well, it is understood that in the beam scanning apparatus according to the comparative example, the spot light SP imaging performance at the most peripheral position where the image height Hy is 26 mm is significantly worsened.

Second Embodiment

In the tilt-correcting optical apparatus in which the first cylindrical lens CYa is provided in front of the rotating polygon mirror PM and the second cylindrical lens CYb is provided to the rear of the fθ lens system FT, in a case where the image plane side numerical aperture NAm in the main scanning direction and the image plane side numerical aperture NAs in the sub scanning direction of the beam LB projected onto the surface to be scanned Po are set to be equal, as described in Expression (15) above, when the focal distance fcb of the second cylindrical lens CYb is shortened, it is necessary to lengthen the focal distance fca of the first cylindrical lens CYa in reverse proportion to this shortening. Therefore, the interval in the direction along the optical axis AXe (see FIGS. 11, 12A, and 12B) between the position of the first cylindrical lens CYa and the position of the reflective surface RPa and the rotating polygon mirror PM is increased, and the total length (light path length) of the optical system is increased. Furthermore, in a case where the first cylindrical lens CYa is formed by a single plate, lengthening this focal distance fca means increasing the curvature radii of the incidence surface and the emission surface of the first cylindrical lens CYa, which causes an increase in the machining difficulty. Therefore, as shown in the comparative example of FIGS. 17A to 17C, the first cylindrical lens CYa is formed by combining the two cylindrical lenses GA1 and GA2, and it is also possible to set the combined focal length fca to be long while keeping the curvature radii of the incidence surface and emission surface of each of the cylindrical lenses GA1 and GA2 within an easily machinable range. However, in such a case, work is necessary to make an adjustment causing the relative arrangement error between the two cylindrical lenses GA1 and GA2 (parallelism error between the generatrixes, positional error in the sub scanning direction, and the like) to be extremely small. Therefore, the first cylindrical lens CYa (second cylindrical lens CYb) is preferably formed as a single plate whenever possible.

Figures 22A, 22B:
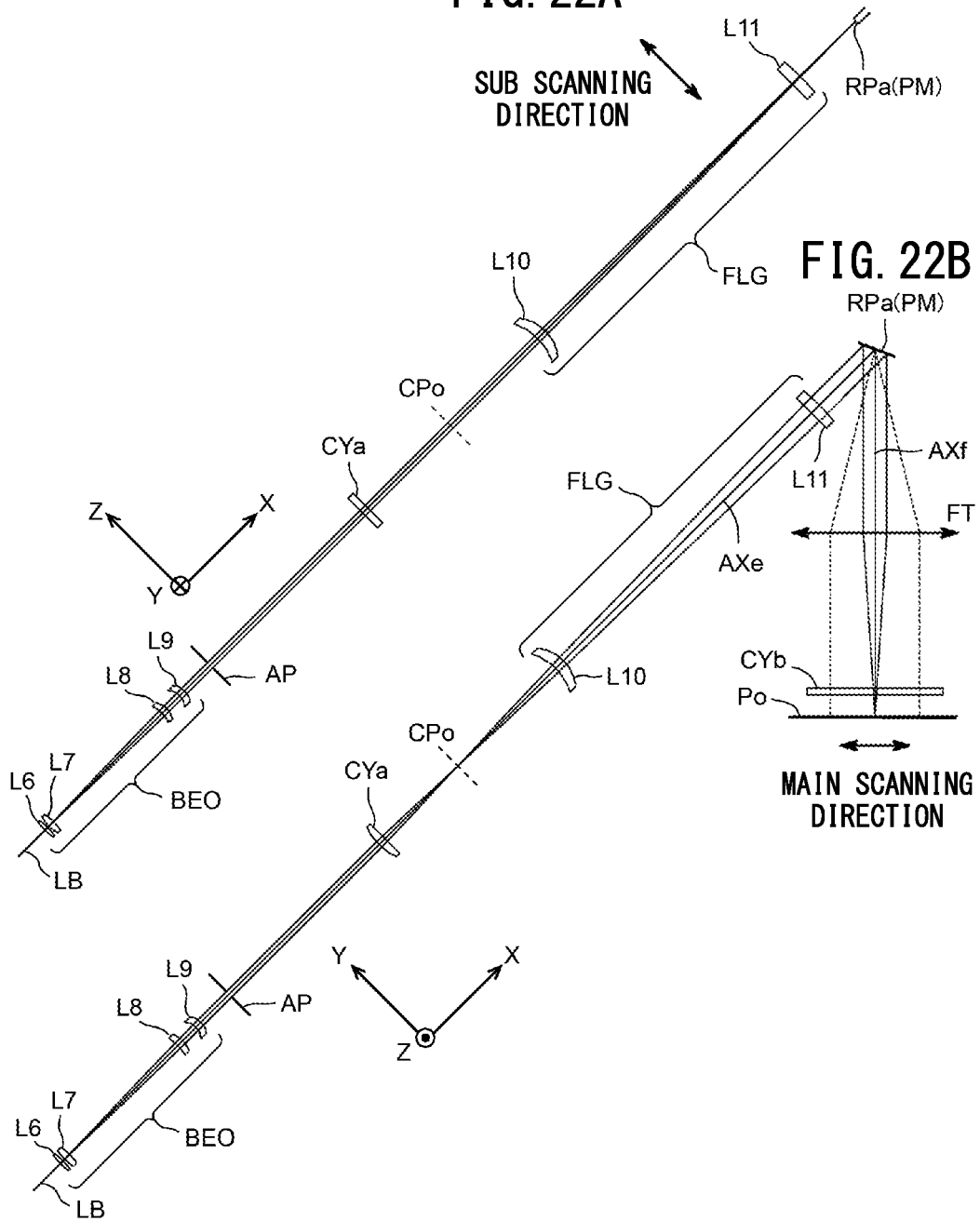
FIG. 22 shows the optical configuration of a beam scanning apparatus according to a second embodiment.

Therefore, in the present embodiment, the spherical aberration of the beam LB projected onto the surface to be scanned Po is reduced while also decreasing the length of the optical system from the single-plate first cylindrical lens CYa to the rotating polygon mirror PM, and therefore, as shown in FIGS. 22A and 22B, a spherical lens system (imaging system) FLG having a prescribed magnification rate is provided between the first cylindrical lens CYa and the rotating polygon mirror PM (reflective surface RPa). FIG. 22A shows the optical system of the beam scanning apparatus according to the second embodiment from the beam expander system BEO to the reflective surface RPa of the rotating polygon mirror PM, as seen in a plane (XZ-plane) in the sub scanning direction, and FIG. 22B shows the optical system of the beam scanning apparatus according to the second embodiment from the beam expander system BEO to the surface to be scanned Po, as seen in a plane (XY-plane) in the main scanning direction. FIG. 22A corresponds to FIG. 12A showing the optical configuration of the beam scanning apparatus according to the first embodiment above, and FIG. 22B corresponds to FIG. 11 showing the optical configuration of the beam scanning apparatus according to the first embodiment above. Furthermore, FIG. 23 is a table showing examples of data such as the curvature radius, intervals between surfaces, and the like of each optical member forming the beam scanning apparatus of FIGS. 22A and 22B, wherein the configuration of the fθ lens system FT is the same as the configuration shown in the data table of FIG. 13 (or FIG. 18) above, and therefore the numerical value data of each of the lenses G1 to G5 is omitted.

As shown in FIGS. 22A and 22B, the beam expander system BEO of the second embodiment converts the beam LB (parallel light flux in which the effective diameter is approximately 0.5 mm) incident thereto into a parallel light flux whose diameter has been enlarged by approximately 7 times by the four lenses L6 to L9. The incident beam LB becomes a divergent light flux due to the first two lenses L6 and L7 of the beam expander system BEO, the divergent beam LB is then converted by the following two lenses L8 and L9 into a parallel light flux in which the effective diameter (e.g. a circle with an intensity of 50% or an intensity of $1/e^2$ relative to the peak value) of the intensity distribution within the cross-sectional plane is approximately 3.5 mm, and this converted parallel light flux then reaches the aperture stop AP. The aperture stop AP has a circular aperture with a diameter of 3.5 mm, is arranged at a position where the interval from the surface of the final lens L9 of the beam expander system BEO is 25 mm, and blocks the light distribution of the skirt portion of the beam LB where the intensity is less than or equal to $1/e^2$. The beam LB (parallel light flux with an effective diameter of 3.5 mm) that has transparently passed through the aperture stop AP is incident to the plano-convex first cylindrical lens CYa with a focal distance fca of 58 mm arranged at a positioned distanced approximately 114.3 mm along the optical axis AXe. In the first embodiment or the comparative example above, the generatrix direction (direction in which the refractive power is zero) of the first cylindrical lens CYa is set to be the main scanning direction (Y direction), but in the present embodiment, this direction is rotated by 90 degrees around the optical axis AXe to be set to the sub scanning direction (Z direction). This is because the convergence direction of the beam LB is further rotated by 90 degrees around the optical axis AXe due to the following spherical lens system FLG.

Accordingly, as shown in FIG. 22B, when viewed in the plane (XY-plane) of the main scanning direction, the beam LB that has transparently passed through the first cylindrical lens CYa is condensed in the plane CPo at the position of the rear-side focal distance (58 mm), and then diverges and becomes incident to the spherical lens system FLG. On the other hand, as shown in FIG. 22A, when viewed in the plane (XZ-plane) of the sub scanning direction, the beam LB that has transparently passed through the optical axis CYa becomes incident to the following spherical lens system FLG as a parallel light flux. Therefore, in the plane CPo, the width of the beam LB in the main scanning direction (Y direction) is extremely small, and the intensity distribution is shaped as slits that extend with a length of approximately 3.5 mm in the sub scanning direction (Z direction). The spherical lens system FLG is formed by arranging two lenses, which are a meniscus lens L10 and a plano-convex lens L11, along the optical axis AXe with an interval of approximately 193.2 mm between the surfaces thereof. The focal distance fcg of the spherical lens system FLG, which is a composite system formed by combining the lenses L10 and L11, is set to 201.2 mm. The inter-surface interval between the first cylindrical lens CYa and the lens L10 is set to approximately 133.1 mm, based on the data table of FIG. 23, and therefore the inter-surface interval between the plane CPo and the lens L10 is set to approximately 75.1 mm (133.1 mm−fca).

As shown in FIG. 22B, when viewed in the plane (XY plane) of the main scanning direction, the beam LB that has passed through the spherical lens system FLG becomes a spread parallel light flux and is projected onto the reflective surface RPa of the rotating polygon mirror PM, and as shown in FIG. 22A, when viewed in the plane (XZ-plane) of the sub scanning direction, becomes a convergent light flux that is condensed on the reflective surface RPa of the rotating polygon mirror PM. Accordingly, the beam LB is condensed on the reflective surface RPa of the rotating polygon mirror PM with an intensity distribution of slit shapes extending in the main scanning direction in the plane (XY-plane) of the main scanning direction. Furthermore, as shown in FIG. 22B, when viewed in the plane (XY-plane) of the main scanning direction, the main scanning direction (Y direction) width (dimension) of the beam LB emitted by the spherical lens system FLG is enlarged to approximately 12 mm to become equal to the pupil diameter of the following fθ lens system FT, in the same manner as in the first embodiment.

In the same manner as in the first embodiment, the beam LB reflected by the reflective surface RPa of the rotating polygon mirror PM is condensed as the spot light SP on the surface to be scanned Po, through the fθ lens system FT having a focal distance ft of 100 mm and the plano-convex single-plate second cylindrical lens CYb having a focal distance fcb of 14.5 mm. In the present embodiment as well, the focal distance fcb (14.5 mm) of the second cylindrical lens CYb is set to be less than 34.2 mm (see FIG. 9), which is the boundary value for making the curvature amount Dsc less than the Airy disk radius ADm, and therefore it is possible to reduce the sagittal coma aberration to a level that does not cause problems in actual application and also to make the image plane side defocus error ΔDip sufficiently small relative to the depth of focus DOFs (see FIG. 10). Furthermore, the distance from the first cylindrical lens CYa to the reflective surface RPa of the rotating polygon mirror PM is approximately 661 mm in the first embodiment above, according to the data table of FIG. 13, but this distance is approximately 382 (≈133.1161+6+193.2397+6+43.3197) mm in the present embodiment, according to the data table of FIG. 23, showing that the present embodiment is a more compact optical system.

Furthermore, in the present embodiment, by using the first cylindrical lens CYa and the second cylindrical lens CYb whose refractive powers are orthogonal to each other as the tilt-correcting optical system, it is possible to reduce the spherical aberration occurring in the beam LB projected onto the surface to be scanned Po. The beam LB is condensed within an angle range of the image plane side numerical apertures NAm and NAs (e.g. 0.06) on the surface to be scanned Po. In this case, the spherical aberration occurring in the beam LB is an optical error whereby the focus point is shifted in the focus direction according to the angle of each light ray in this angle range relative to the normal line of the surface to be scanned Po (parallel to the center light ray of the beam LB). For example, the spherical aberration characteristic is the amount of the shift in the focus direction between the focus point where the light rays of the beam LB progressing at an angle at which the image plane side numerical aperture NA becomes 0.06 (the maximum numerical aperture) intersect and the focus point where the light rays of the beam LB progressing at an angle at which the image plane side numerical aperture NA becomes a smaller value intersect. In the first embodiment above, since the generatrix directions of the first cylindrical lens CYa and the second cylindrical lens CYb are each set to the main scanning direction, it is difficult to favorably correct the spherical aberration occurring in each of the first cylindrical lens CYa and the second cylindrical lens CYb, and the spherical aberration amount defined by the difference between the spherical aberration characteristic in the main scanning direction and the spherical aberration characteristic in the sub scanning direction of the beam LB occurs with a maximum of approximately tens of micrometers in the focus direction, according to the simulation.

Figure 24A:
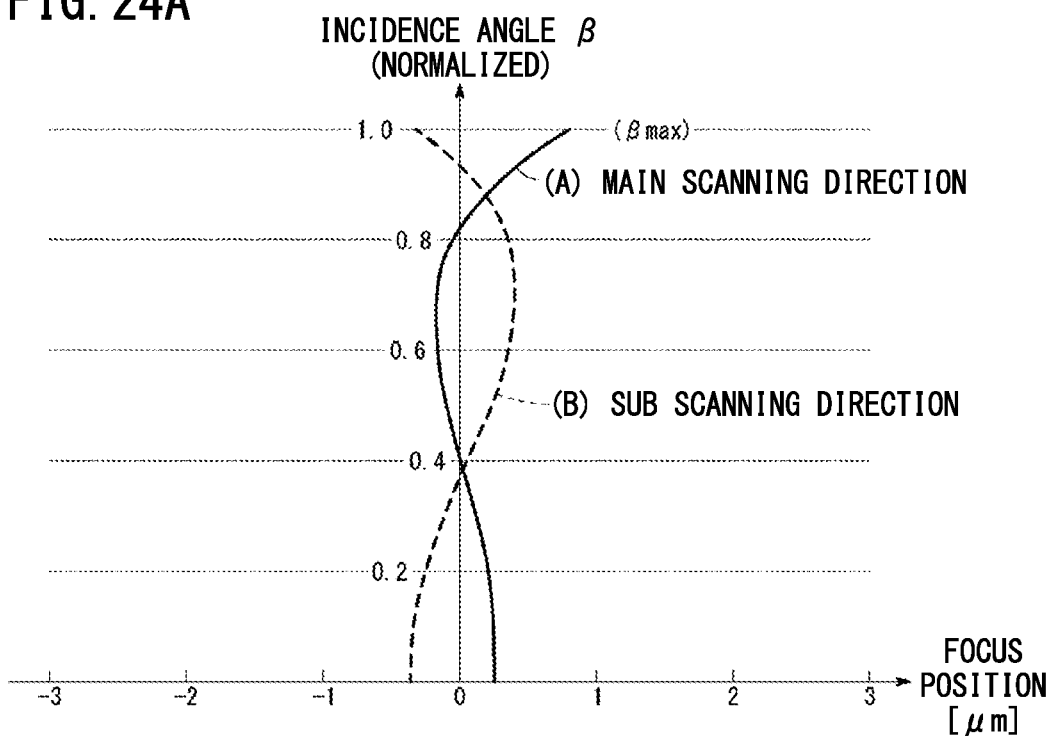
FIG. 24 is a graph showing a spherical aberration characteristic of a beam simulated based on the lens data table (FIG. 23) according to the second embodiment.
Figure 24B:
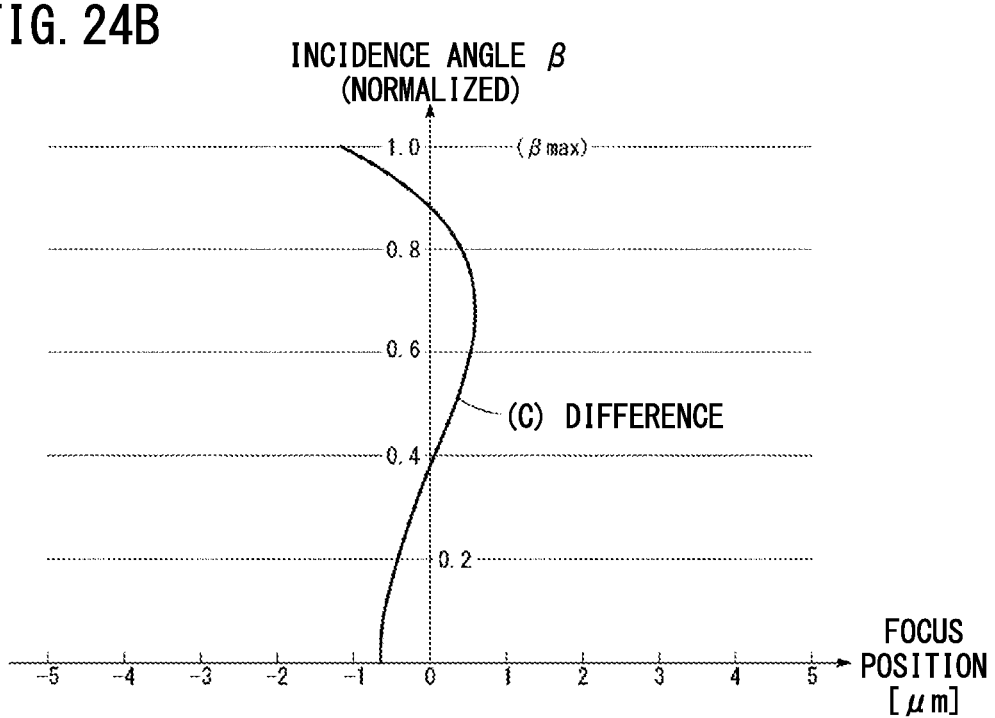

In contrast to this, in the second embodiment, by rotating the direction of the generatrix of the first cylindrical lens CYa 90 degrees around the optical axis AXe, relative to the generatrix direction of the second cylindrical lens CYb (main scanning direction), to be set in the sub scanning direction and providing the spherical lens system FLG (lenses L10 and L11) between the first cylindrical lens CYa and the reflective surface RPa of the rotating polygon mirror PM, the spherical aberration occurring in each of the first cylindrical lens CYa and the second cylindrical lens CYb is corrected, and it is possible to reduce the error of the focus position corresponding to the incidence angle of the light rays distributed in the angle range of the image plane side numerical aperture NA of the beam LB projected onto the surface to be scanned Po as the spot light SP. FIGS. 24A and 24B show the spherical aberration characteristic of the beam LB simulated with the maximum values of the image plane side numerical apertures NAm and NAs of the beam LB being 0.06, based on the lens data table (FIG. 23) of the second embodiment, wherein the horizontal axes indicate the focus position (μm) at which the best focus position according to the design is the zero point and the vertical axes indicate an incidence angle β obtained by normalizing the maximum incidence angle βmax (NAmax=sin βmax) of the light ray corresponding to the maximum value NAmax (e.g. 0.06) of the image plane side numerical aperture NA of the beam LB to a value of 1.0. FIG. 24A is a graph showing the spherical aberration characteristic of the beam LB projected onto the surface to be scanned Po divided into the main scanning direction and the sub scanning direction, wherein the characteristic (A) indicated by the solid line is the spherical aberration characteristic in the main scanning direction and the characteristic (B) indicated by the dashed line is the spherical aberration characteristic in the sub scanning direction. The characteristic (C) shown in FIG. 24B indicates the spherical aberration characteristic caused by a difference [(B)−(A)] between the characteristic (A) and the characteristic (B) in FIG. 24A.

Here, the characteristic (A) in FIG. 24A is the spherical aberration caused by the composite system including the beam expander system BEO, the first cylindrical lens CYa, the spherical lens system FLG, and the fθ lens system FT in FIG. 22, and the characteristic (B) in FIG. 24A is the spherical aberration caused by the composite system including the beam expander system BEO, the spherical lens system FLG, the fθ lens system FT and the second cylindrical lens CYb. Accordingly, the characteristic (C) that is the difference between the characteristic (A) and the characteristic (B) shown in FIG. 24B corresponds to the spherical aberration characteristic caused mainly by the first cylindrical lens CYa and the second cylindrical lens CYb. According to the results of this simulation, the absolute value of the spherical aberration amount in the second embodiment is smaller by approximately one order of magnitude than in the first embodiment above. As understood from the characteristic (A) in FIG. 24A, the spherical aberration caused by the first cylindrical lens CYa is corrected by the spherical lens system FLG, and therefore almost no shift occurs in the best focus position corresponding to the incidence angle β of the beam LB projected onto the surface to be scanned Po as the spot light SP.

Since this shift, i.e., the spherical aberration, is favorably corrected, when the spherical aberration caused only by the first cylindrical lens CYa is SCa, the spherical aberration caused only by the second cylindrical lens CYb is SCb, the focal distance of the spherical lens system FLG is fcg, the focal distance of the fθ lens system FT is ft, the image plane side numerical aperture in the main scanning direction of the beam LB is NAm, the image plane side numerical aperture in the sub scanning direction of the beam LB is NAs, and the center wavelength of the beam LB is λo, each optical specification is set such that the spherical aberration SDm in the main scanning direction and the spherical aberration SDs in the sub scanning direction of the beam LB satisfy the conditions of at least one of Expressions (17) to (20) below.

$$|SDm - SDs| < \left| SCa \cdot \frac{ft^2}{fcg^2} - SCb \right| \qquad (17)$$

$$SDm < SCa \cdot \frac{ft^2}{fcg^2}, \text{ and } Sds < SCb \qquad (18)$$

$$|SDm - SDs| < \frac{\lambda o}{NAm^2}, \text{ and } |SDm - SDs| < \frac{\lambda o}{NAs^2} \qquad (19)$$

$$SDm < \frac{\lambda o}{NAm^2}, \text{ and } SDs < \frac{\lambda o}{NAs^2} \qquad (20)$$

However, when each optical specification of the first cylindrical lens CYa, the second cylindrical lens CYb, the fθ lens system FT, and the like is already determined, each optical specification of the spherical lens system FLG (lenses L10 and L11) is set in a manner to satisfy the conditions of at least one of the Expressions (17) to (20) shown above. Furthermore, in a case where only the optical specification of the fθ lens system FT is already determined, the optical specification of the spherical lens system FLG (lenses L10 and L11) and each optical specification of the first cylindrical lens CYa and the second cylindrical lens CYb are set in a manner to satisfy the conditions of any one of Expressions (17) to (20). It should be noted that the absolute value |SDm−SDs| of the difference between the spherical aberration SDm and the spherical aberration SDs is the same as |SDs−SDm|.

Furthermore, since the image plane side numerical aperture NAm in the main scanning direction and the image plane side numerical aperture NAs in the sub scanning direction of the beam LB projected onto the surface to be scanned Po are equal, the respective focal distances fca, fcb, fcg, and ft of the first cylindrical lens CYa, the second cylindrical lens CYb, the spherical lens system FLG, and the fθ lens system FT of the beam scanning apparatus shown in FIGS. 22A and 22B are set to realize the relationship of Expression (21) below.

$$\frac{fcg^2}{fca} = \frac{ft^2}{fcb} \qquad (21)$$

Furthermore, in a case where the image plane side numerical aperture NAm and the image plane side numerical aperture NAs are equal (NAm≈NAs=NA), the aperture diameter (diameter) φap of the aperture stop AP of the beam scanning apparatus shown in FIGS. 22A and 22B is set to realize the relationship of Expression (22) below, from the relationship of Expression (21).

$$\varphi ap = 2 \cdot NA \cdot \frac{ft \cdot fca}{fcg} = 2 \cdot NA \cdot \frac{fcg \cdot fcb}{ft} \qquad (22)$$

As described above, in the beam scanning apparatus according to the second embodiment, in order to scan with the beam LB one-dimensionally along the surface to be scanned Po while projecting the beam LB from the light source apparatus onto the surface to be scanned Po (drawing target), the first cylindrical lens CYa having power in one direction, the rotating polygon mirror PM that has the beam LB that has transparently passed through the first cylindrical lens CYa incident thereto and deflects this beam LB to perform one-dimensional scanning, the fθ lens system FT that receives the beam LB deflected by the rotating polygon mirror PM and projects this beam LB onto the surface to be scanned Po in a telecentric state, and the second cylindrical lens CYb that receives the beam LB that has transparently passed through the fθ lens system FT and has refractive power in one direction (sub scanning direction) are provided, the first cylindrical lens CYa and the second cylindrical lens CYb are arranged such that the powers (refractive powers) thereof are in directions orthogonal to each other, and the spherical lens system FLG (lenses L10 and L11) for correcting the aberration (spherical aberration) is provided between the first cylindrical lens CYa and the rotating polygon mirror PM.

In this way, it is possible to correct the shift in the sub scanning direction of the projection position of the beam LB (spot light SP) caused by the tilt due to each reflective surface RPa of the rotating polygon mirror PM, and also to correct the spherical aberration caused by the first cylindrical lens CYa and the second cylindrical lens CYb with a simple configuration. In addition, the relationship between the focal distance fca of the first cylindrical lens CYa and the focal distance fcb of the second cylindrical lens CYb are set within range that causes the occurrence of the sagittal aberration to be favorably suppressed. Accordingly, worsening of the spot light SP imaging performance is restricted, and it is possible to increase the resolution (fineness) of the pattern to be drawn on the surface to be scanned Po.

Third Embodiment

Figure 25:
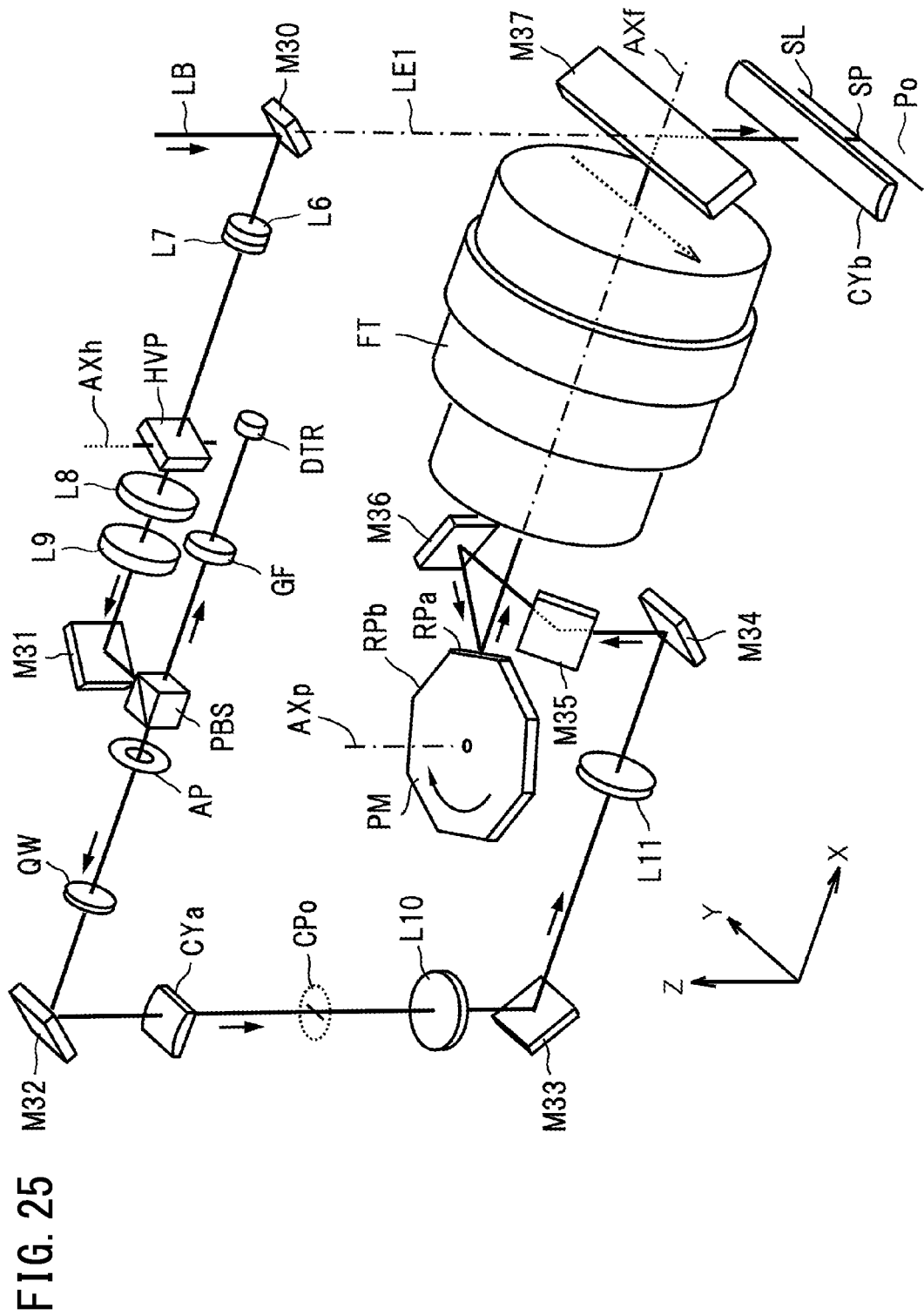
FIG. 25 is a perspective view of a detailed configuration of a pattern drawing unit (drawing apparatus) according to a third embodiment.

FIG. 25 shows a detailed configuration of a pattern drawing unit (drawing apparatus) that incorporates the beam scanning apparatus according to the second embodiment described above. FIG. 25 is a perspective view of a light path and a detailed arrangement of each optical element from the beam expander system BEO (lenses L6 to L9) to the second cylindrical lens CYb shown in FIGS. 22A and 22B. Among the optical elements shown in FIG. 25, components that are the same as in FIGS. 22A and 22B are given the same reference numerals. Furthermore, in the XYZ orthogonal coordinate system in FIG. 25, the direction in which the spot light SP condensed on the surface to be scanned Po becomes the scan line SL due to the rotation of the polygon mirror PM is the Y-axis direction, the direction parallel to the normal line of the surface to be scanned Po extending from a midpoint of the scan line SL in the Y direction is the Z-axis direction, and the sub scanning direction orthogonal to the main scanning direction (Y direction) in which the scan line SL extends is the X-axis direction.

In the pattern drawing unit (drawing apparatus) shown in FIG. 25, following a mirror M30 that reflects the fine beam LB (parallel light flux with a diameter of approximately 0.5 mm) that has been intensity-modulated according to the drawing data, a lens L6, a lens L7, a parallel flat plate HVP made of quartz, lenses L8 and L9, a mirror M31, a polarizing beam splitter PBS, the aperture stop AP, a 1/4 wave plate QW, a mirror M32, the first cylindrical lens CYa, a lens L10, a mirror M33, a lens L11, mirrors M34, M35, and M36, the eight-sided rotating polygon mirror PM, the fθ lens system FT, a mirror M37, and the second cylindrical lens CYb are arranged in the stated order. The parallel flat plate HVP made of quartz is provided in the light path between the lenses L6 to L9 forming the beam expander system BEO (see FIGS. 22A and 22B), and is configured to be rotatable (inclinable) around the rotational axis AXh that is parallel to the Z-axis. By changing the inclination amount of the parallel flat plate HVP, it is possible to shift the position of the spot light SP projected onto the surface to be scanned Po in the sub scanning direction (X direction) within a distance range that is several times to tens of times the effective diameter n of the spot light SP, for example. The beam LB (parallel light flux) that has passed through the lens L9 to be enlarged becomes incident to the polarizing beam splitter PBS via the mirror M31. When the beam LB is linear P-polarized light, the polarizing beam splitter PBS reflects the beam LB with an intensity greater than or equal to 99% from the polarization splitting surface, and directs this reflected beam toward the following aperture stop AP. The beam LB that has transparently passed through the circular aperture (diameter of approximately 3.5 mm) of the aperture stop AP is converted from linearly polarized light into circularly polarized light when transparently passed through the 1/4 wave plate QW.

The beam LB (parallel light flux) that has transparently passed through the 1/4 wave plate QW is reflected in the −Z direction by the mirror M32, becomes incident to the first cylindrical lens CYa (generatrix parallel to the Y-axis), and is condensed with an intensity distribution shaped as slits having an extremely small width in the X direction in the plane CPo and a length of approximately 3.5 mm (same as the aperture diameter of the aperture stop AP) in the Y direction. The beam LB converged in only a one-dimensional direction in the plane CPo progresses in the +X direction through the first lens L10 forming the spherical lens system FLG (see FIGS. 22A and 22B), the mirror M33, and the final lens L11 forming the spherical lens system FLG. Immediately after being emitted from the lens L11, the beam LB becomes an approximately parallel light flux in the Z direction due to the effect of the first cylindrical lens CYa, and becomes a convergent light flux to be condensed on the reflective surface RPa of the rotating polygon mirror PM in the Y direction.

The beam LB emitted from the lens L11 is reflected in the +Z direction by the mirror M34, and is then reflected in the +Y direction by the mirror M35. The mirror M34 and the mirror M35 are arranged such that the main light ray (center light ray) of the beam LB progressing in the +Y direction from the mirror M35 and the optical axis AXf of the fθ lens system FT are orthogonal to each other in a plane parallel to the XY plane. The beam LB progressing in the +Y direction from the mirror M35 is reflected by the mirror M36 arranged on the opposite side of the mirror M35 in a manner to sandwich the optical axis AXf of the fθ lens system FT, and is projected onto the reflective surface RPa of the rotating polygon mirror PM. The reflective surface of the mirror M36 is parallel to the Z-axis and is arranged at a narrow angle of 22.5° relative to the plane that is parallel to the XZ-plane and includes the optical axis AXf. In this way, the optical axis AXe (see FIGS. 22A and 22B) on which the main light ray (center light ray) of the beam LB heading from the mirror M36 toward the reflective surface RPa of the rotating polygon mirror PM, i.e., the first cylindrical lens CYa and the spherical lens system FLG (lenses L10 and L11), is/are arranged is set to an angle of 45° relative to the optical axis AXf of the fθ lens system FT. Furthermore, in FIG. 25, the beam LB reflected by the mirror M36 toward the reflective surface RPa of the rotating polygon mirror PM becomes a convergent light flux to be condensed on the reflective surface RPa of the rotating polygon mirror PM in the Z direction, becomes an approximately parallel light flux in a plane parallel to the XY-plane, and is condensed on the reflective surface RPa to have an intensity distribution of slit shapes extending in the main scanning direction (direction of a tangent of an inscribed circle centered on the rotational center axis AXp of the rotating polygon mirror PM).

In the configuration of the beam scanning apparatus of FIG. 22 above, as shown in FIGS. 22B and 23, the interval between the final lens L11 forming the spherical lens system FLG and the reflective surface RPa of the rotating polygon mirror PM is set to approximately 43.32 mm, but in the present embodiment, the distance between the main points of the spherical lens system FLG is adjusted in order to increase the interval between the lens L11 and the reflective surface RPa of the rotating polygon mirror PM, from the relationship of the arrangement of the mirrors M34 to M36 between the lens L11 and the reflective surface RPa of the rotating polygon mirror PM.

The beam LB that has been reflected by the reflective surface RPa of the rotating polygon mirror PM passes through the telecentric fθ lens system FT, and is then reflected at a right angle in the −Z direction by the mirror M37, becomes incident to the second cylindrical lens CYb (the generatrix direction of which is the Y direction), and is condensed as the spot light SP on the surface to be scanned Po. In the present embodiment, the optical axis AXf of the fθ lens system FT where the beam is bent at a right angle in the −Z direction by the mirror M37 and becomes perpendicular to the surface to be scanned Po and the center light ray of the beam LB progressing in the −Z direction toward the mirror M30 are set to be parallel to a line segment LE1 that is parallel to the Z-axis. This is so that, when the scan line SL is inclined by a very small amount in the plane of the surface to be scanned Po (plane parallel to the XY-plane), by rotating the entire chassis (unit frame) that integrally supports each optical element from the mirror M30 to the second cylindrical lens CYb in FIG. 25 by a small amount centered on the line segment LE1, eccentricity and vignetting of the beam LB passing through the inside of the drawing unit formed by the mirror M30 to the second cylindrical lens CYb is prevented. International Publication No. WO 2016/152758 discloses a mechanism making it possible to rotate the entire chassis of the drawing unit, which includes the configuration from the mirror M30 that receives the beam LB from the light source apparatus to the second cylindrical lens CYb, around the line segment LE1 by a very small amount.

In the present embodiment, a photoelectric sensor DTR and a lens system GF are provided to detect the intensity of the reflected light generated when the spot light SP is projected onto the surface of the object to be irradiated (substrate or the like) arranged on the surface to be scanned Po. The reflected light (particularly the normal reflected light) from the surface of the object to be irradiated returns to the polarizing beam splitter PBS via the second cylindrical lens CYb, the fθ lens system FT, the reflective surface RPa of the rotating polygon mirror PM, the mirrors M36, M35, and M34, the lens L11, the mirror M33, the lens L10, the first cylindrical lens CYa, the mirror M32, the 1/4 wave plate QW, and the aperture stop AP, according to the principle of light ray reversal. The spot light SP projected onto the surface of the object to be irradiated is circularly polarized light and the reflected light thereof also mostly includes a circularly polarized light component, and therefore, when the reflected light transparently passes through the 1/4 wave plate QW and heads toward the polarizing beam splitter PBS, the polarization characteristic thereof converts the spot light SP into linear S-polarized light. Therefore, the reflected light from the surface of the object to be irradiated transparently passes through the polarized light splitting surface of the polarizing beam splitter PBS and becomes incident to the lens system GF. The light receiving surface of the photoelectric sensor DTR is set to have an optically conjugate relationship with the spot light SP on the surface to be scanned Po, such that the reflected light from the object to be irradiated is condensed on the light receiving surface of the photoelectric sensor DTR by the lens system GF.

In the configuration described above, the aperture stop AP is arranged at the rear-side focal point position of the rear-side lens group L8 and L9 of the beam expander system BEO formed by the lenses L6 to L9. When the parallel flat plate HVP is rotated from the center position (state in which the inclination is zero) around the rotational axis AXh, the beam LB incident to the lens L8 is shifted parallel to the Y direction in FIG. 25. Therefore, the beam LB (parallel light flux) emitted from the lens L9 reaches the aperture stop AP at a slight angle, relative to the optical axis of the beam expander system BEO, in a plane parallel to the XY-plane, but the center light ray of the beam LB always passes through the center point of the circular aperture of the aperture stop AP regardless of the inclination amount of the parallel flat plate HVP. Due to the inclination of the parallel flat plate HVP from the center position, the beam LB that is emitted from the aperture stop AP and incident to the first cylindrical lens CYa becomes inclined in a plane parallel to the YZ-plane in FIG. 25. Accordingly, the beam LB condensed into slit shapes extending in the Y direction in the plane CPo is shifted parallel to the Y direction by a very small amount corresponding to the inclination amount of the flat plate HVP in the plane CPo, and after this, the beam LB projected onto the reflective surface RPa of the rotating polygon mirror PM via the spherical lens system FLG (lenses L10 and L11) and the mirrors M34 to M36 is shifted by a very small amount in the Z direction (sub scanning direction) on the reflective surface RPa, according to the inclination amount of the parallel flat plate HVP. Since the reflective surface RPa of the rotating polygon mirror PM and the surface to be scanned Po are set to have an optically conjugate relationship (imaging relationship) in the sub scanning direction, the spot light SP projected onto the surface to be scanned Po is shifted by a very small amount in the sub scanning direction, according to the inclination amount of the parallel flat plate HVP.

Although not shown in FIG. 25, as disclosed in International Publication No. WO 2015/166910, a transmission light beam for an origin sensor for outputting an origin signal, which indicates that each reflective surface has reached an angular position immediately before the start of drawing, is projected onto a reflective surface RPb that is one surface earlier in the rotating direction than the reflective surface RPa of the rotating polygon mirror PM onto which the beam LB for drawing is projected.

First Modification

In the first to third embodiments described above, one-dimensional scanning with the spot light SP is performed along the surface to be scanned Po using the rotating polygon mirror PM that rotates at a constant velocity, but a Galvano mirror may be used instead of the rotating polygon mirror PM. In such a case, the Galvano mirror is installed such that the center line of the pivoting rotation of the Galvano mirror includes the surface reflecting the beam LB and extends in the sub scanning direction, and this center line may be arranged to be orthogonal to the optical axis AXf of the fθ lens system FT (scanning optical system). In a case where the Galvano mirror is arranged in this way, the image plane side defocus amount ΔDip described in FIG. 10 above becomes approximately zero, and therefore there is no need to consider the conditions of the focal distance at each image height position Hy, that is, the magnitude relationship with respect to the depth of focus DOFs determined by Expressions (13) and (14).

Second Modification

In the first to third embodiments described above, the fθ lens system FT that has an f-θ characteristic whereby the change amount of the incidence angle θ of the beam LB incident thereto and the change amount of the image height position Hy of the spot light SP are proportional is used as the scanning optical system, and the scanning with the spot light SP is performed at a constant velocity. However, a device that has a characteristic that is neither an f-θ characteristic nor an f-tan θ characteristic may be used as the scanning optical system. In other words, it is possible to use a scanning optical system that has a characteristic other than an f-tan θ characteristic. In such a case, in the scanning optical system having a characteristic other than the f-θ characteristic and the f-tan θ characteristic, the change amount of the incidence angle θ of the beam LB incident thereto and the change amount of the image height position Hy of the spot light SP are not proportional and have a non-linear relationship, and therefore the scanning velocity of the spot light SP has a non-linear velocity characteristic that differs according to the image height position Hy. Therefore, in a case where a scanning optical system having such a non-linear velocity characteristic is used, this can be dealt with by synchronizing the timing of the intensity modulation of the spot light SP that is turned ON/OFF according to the drawing data (e.g. the image data in a bitmap format in which the smallest dimension of a pixel that can be drawn on the surface to be scanned Po is 1 bit) with the change of the image height position Hy and performing a correction at high speed.

Specifically, the light source apparatus is used to perform control whereby, for each clock pulse of a clock signal having a prescribed frequency, the bit state of one pixel of bitmap data read from the drawing data is determined, the beam LB is pulse-oscillated when this bit state is "1", and the pulse-oscillation of the beam LB is suspended when the bit state is "0". One example of such a light source apparatus is disclosed in International Publication No. WO 2017/057415, for example. In this way, when a light source apparatus is capable of performing pulse oscillation in response to a clock signal with a prescribed frequency, it is possible to correct warping (deformation) of the drawing pattern caused by the non-linear velocity characteristic of the spot light SP (e.g. caused by a slight error or the like from the f-θ characteristic of the fθ lens system FT) by continuously or discretely making a fine adjustment to the period of the clock pulse or the frequency of the clock signal generated while scanning with the spot light SP is being performed along the scan line SL. A method for performing such an adjustment on the period of the clock pulse or the frequency of the clock signal is also disclosed in International Publication No. WO 2017/057415, and therefore this method can be used here. In a case where the scanning optical system does not have an f-tan θ characteristic, such as in the present modification, the curvature amount Dsc (see FIGS. 5A to 5C and 9) corresponding to the sagittal coma aberration is an amount that depends on the shift from the f-tan θ characteristic of the scanning optical system that does not have an f-tan θ characteristic.

Third Modification

In the first to third embodiments above, as described in FIG. 9, the tolerable range for the curvature amount Dsc is determined by a comparison to the Airy disk radius ADm, but in a case where the size (pixel size Pxy) of a pixel (square shape) having the smallest dimensions capable of being drawn on the surface to be scanned Po is greater than the Airy disk radius ADm, the tolerable range for the curvature amount Dsc is determined by a comparison to the pixel size Pxy, and the focal distance fcb of the second cylindrical lens CYb may be determined to realize a range of Dsc <Pxy. The depth of focus DOFs (see the description of FIG. 10) at this time is approximately two times the value obtained by dividing the pixel size Pxy (μm) by the image plane side numerical aperture NAs of the beam LB in the sub scanning direction. The pixel size Pxy (μm) is dimensions (square shape) on a drawing map defined as the smallest pattern that can be drawn on the surface to be scanned Po (object to be irradiated) by the pattern drawing apparatus.

Fourth Modification

In the first to third embodiments described above, the first cylindrical lens CYa and the second cylindrical lens CYb serving as cylindrical planar lenses are each formed by a single plate (one plate), but may instead each be formed as composite lenses including a combination of two or more lenses, as in the comparative example shown in FIGS. 17A to 17C. Furthermore, the lens surface with a cylindrical planar shape may be an aspherically machined lens surface formed by combining arcs with a plurality of curvature radii, instead of having the curvature radius be a portion of a single arc.

Fifth Modification

The beam LB is polarized light in the third embodiment (FIG. 25) described above, but this is in order to efficiently extract, using the polarizing beam splitter PBS, the reflected light generated from the object to be irradiated by projecting the spot light SP, and in a case where there is no need to detect such reflected light, the polarizing beam splitter PBS becomes unnecessary, and therefore the beam LB may be non-polarized light. Furthermore, the beam LB may be a beam having a central wavelength λo other than the wavelength of 354.7 nm used in the simulation, and if an achromatic design (color aberration correction) is realized using two or more types of glass materials (e.g. quartz, fluorite, or the like) having different refractive indices (dispersions) as the glass materials of the lenses, a plurality of beams having central wavelengths within an achromatic wavelength range may be coaxially incident to the beam scanning apparatus. Furthermore, the beam LB has a Gaussian distribution or a distribution similar to a Gaussian distribution, but a beam having an approximately uniform intensity distribution in the beam cross-sectional plane may be incident to the beam scanning apparatus.

Sixth Modification

In the first to third embodiments described above, the beam LB incident to the beam expander system BEO may be a beam with an ultraviolet wavelength pulse-oscillated in response to a clock signal with a frequency of approximately 400 MHz from a fiber amplifier laser light source (wavelength conversion type of laser light source), such as disclosed in International Publication No. WO 2015/166910 or International Publication No. WO 2017/057415. This fiber amplifier laser light source modulates seed light pulses (oscillated at the frequency of the clock signal) incident to the fiber amplifier according to the logic value of "0" or "1" of a serial bit signal read from the drawing data (bitmap data in which one pixel is one bit) in synchronization with the clock frequency, thereby ultimately modulating the pulse beam with an ultraviolet wavelength that has been wavelength-converted and output into ON pulse light (high intensity) and OFF pulse light (low intensity). Furthermore, in a case where a plurality of the beam scanning apparatuses (drawing units) such as described in the first to third embodiments described above are lined up in the main scanning direction to realize a multi-drawing-unit system that enlarges the width capable of being drawn in the main scanning direction, such as disclosed in International Publication No. WO 2015/166910, the beam from the fiber amplifier light source is set to the ON state (diffracted state) in order by a plurality of acousto-optic modulating elements (AOM) arranged in series, according to the scanning efficiency realized by one reflective surface of the rotating polygon mirror PM, and this beam should be switched in a manner to be supplied in order to each of the plurality of beam scanning apparatuses (drawing units).

Fourth Embodiment

Figure 26:
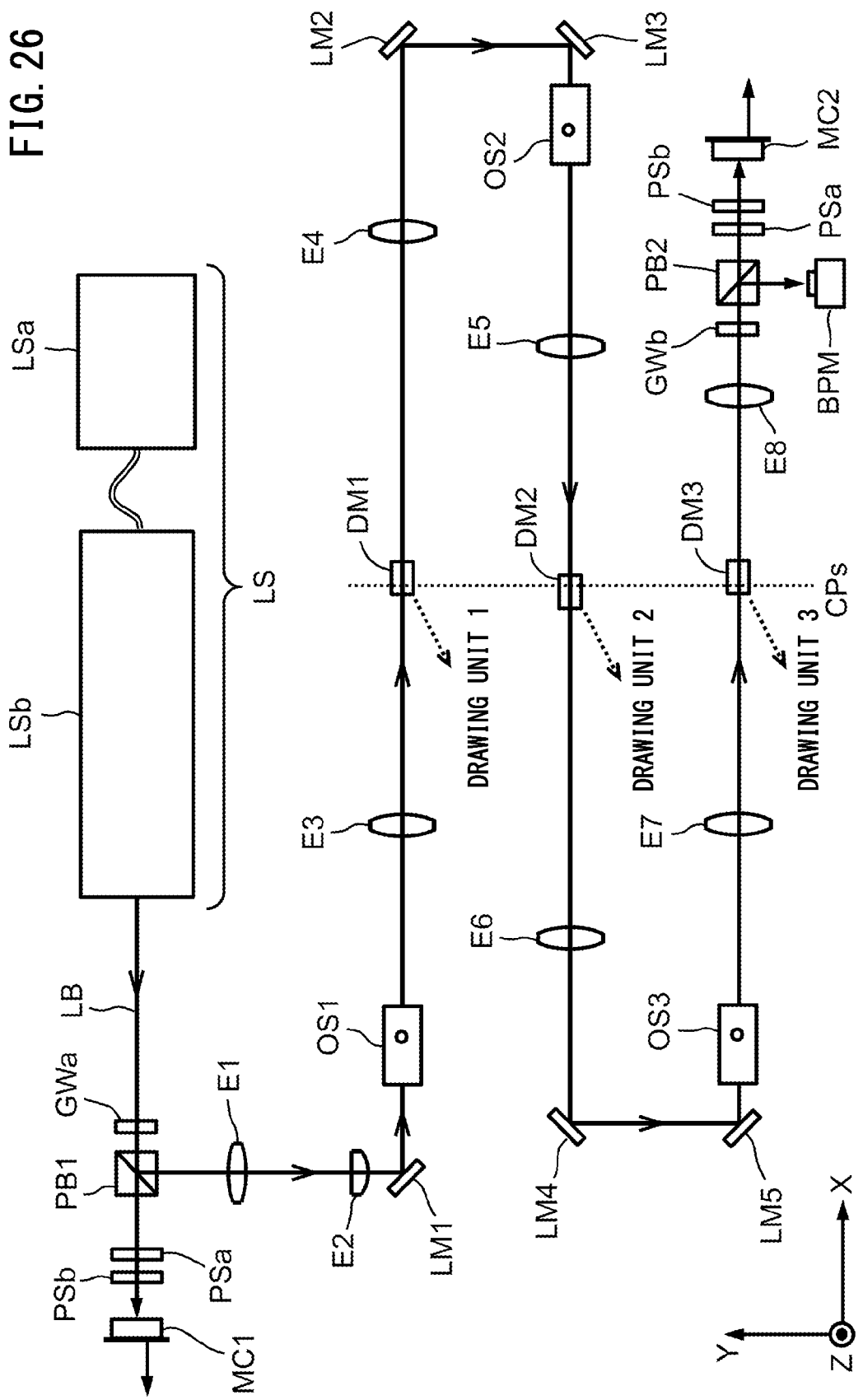
FIG. 26 shows a schematic optical arrangement of a beam switching section according to a fourth embodiment.

FIG. 26 shows a configuration of a beam switching section for sequentially switching, in a sequential time-distributed manner, a beam (beam that has been intensity-modulated according to the drawing data) LB from a light source apparatus (fiber amplifier laser light source) LS to one of the plurality of drawing units, in the multi-drawing-unit system described in the sixth modification above. In FIG. 26, the Z-axis in the XYZ orthogonal coordinate system is set to be parallel to the direction of gravity, the Y-axis is set to be parallel to the main scanning direction (scan line SL) of the spot light SP realized by each drawing unit (e.g. the beam scanning apparatus shown in FIG. 25), and the X-axis is set to be parallel to the sub scanning direction. The beam switching section of FIG. 26 is basically the same as the section disclosed in International Publication No. WO 2017/057415, but here, the beam LB from a single light source apparatus LS is distributed in a time-divided manner to each of three drawing units 1, 2, and 3.

As described in the sixth modification, the light source apparatus LS is formed by a seed light generating section LSa that generates a seed light pulse corresponding to the drawing data and an ultraviolet beam generating section LSb that includes a fiber amplifier section and a wavelength converting section. The seed light pulse generated by the seed light generating section LSa is transmitted to the fiber amplifier section of the ultraviolet beam generating section LSb through optical transmission via fiber, and each of the seed light generating section LSa and the ultraviolet beam generating section LSb incorporates an air-cooled or liquid-cooled temperature control mechanism for stabilizing internal optical and electrical components at appropriate temperatures. The beam LB in the ultraviolet wavelength region (center wavelength $\lambda o=354.7$ nm) emitted from the light source apparatus LS becomes a parallel light flux in which the diameter of the effective intensity wavelength in the cross-sectional plane (diameter of the intensity that is 1/e2 of the peak intensity) is approximately 1 mm, progresses in the −X direction, and passes through a wave plate GWa to become incident to a polarizing beam splitter PB1. The wave plate GWa is provided to be rotatable on the optical axis, and it is possible to adjust the ratio between the intensity of the beam transparently passing through the polarization separation surface of the polarizing beam splitter PB1 and the intensity of the beam reflected by the polarization separation surface, according to the rotational angle of the wave plate GWa. In the present embodiment, the beam that has transparently passed in the −X direction through the polarizing beam splitter PB1 is received by the image capturing element MC1 via a dimming filter PSa and a wavelength filter (bandpass filter) PSb. The image capturing element MC1 is used to monitor the positional fluctuation (drift) of the beam LB emitted from the light source apparatus LS in a plane perpendicular to the optical axis, the state or change of the intensity distribution (profile) of this beam LB in the cross-sectional plane of the beam, and the like.

The beam LB reflected in the −Y direction by the polarizing beam splitter PB1 passes through a beam diameter contracting system formed by two lenses E1 and E2 and is converted into a parallel light flux in which the effective beam diameter is 0.5 mm, which is approximately half of the original diameter, and is then reflected by 90° in the +X direction by a mirror LM1. The mirror LM1 is a laser mirror with high durability to laser light in the ultraviolet wavelength region, and has a characteristic of reflecting approximately 99% of the intensity of the beam LB incident thereto while transparently passing the remaining approximately 1% as leaked light. The beam LB that has been reflected in the +X direction by the mirror LM1 becomes incident to a first-stage selective optical element OS1. The selective optical element OS1 is an acousto-optic modulation element (AOM) that generates a diffracted beam (first-order diffracted light) of the incident beam LB, only while in an ON state during which a high-frequency drive signal is being applied thereto. In the case of the present embodiment, the selective optical element OS1 is arranged to satisfy a Bragg diffraction condition, and the direction in which the diffracted beam is generated is set to be the −Z direction in a plane parallel to the XZ-plane. Each of the diffracted beam and the 0-order beam (which are each a parallel light flux) generated from the selective optical element OS1 when in the ON state is condensed to form a beam waist in a conjugate plane CPs parallel to the YZ-plane by the lens E3. The condensation position of the diffracted beam in the conjugate plane CPs is shifted in the −Z direction relative to the condensation position of the 0-order beam, and therefore the diffracted beam is reflected in the −Z direction by an epi-illumination mirror DM1 arranged in the conjugate plane CPs and having a reflective surface inclined by approximately 45° relative to the XY-plane, to be directed toward the drawing unit 1.

When the selective optical element OS1 is in the OFF state where the high-frequency drive signal is not being applied thereto, the selective optical element OS1 transparently passes the incident beam LB as-is, and after this beam LB has been condensed to form a beam waist in the conjugate plane CPs by the lens E3, this beam LB passes above the epi-illumination mirror DM1 in the +Z direction and becomes incident to the lens E4. The beam LB that has passed through the lens E4 is again converted into a parallel light flux that has an effective diameter of approximately 0.5 mm in the cross section thereof and is then reflected in the −Y direction by the mirror LM2, after which this beam LB is reflected in the −X direction by the mirror LM3 and becomes incident to a second-stage selective optical element (AOM) OS2 provided according to a Bragg diffraction condition. In this configuration, the lenses E3 and E4 become a non-magnifying relay optical system, and the first-stage selective optical element OS1 and second-stage selective optical element OS2 are set to have an optically conjugate relationship. From the second-stage selective optical element OS2 and onward, the lenses E5 and E6 serving as a non-magnifying relay optical system and the epi-illumination mirror DM2 arranged in the conjugate plane CPs are provided in the same manner as in the configuration from the first-stage selective optical element OS1 and onward. When the first-stage selective optical element OS1 is in the OFF state and the second-stage selective optical element OS2 is in the ON state, the diffracted beam (first-order diffracted light) of the beam LB generated by the selective optical element OS2 is reflected in the −Z direction by the epi-illumination mirror DM2 and heads toward the drawing unit 2.

When both of the selective optical elements OS1 and OS2 are in the OFF state, the beam LB that has passed through the lens E6 is again converted into a parallel light flux that has an effective diameter of approximately 0.5 mm in the cross section thereof and is then reflected in the −Y direction by the mirror LM4, after which this beam LB is reflected in the +X direction by the mirror LM5 and becomes incident to a third-stage selective optical element (AOM) OS3 provided according to a Bragg diffraction condition. In this configuration, the second-stage selective optical element OS2 and third-stage selective optical element OS3 are set to have an optically conjugate relationship by the relay optical system formed by the lenses E5 and E6. From the third-stage selective optical element OS3 and onward, the lens E7, which is the same as the lenses E3 and E5 arranged respectively to the rear of the selective optical element OS1 and the selective optical element OS2, and the epi-illumination mirror DM3 arranged in the conjugate plane CPs are provided. When the selective optical elements OS1 and OS2 are both in the OFF state and the third-stage selective optical element OS3 is in the ON state, the diffracted beam (first-order diffracted light) of the beam LB generated by the selective optical element OS3 is reflected in the −Z direction by the epi-illumination mirror DM3 and heads toward the drawing unit 3.

The 0-order beam or the beam LB condensed to have a beam waist in the conjugate plane CPs by the lens E7 becomes a divergent light flux, and becomes incident to the lens E8 to be converted into a parallel light flux. The 0-order beam or the beam LB emitted from the lens E8, after passing through the wave plate GWb that is rotatable around the optical axis, becomes incident to a polarizing beam splitter PB2 that divides this beam into transparently passed light and reflected light, according to the polarization state of the incident beam. The reflected light that has been reflected by the polarizing beam splitter PB2 is received by a power monitor BPM that measures the energy (Joules) or power (Watts) of the beam. When all three of the selective optical elements OS1, OS2, and OS3 are in the OFF state, for example, the power monitor BPM periodically measures the intensity of the beam LB from the light source apparatus LS that reaches the position of the polarizing beam splitter PB2, and monitors the presence or lack of fluctuation in this intensity. The transparently passed light that has transparently passed through the polarizing beam splitter PB2 is received by an image capturing element MC2 via the dimming filter PSa and the wavelength filter (bandpass filter) PSb. In the present embodiment, the image capturing surface of the image capturing element MC2 is set such that the be optically conjugate to the diffraction position of the third-stage selective optical element OS3, by the relay optical system formed by the lenses E7 and E8. Accordingly, the image capturing element MC2 can capture an image of the positional fluctuation (drift) of the beam LB in a plane perpendicular to the optical axis within the selective optical element OS3 (or within the selective optical element OS1 or OS2), the state or change of the intensity distribution (profile) of this beam LB in the cross-sectional plane of the beam, and the like.

The configuration of the lens E8 may be changed to an enlarged imaging lens system, and the image capturing surface of the image capturing element MC2 may have an optically conjugate relationship (imaging relationship) with the conjugate plane CPs. In such a case, the spot image at the beam waist of the 0-order beam or the beam LB formed in the conjugate plane CPs is enlarged and captured by the image capturing element MC2. The conjugate plane CPs has a conjugate relationship with the spot light SP that is ultimately condensed on the surface to be scanned Po (surface of the object to be irradiated) by each of the drawing units 1, 2, and 3, and therefore it is possible to measure the gradual positional fluctuation (drift) of the spot of the 0-order beam or the beam LB captured by the image capturing element MC2 and to draw the pattern to be drawn on the surface to be scanned Po (surface of the object to be irradiated) at a position that is always accurate, without being affected by the drift of the beam LB or the like, by correcting the drawing timing when pattern drawing is performed by each of the drawing units 1, 2, and 3 (adjusting the time of the drawing start point on the scan line SL with a resolution of nanoseconds) based on the measurement result or correcting the angular position of the parallel plate HVP that is rotatable in the drawing unit shown in FIG. 25 above.

Seventh Modification

In the fourth embodiment described above, in order to monitor the drift of the beam LB or the like, one image capturing element MC2 is arranged to receive the 0-order beam or the beam LB after this beam has transparently passed through the three selective optical elements OS1, OS2, and OS3. However, in a case where drift has occurred in the beam LB incident to each of the drawing units 1 to 3, it is impossible to discern whether this drift was caused by fluctuation of the optical system (optical members) within the beam switching section or caused by fluctuation of the optical members in the light path leading from the light source apparatus LS to the beam switching section (from the initial selective optical element OS1 and onward) (or optical members within the light source apparatus LS), making it difficult to perform a suitable correction. Therefore, in the present modification, as shown in FIG. 27, image capturing elements MC3, MC4, and MC5 are provided respectively behind the mirrors LM1, LM3, and LM5 that are provided in the beam switching section of FIG. 26.

Figure 27:
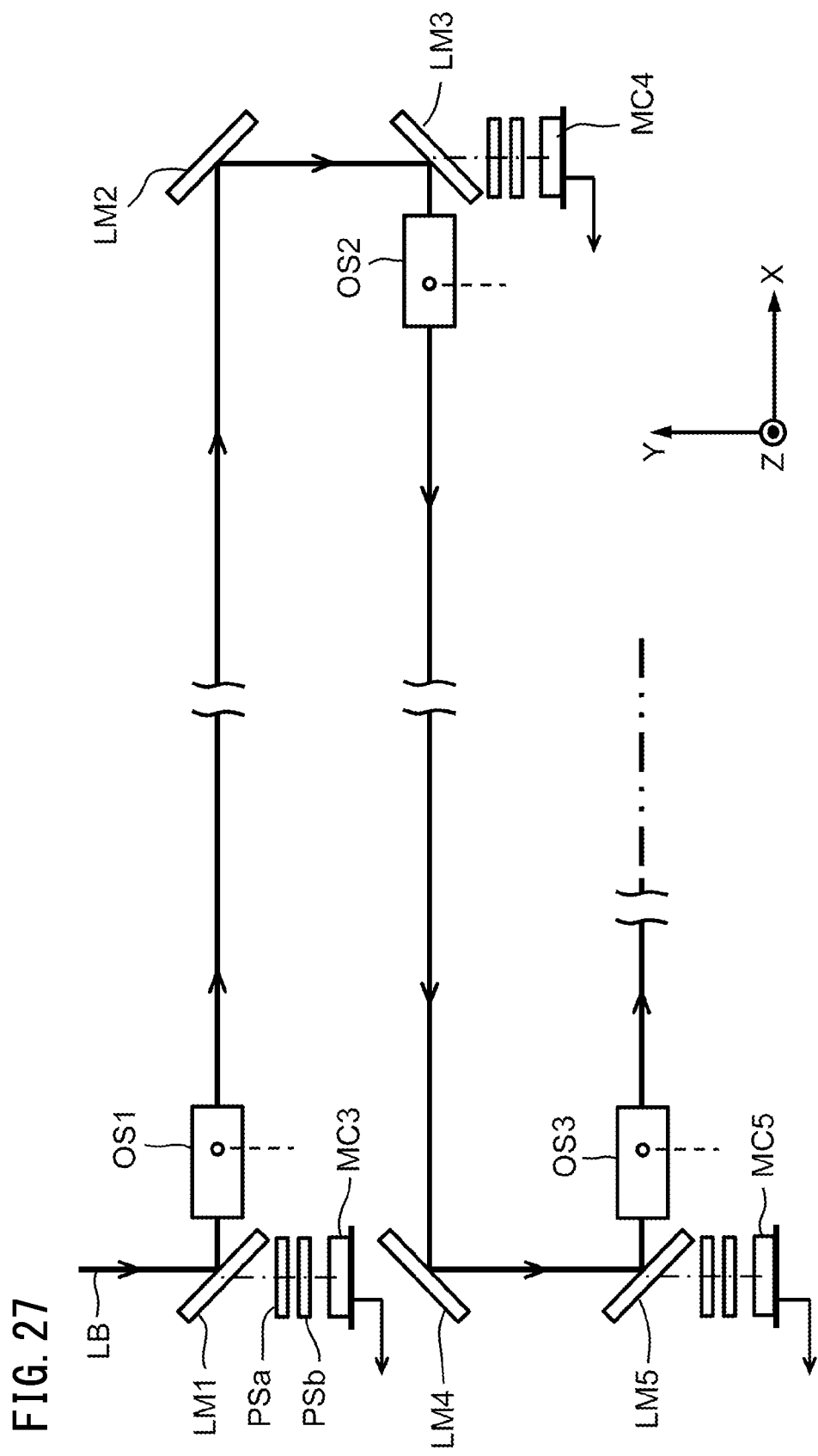
FIG. 27 shows a configuration according to a modification of the beam switching section of FIG. 26.

FIG. 27 shows only the arrangement of the mirrors LM1 to LM5 and selective optical elements OS1 to OS3 in the optical configuration of the beam switching section FIG. 26, while omitting other members from the drawing. In FIG. 27, the mirrors LM1 to LM5 are respectively the same as the laser mirrors in FIG. 26 and have a transmittance of approximately 1%, and therefore the image capturing elements MC3, MC4, and MC5 are provided behind the mirrors LM1, LM3, and LM5 such that the image capturing surfaces thereof are perpendicular to the main light ray (center light ray) of the beam incident to each of the mirrors LM1, LM3, and LM5. A dimming filter PSa or wavelength filter PSb is provided as needed immediately in front of each of the image capturing elements MC3, MC4, and MC5. The image capturing element MC3 is arranged such that the light path length (taking the refractive index into consideration) from the position where the beam LB is incident to the reflective surface of the mirror LM1 to the image capturing surface is approximately equal to the light path length (taking the refractive index into consideration) from a position where the beam LB is incident to the reflective surface of the mirror LM1 to the diffraction position in the selective optical element OS1. Similarly, the image capturing element MC4 is arranged such that the light path length from the position where the beam LB is incident to the reflective surface of the mirror LM3 to the image capturing surface is approximately equal to the light path length from a position where the beam LB is incident to the reflective surface of the mirror LM3 to the diffraction position in the selective optical element OS2, and the image capturing element MC5 is arranged such that the light path length from the position where the beam LB is incident to the reflective surface of the mirror LM5 to the image capturing surface is approximately equal to the light path length from a position where the beam LB is incident to the reflective surface of the mirror LM5 to the diffraction position in the selective optical element O53.

In this way, it is possible to identify which portion of the optical system (optical member) exhibited the fluctuation that caused the drift or profile fluctuation of the beam LB incident to each of the drawing units 1 to 3, by monitoring the transparently passed light that leaks to the rear of each of the mirrors (laser mirrors) LM1, LM3, and LM5 with the image capturing elements MC3, MC4, and MC5. For example, in a case where the spot images of the beam LB captured by the image capturing elements MC3, MC4, and MC5 have all positionally fluctuated by the same amount in the same direction, in consideration of the optically conjugate relationship, it is determined that drift has occurred due to fluctuation of optical members in the light path from the light source apparatus LS to the beam switching section (initial selective optical element OS1 and onward) (or optical members within the light source apparatus LS), and also determined that this is not drift caused by a fluctuation of the optical system) optical members) within the beam switching section. On the other hand, in a case where the spot images captured respectively by the image capturing sections MC4 and MC5 have positionally fluctuated in the same direction by the same amount, in consideration of the optically conjugate relationship therebetween, and only the spot image captured by the image capturing element MC3 has exhibited different movement, it is determined that drift of the beam LB has occurred due to fluctuation of each type of optical member (the selective optical element OS1, the lenses E3 and E4, and the mirrors LM2 and LM3) from the selective optical element OS1 to in front of the selective optical element OS2, in addition to the fluctuation of the optical members in the light path from the light source apparatus LS to the beam switching section (initial selective optical element OS1 and onward) (or optical members within the light source apparatus LS).

In a case where the shape of the spot light images of the beam LB captured respectively by the image capturing elements MC3, MC4, and MC5 have all changed to the same shape, it can be determined that the beam profile has changed due to deterioration (clouding or the like) of the optical members in the light path from the light source apparatus LS to the beam switching section (initial selective optical element OS1 and onward) (or optical members within the light source apparatus LS). On the other hand, in a case where the shapes of the spot images captured respectively by the image capturing elements MC4 and MC5 have changed to the same shape but the shape of the spot image captured by the image capturing element MC3 has not changed, it can be determined that deterioration such as clouding has occurred in one of the various types of optical elements (the selective optical element OS1, the lenses E3 and E4, and the mirrors LM2 and LM3) from the selective optical element OS1 to in front of the selective optical element OS2. In this way, according to the present modification, it is possible to easily identify the locations and fluctuation states of the optical members that have caused deterioration of the beam characteristics such as positional drift of the beam LB before becoming incident to each of the drawing units 1 to 3, change in the shape of the spot image (intensity distribution or profile) of the beam, or change in the size of the spot image caused by a focus error. Therefore, it is possible to correct the deterioration of the beam characteristics in a short time, using an adjustment mechanism (fine movement mechanism or the like) that automatically or semi-automatically suitably corrects the deterioration of the beam characteristics caused by fluctuation of the optical members, based on image information concerning the spot images acquired respectively by the image capturing elements MC3 to MC5 (and MC1 and MC2). The mirrors LM1, LM3, and LM5 are necessary to bend the beam LB in a manner to pass through the three selective optical elements OS1 to OS3 in order, and leaked light that is generated naturally due to the characteristics of these mirrors LM1, LM3, and LM5 is monitored by the image capturing elements MC3, MC4, and MC5, and therefore there is a benefit that there is no need to provide a new light splitter (such as a beam splitter in which one of the transmittance and the reflectance is sufficiently high and the other is sufficiently low) that reduces the intensity (energy) of the beam heading toward each of the drawing units 1, 2, and 3.

Eighth Modification

Figure 28:
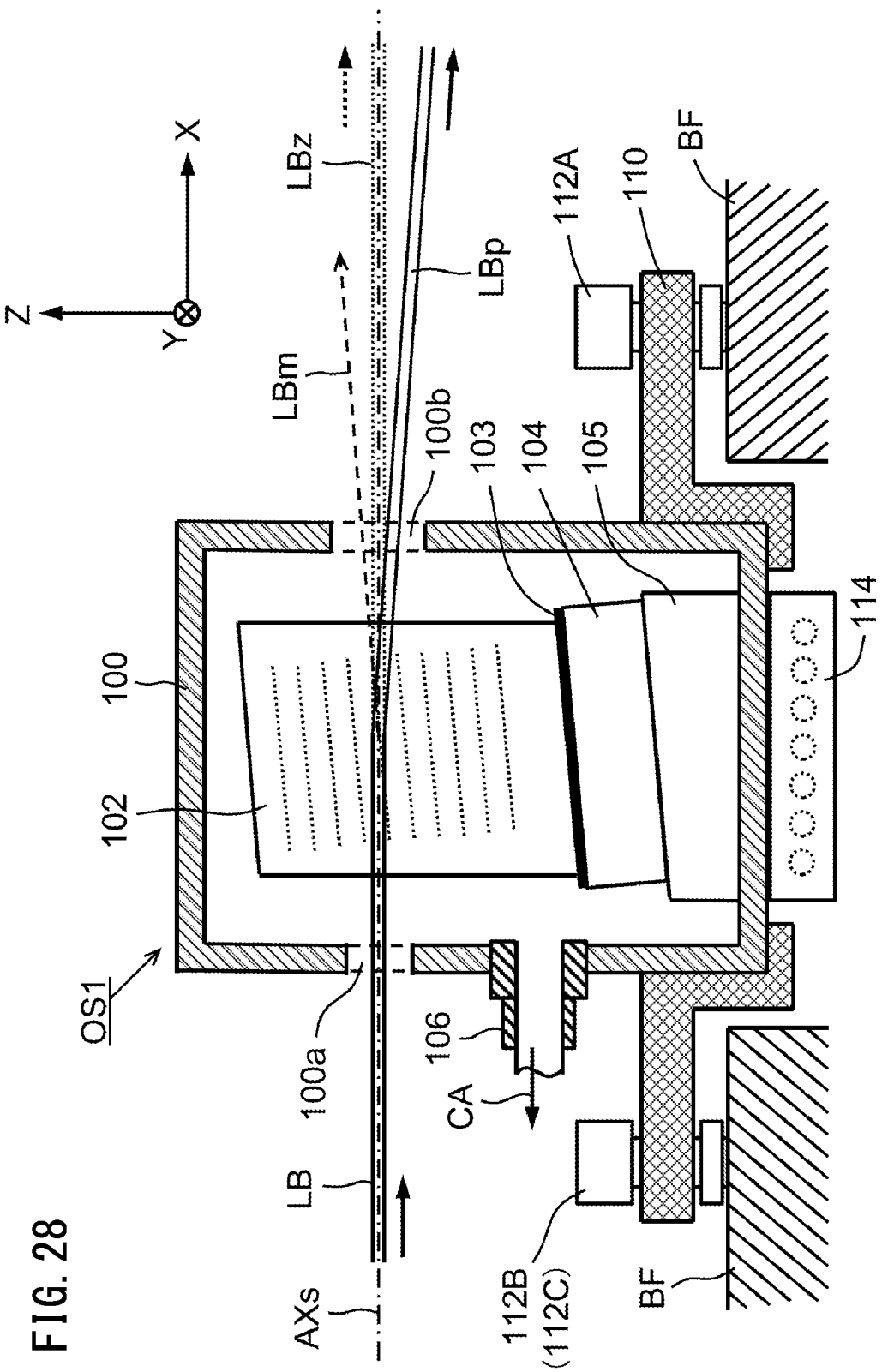
FIG. 28 is a simplified view of an adjustment mechanism for correcting change in a beam characteristic caused by fluctuation of a selective optical element OS1 shown in FIG. 26 or FIG. 27.

According to the fourth embodiment shown in FIG. 26 above and the seventh modification shown in FIG. 27, it is possible to sense a change (deterioration) in the beam characteristics using the image capturing elements MC1 to MC5 arranged at key locations in the light path of the beam LB travelling from the light source apparatus LS to each drawing unit 1 to 3. The beam characteristics can deteriorate due to fluctuation in the transmittance or diffraction efficiency of each of the selective optical elements (AOM) OS1 to OS3. FIG. 28 is a simplified view of an adjustment mechanism for correcting the change (deterioration) in the beam characteristics caused by fluctuation of the selective optical element OS1 serving as a representative among the selective optical elements OS1 to OS3 shown in FIGS. 26 and 27. In FIG. 28, the beam LB (parallel light flux with a diameter of approximately 0.5 mm) from the light source apparatus LS progresses in the +X direction in a plane parallel to the XY plane, and becomes incident to the selective optical element OS1. In FIG. 28, the optical axis AXs arranged parallel to the X-axis is the optical axis of the lenses E1, E2, E3, etc. shown in FIG. 26.

The selective optical element OS1 is covered by a chassis (cover or case) 100 made of metal, and a crystal body (or quartz body) 102 bonded to a ultrasonic transducer 104 by an adhesive 103 and a support platform 105 that supports the crystal body 102 at an angle causing the incident beam LB and a diffraction grating (transparent phase grating) generated by a traveling wave of vibration passing through the inside of crystal body 102 to satisfy a Bragg diffraction condition, are provided within the chassis 100. An incidence aperture portion 100a is formed in the beam LB incidence side of the chassis 100, and an emission aperture portion 100b through which the 0-order diffracted beam LBz and the first-order diffracted beam LBp (beam heading toward the drawing unit 1) diffracted by the crystal body 102 pass is formed in the emission side of the chassis 100. Furthermore, an exhaust port 106 for discharging gas (clean air) CA from the inside of the chassis 100 is provided in a side wall of the chassis 100, and an exhaust tube that suctions the gas CA is connected to the exhaust port 106. The temperature-adjusted clean air around the chassis 100 flows in through the aperture portions 100a and 100b due to the suction of the gas CA at the exhaust port 106, and this clean air flows along each of the incidence surface and emission surface of the crystal body 102 that are parallel to the optical axis AXs. By creating such a flow of gas, clouding or the like caused by chemical substances (amine-based molecules and carbon molecules generated from the adhesive 103 and the like) occurring on the incidence surface and emission surface of the crystal body 102 due to being irradiated with the beam LB (and the diffracted beams LBp and LBz) in the ultraviolet wavelength region is suppressed. Furthermore, a cooling member (heat absorbing member) 114 for suppressing the heat generation caused by driving of the ultrasonic transducer 104 is provided on the back side (−Z direction) of the floor portion of the chassis 100 that is parallel to the XY plane. The cooling member 114 is formed by a Peltier element, heat pump, or heat sink with liquid or gaseous refrigerant flowing therein. The cooling member 114 may be attached to a ceiling plate that is parallel to the XY plane or a side wall that is parallel to the XZ plane, of the chassis 100 shown in FIG. 28.

The chassis 100 of the selective optical element OS1 is bonded to a mounting member 110, and the mounting member 110 is attached to a base frame member BF via fine adjustment mechanisms 112A, 112B, and 112C arranged respectively at least at three locations within a plane parallel to the XY-plane. The base frame member BF is provided as an optical bench to which are attached the light apparatus LS, the various optical elements (lenses mirrors, and the like), the image capturing elements MC1 to MC5, and the like shown in FIGS. 26 and 27, and the drawing units 1 to 3 shown in FIG. 26 are attached to the bottom surface side (−Z direction) of this base frame member BF. The fine adjustment mechanisms 112A, 112B, and 112C at three locations are arranged at respective vertices of a triangle when viewed in the XY-plane, and as an example, the two fine adjustment mechanisms 112B and 112C are arranged at the −X-direction side of the chassis 100 with a distance therebetween in the Y-axis direction, and the fine adjustment mechanism 112A is arranged on the +X-direction side of the chassis 100. The three fine adjustment mechanisms 112A, 112B, and 112C each slightly move the corresponding portion of the mounting member 110 in the Z direction, and it is possible to move the chassis 100, i.e., the crystal body 102, by a very small amount parallel to the Z direction by adjusting the fine adjustment mechanisms 112A, 112B, and 112C by the same amount in the Z direction. Furthermore, in a case where there is a significant divergence from the Bragg diffraction condition (Bragg angle) and the diffraction efficiency is reduced, it is possible to perform a correction to realize an arrangement satisfying the Bragg diffraction condition by adjusting only the fine adjustment mechanism 112A in the Z direction by inclining the crystal body 102 by a very small amount in the XZ-plane. Although not shown in FIG. 28, a fastening position adjustment mechanism for performing fastening is a state where the chassis 100 has been moved parallel to the Y-axis direction by a very small amount on the mounting member 110 or rotated by a very small amount around an axial line parallel to the Z-axis.

When performing the work to adjust the position or orientation of the selective optical element OS1 (or OS2 or OS3) using the fastening position adjustment mechanism or the fine adjustment mechanisms 112A, 112B, and 112C shown in FIG. 28, the beam LB can be emitted from the light source apparatus LS of FIG. 26 and change in the state of the spot images of the beam LB (or the 0-order diffracted beam LBz) captured respectively by the image capturing elements MC2 and MC3 to MC5 can be checked approximately in real time, and therefore the adjustment work is performed accurately and the work efficiency is significantly improved. Accordingly, as an example, in a case where it has been determined that clouding is occurring in one of the selective optical elements OS1 to OS3 (occurring on the incidence surface or emission surface of the crystal body 102), from the change in the shape or the like of the spot images captured by the image capturing elements MC2 and MC3 to MC5, it is possible to operate the fine adjustment mechanisms 112A, 112B, and 112C or the fastening position adjustment mechanism to easily perform a relative change in the incidence position where the beam LB is incident to the crystal body 102 by approximately the diameter of the beam LB (approximately 0.5 mm) in a plane parallel to the YZ-plane in FIG. 28.

It should be noted that, in the selective optical elements OS1 to OS3 realized by AOMs, in a case where the angular relationship between the center axis of the incident beam LB and the crystal body 102 is firmly set in a manner to satisfy the Bragg diffraction condition, while the ultrasonic transducer 104 is being driven, within the first-order diffraction beam of the incident beam LB, the +1-order diffracted beam LBp is generated strongly while the −1-order diffracted beam LBm (noise light) is barely generated. However, when there is a significant deviation from the Bragg diffraction condition, the intensity of the +1-order diffracted beam LBp heading toward the drawing units 1 to 3 is reduced (the diffraction efficiency is reduced) and the intensity of the unnecessary −1-order diffracted beam LBm becomes large. Therefore, as an example, by using a configuration making it possible to observe the spot image of the unnecessary −1-order diffracted beam LBm as well using the image capturing element MC2 of FIG. 26 (or the image capturing elements MC3 to MC5 of FIG. 27), it is possible to monitor the fluctuation (reduction of the diffraction efficiency) of the selective optical elements OS1 to OS3.

According to the embodiments of FIGS. 26 to 28 described above and the modifications thereof, in the pattern drawing apparatus, in which the plurality of selective optical elements (OS1 to OS3) formed by the AOMs are arranged linearly along the light path of the beam LB from the light source apparatus LS, that sequentially sets the plurality of selective optical elements to the ON state one at a time and supplies the beam in a time-divided manner to one of the plurality of drawing units (1 to 3), the plurality of image capturing elements (MC1 to MC5) for detecting change in the shape or positional change of the spot image of the beam before becoming incident to the selective optical elements and the spot image of the beam emitted from the selective optical elements are provided as beam characteristic fluctuation measurement apparatuses, and therefore it is possible to easily determine the positions of the optical members causing positional shift (drift) of the beam or a focus error, the positions of optical members experiencing clouding, or the positions of selective optical elements causing reduced diffraction efficiency in the beam switching section from the light source LS to each of the plurality of drawing units. Furthermore, in a case where a drive source such as a motor is provided to an adjustment mechanism that adjusts the position or orientation of a specified optical member (lens or the like) in a light path and a selective optical element (OS1 to OS3), it is possible to perform an automatic adjustment (automatic correction) based on information concerning the fluctuation state measured by the beam characteristic fluctuation measurement apparatus.

In each of the embodiments and modifications described above, an example is shown of an apparatus that draws a pattern for an electronic device by relatively scanning two-dimensionally in a main scanning direction and a sub scanning direction with the spot light SP on the surface to be scanned Po (object to be drawn on), but the pattern to be drawn is not limited to being related to a layered structure (wiring layer, various electrode layers, transistor layers, insulating layers, and the like) directly forming an electronic device. For example, in a vacuum deposition apparatus or a mist CVD apparatus, a masking plate (also referred to as an electroformed mask) made of thin metal stacked on a deposition substrate is used to form a fine film deposition portion selectively on the deposition substrate. A large number of aperture patterns with fine dimensions are formed in this mask plate, and a film deposition substance is selectively deposited on the film deposition substrate through the aperture pattern. The pattern drawing position shown in each of the embodiments and modifications can also be used in pattern processing (which can include not only exposure processing but also subsequent development processing, etching, and plating processing) for an aperture pattern when creating such a masking plate.

The invention claimed is:

1. A pattern drawing apparatus that draws a pattern on an object to be irradiated by performing one-dimensional scanning with spot light in a main scanning direction using a deflective member, while condensing and projecting a beam from a light source apparatus as the spot light onto the object to be irradiated, the pattern drawing apparatus comprising:
    a first optical system configured to receive the beam from the light source apparatus and having anisotropic refractive power causing the beam heading toward a reflective surface of the deflective member to converge in a sub scanning direction that is orthogonal to the main scanning direction;

a scanning optical system configured to receive the beam deflected by the reflective surface of the deflective member and condense the beam as the spot on the object to be irradiated; and a second optical system that has anisotropic refractive power causing the beam emitted from the scanning optical system and heading toward the object to be irradiated to converge in the sub scanning direction, wherein a focal distance of the second optical system is set in a manner that a curvature amount caused by a sagittal coma aberration of the beam, occurring before the beam passes through a position of a peripheral image height in a beam scanning range within a field of view of the scanning optical system and enters the second optical system, becomes less than or equal to an Airy disk radius.

2. The pattern drawing apparatus according to claim 1, wherein when a numerical aperture in the main scanning direction of the beam passing through the scanning optical system and the second optical system and condensed on the object to be irradiated is NAm, a numerical aperture in the sub scanning direction is NAs, and a center wavelength of the beam is λo, the Airy disk radius ADm is set according to Expression (1):

$$ADm = 0.61 \cdot \frac{\lambda o}{NAm}. \tag{1}$$

3. The pattern drawing apparatus according to claim 2, wherein when the peripheral image height in the field of view of the scanning optical system is Hy, a focal distance of the scanning optical system is ft, the focal distance of the second optical system is fcb, the curvature amount caused by the sagittal coma aberration is Dsc, and FN=(fcb·NAs/Hy)$^2$+1, the focal distance fcb of the second optical system is set in a manner that the curvature amount Dsc obtained from Expression (2):

$$Dsc \approx Hy - ft \cdot (FN)^{-\frac{1}{2}} \cdot \arctan\left[(FN)^{\frac{1}{2}} \cdot \tan(Hy/ft)\right] \tag{2}$$

is within a range of Dsc <ADm.

4. The pattern drawing apparatus according to claim 3, wherein when a focal distance of the first optical system is fca, the focal distance fca is set in a manner to satisfy a relationship of Expression (3):

$$fca \cdot fcb = ft^2 \tag{3},$$

based on the focal distance ft of the scanning optical system and the focal distance fcb of the second optical system set to realize a range of Dsc <ADm.

5. The pattern drawing apparatus according to claim 4, wherein the deflective member is a rotating polygon mirror that has a plurality of reflective surfaces for repeatedly deflecting the beam from the first optical system in one direction of the main scanning direction, and when the polygon mirror side of the scanning optical system is an object plane side and the beam irradiating side of the scanning optical system is an image plane side, an image plane side defocus amount of the spot generated according to an object plane side defocus amount caused by an angle change of the reflective surface accompanying rotation of the polygon mirror is set to be within a range of a depth of focus.

6. The pattern drawing apparatus according to claim 5, wherein when the object plane side defocus amount is ΔDop, the image plane side defocus amount is ΔDip, and a depth of focus in the sub scanning direction realized by combination of the scanning optical system and the second optical system is DOFs, the focal distance fcb of the second optical is set in a manner that the image plane side defocus amount ΔDip determined by a relationship of Expression (4):

$$\Delta Dip = \Delta Dop \cdot \frac{fcb^2}{ft^2} \tag{4}$$

according to the focal distance ft and the focal distance fcb and the depth of focus DOFs determined by a relationship of Expression (5):

$$DOFs = \frac{\lambda o}{NAs^2} \tag{5}$$

according to the wavelength λo and the numerical aperture NAs, have a relationship of ΔDip <DOFs.

7. The pattern drawing apparatus according to claim 6, wherein the focal distance fcb of the second optical system is set in a manner that the curvature amount Dsc and the Airy disk radius ADm have a relationship of Dsc <ADm and the image plane side defocus amount ΔDip and the depth of focus DOFs have a relationship of ΔDip <DOFs.

8. The pattern drawing apparatus according to claim 1, wherein the scanning optical system is an fθ lens system that has an f-θ characteristic in which change of an incidence angle of the beam incident thereto and deflected by the deflective member and change of an image height of the spot in the beam scanning range are proportional, and projects the beam in a telecentric state onto the object to be irradiated.

9. The pattern drawing apparatus according to claim 1, wherein the second optical system includes a cylindrical lens that has a lens surface formed to have a curvature radius that is finite in the sub scanning direction and a curvature radius that is infinite in the main scanning direction, in which a direction of a generatrix is parallel to the main scanning direction.

10. The pattern drawing apparatus according to claim 1, wherein the first optical system includes a first cylindrical lens that has a lens surface in which a direction of a generatrix is parallel to the sub scanning direction and converges the beam incident thereto in the main scanning direction, and a spherical lens system that converts the beam that has passed through the cylindrical lens into a beam that is condensed in the sub scanning direction on the reflective surface of the deflective member.

11. The pattern drawing apparatus according to claim 10, wherein when a focal distance of the first cylindrical lens is fca, a focal distance of the spherical lens system is fcg, a focal distance of the scanning optical system is ft, and a focal distance of the second optical system is fcb, the pattern drawing apparatus is set to realize a relationship of Expression (6):

$$\frac{fcg^2}{fca} = \frac{ft^2}{fcb}. \qquad (6)$$

12. The pattern drawing apparatus according to claim 1, wherein an optical axis of a light path of the beam heading from the first optical system toward the reflective surface of the deflective member and an optical axis passing through the reflective surface of the deflective member of the scanning optical system are arranged at an angle of 45° in a plane including the main scanning direction.

\* \* \* \* \*

UNITED STATES PATENT AND TRADEMARK OFFICE
CERTIFICATE OF CORRECTION

PATENT NO. : 11,409,199 B2
APPLICATION NO. : 16/856474
DATED : August 9, 2022
INVENTOR(S) : Masaki Kato It is certified that error appears in the above-identified patent and that said Letters Patent is hereby corrected as shown below:

In the Specification

In Column 31, Line 27, in expression (18), "Sds < SCb" should be changed to --SDs < SCb--.

Signed and Sealed this
Fifteenth Day of November, 2022

Katherine Kelly Vidal
*Director of the United States Patent and Trademark Office*